(12) United States Patent
Yamazaki et al.

(10) Patent No.: US 11,872,735 B2
(45) Date of Patent: Jan. 16, 2024

(54) MOLDED ARTICLE AND METHOD FOR MANUFACTURING MOLDED ARTICLE

(71) Applicant: NISSHA CO., LTD., Kyoto (JP)

(72) Inventors: Seiichi Yamazaki, Kyoto (JP);
Toshihiro Higashikawa, Kyoto (JP);
Hitoshi Hirai, Kyoto (JP); Koji Asai,
Kyoto (JP); Yuki Matsumoto, Kyoto
(JP)

(73) Assignee: NISSHA CO., LTD., Kyoto (JP)

( * ) Notice: Subject to any disclaimer, the term of this patent is extended or adjusted under 35 U.S.C. 154(b) by 0 days.

(21) Appl. No.: 18/247,253

(22) PCT Filed: Aug. 26, 2021

(86) PCT No.: PCT/JP2021/031392
§ 371 (c)(1),
(2) Date: Mar. 29, 2023

(87) PCT Pub. No.: WO2022/070700
PCT Pub. Date: Apr. 7, 2022

(65) Prior Publication Data
US 2023/0271361 A1    Aug. 31, 2023

(30) Foreign Application Priority Data

Sep. 30, 2020   (JP) ................. 2020-165485

(51) Int. Cl.
*B29C 45/14*      (2006.01)
*H05K 3/28*       (2006.01)
*B29L 31/34*      (2006.01)

(52) U.S. Cl.
CPC ......... *B29C 45/14065* (2013.01); *H05K 3/28* (2013.01); *B29C 2045/14122* (2013.01);
(Continued)

(58) Field of Classification Search
CPC .. H05K 3/28; H05K 3/284; H05K 2203/1316; H05K 2203/1327;
(Continued)

(56) References Cited

U.S. PATENT DOCUMENTS 5,214,846 A  *  6/1993  Asami ................. H01L 23/4951
                                             264/272.17
6,444,501 B1    9/2002  Bolken
(Continued)

FOREIGN PATENT DOCUMENTS

JP         2014192750 A    10/2014
JP           5917354 B2     5/2016
(Continued)

*Primary Examiner* — Peter Dungba Vo
*Assistant Examiner* — Joshua D Anderson
(74) *Attorney, Agent, or Firm* — Alleman Hall Creasman & Tuttle LLP

(57) ABSTRACT

In a first step, a circuit sheet is set such that a first region of a second main surface of the circuit sheet is in contact with a plateau portion of a first mold and a second region is not in contact with the first mold. In the first step, a first fixed portion of the circuit sheet is arranged on a first portion of the first mold, and a second fixed portion is arranged on a second portion of the first mold. The first portion is a portion that is higher than the plateau portion and runs along at least one of a first protruding portion and a second protruding portion provided along the plateau portion. The second portion is a portion where the first protruding portion or the second protruding portion is not provided along the plateau portion.

8 Claims, 38 Drawing Sheets

(52) U.S. Cl.
CPC .............. *B29C 2045/14901* (2013.01); *B29L 2031/3425* (2013.01); *H05K 2203/1327* (2013.01)

(58) Field of Classification Search
CPC .............. B29C 45/14; B29C 45/14008; B29C 45/14065; B29C 45/14073; B29C 45/14639; B29C 45/14647; B29C 45/14672; B29C 2045/14081; B29C 2045/1409; B29C 2045/14098; B29C 2045/14122; B29C 2045/14131; B29C 2045/14139; B29C 2045/14155; B29C 2045/14852; B29C 2045/14901; B29C 2045/14942; B29L 2031/3425; Y10T 29/49146; Y10T 29/49158; Y10T 29/49171; Y10T 29/49172

See application file for complete search history.

(56) References Cited

U.S. PATENT DOCUMENTS

| | | | |
|---|---|---|---|
| 2010/0065960 A1* | 3/2010 | Mino ............... | H01L 23/49551 257/E23.116 |
| 2011/0221639 A1* | 9/2011 | Jeon ................... | B29C 45/1671 343/702 |
| 2012/0249452 A1* | 10/2012 | Kitano ................ | G06F 3/0443 345/173 |
| 2015/0327372 A1* | 11/2015 | Sakamoto ............ | H05K 3/284 264/272.11 |
| 2016/0035522 A1* | 2/2016 | Namikawa ........... | H01H 37/52 337/362 |
| 2016/0366779 A1* | 12/2016 | Isoda ................ | B29C 45/14065 |
| 2022/0020672 A1* | 1/2022 | Yamamoto ............ | H01L 25/18 |

FOREIGN PATENT DOCUMENTS

| | | |
|---|---|---|
| JP | 2016122737 A | 7/2016 |
| JP | 2017175024 A | 9/2017 |
| JP | 2017217871 A | 12/2017 |

* cited by examiner

MOLDED ARTICLE AND METHOD FOR MANUFACTURING MOLDED ARTICLE

TECHNICAL FIELD

The present disclosure relates to a molded article and a method for manufacturing the molded article, and particularly relates to a molded article in which a circuit sheet is inserted into a molded body during molding and a method for manufacturing the molded article.

BACKGROUND ART

Conventionally, there has been known a technique of integrally molding a circuit sheet to a molded article, which is a part of a housing. For example, Patent Document 1 (JP 5917354 B) discloses a display panel. The display panel described in Patent Document 1 is a molded article used as a part of a housing of an electronic device. In this display panel, a base substrate film on which a detection electrode layer is formed, an outer molded body, and an inner molded body are integrally formed. A circuit sheet of Patent Document 1 is the base substrate film on which the detection electrode layer is formed. The base substrate film of Patent Document 1 is sandwiched between the outer molded body and the inner molded body.

CITATION LIST

Patent Literature

Patent Document 1: JP 5917354 B

SUMMARY

Technical Problem

In the display panel described in Patent Document 1, the base substrate film is sandwiched between the outer molded body and the inner molded body, and the outer molded body, the base substrate film, and the entire inner molded body are covered with a surface protection layer. With such a structure, the display panel described in Patent Document 1 can effectively prevent entrance of moisture or corrosive gas along an outer surface or an inner surface of the base substrate film.

The display panel described in Patent Document 1 is molded using a primary molding mold for molding the inner molded body and a secondary molding mold for molding the outer molded body. Therefore, to obtain a molded article as described in Patent Document 1, two sets of molding molds are required and injection molding needs to be performed twice, resulting in an increase in manufacturing cost.

An object of the present disclosure is to inexpensively provide a molded article in which a circuit sheet is inserted.

Solution to Problem

Some aspects will be described below as means to solve the problems. These aspects can be combined randomly as necessary.

A method for manufacturing a molded article according to an aspect of the present disclosure includes: setting a circuit sheet including a first main surface, a second main surface opposed to the first main surface, and a conductive pattern in a first mold such that a first region of the second main surface contacts a plateau portion of the first mold and a second region of the second main surface does not contact the first mold; clamping the second mold to the first mold such that the circuit sheet does not contact the second mold to form a cavity where the first main surface and the second region of the second main surface of the circuit sheet are exposed; introducing a molten material into the cavity to bring the molten material into contact with the first main surface and the second region of the second main surface of the circuit sheet; cooling and solidifying the molten material to form a molded body made of resin having an outer surface opposed to the first main surface and an inner surface opposed to the second region of the second main surface of the circuit sheet; and opening the first mold and the second mold to take out the molded article. In the setting, a first fixed portion of the circuit sheet is arranged in a first portion of the first mold, and a second fixed portion of the circuit sheet including the second region is arranged in a second portion of the first mold. The first portion is a portion along at least one of a first protruding portion and a second protruding portion that are higher than the plateau portion and are provided along the plateau portion of the first mold. The second portion is a portion in which neither the first protruding portion nor the second protruding portion is provided along the plateau portion.

In the method for manufacturing the molded article configured as described above, the molded article including the circuit sheet inserted into the resin can be manufactured with the pair of the first mold and the second mold. In addition, the molded article including the circuit sheet inserted into the resin can be manufactured by introducing the molten material in one shot from clamping the first mold and the second mold until opening the molds.

In the method for manufacturing the molded article described above, the second portion of the first mold is a portion where a width of the plateau portion is narrower than a width of the circuit sheet. In the method for manufacturing the molded article configured as described above, a configuration of the first mold is simplified and the configuration of the molded article is simplified, and therefore the molded article is easily manufactured.

In the method for manufacturing the molded article described above, the second portion of the first mold is a portion that divides the plateau portion. In the setting, the circuit sheet is laid across two divided portions of the divided plateau portions in the second portion. In the method for manufacturing the molded article configured as described above, a supporting portion resin portion that supports the circuit sheet in the second portion can be large, and the circuit sheet can be firmly fixed.

In the method for manufacturing the molded article described above, in the first portion of the first mold, groove portions may be formed between the first protruding portion and the plateau portion and between the second protruding portion and the plateau portion. In the method for manufacturing the molded article configured as described above, a thickness of the resin in contact with the second region on both sides of the plateau portion of the circuit sheet can be increased by the molten material entering the groove portions. The thickened resin allows improving strength of the resins for fixing the circuit sheet.

In the method for manufacturing the molded article described above, the first mold may be configured such that a gap is formed in at least one of between the first protruding portion and a first end side of the circuit sheet and between the second protruding portion and a second end side of the circuit sheet. In the method for manufacturing the molded article configured as described above, the molten material enters at least one of the gap between the first protruding portion and the first end side and the gap between the second protruding portion and the second end side. An amount of the resin on at least one of a periphery of the first end side and a periphery of the second end side of the circuit sheet is increased by the entered resin, and support by the resin on at least one of the peripheries of the first end side and the second end side of the circuit sheet is strengthened.

In the method for manufacturing the molded article described above, in the setting, a connecting portion of the circuit sheet may be inserted into a slit of the first mold. In the method for manufacturing the molded article configured as described above, the connecting portion can be drawn out to the inner surface side of the molded article.

In the method for manufacturing the molded article described above, the first mold includes a plurality of sets of the first protruding portions and the second protruding portions. In the setting, the circuit sheets may be arranged between all of the plurality of sets of the first protruding portions and the second protruding portions. In the method for manufacturing the molded article configured as described above, the plurality of sets of the first protruding portions and the second protruding portions make it difficult for the circuit sheets to be displaced with respect to the first molds when the molten resins are injected. By thus providing the plurality of sets of the first protruding portions and the second protruding portions, the circuit sheet is fitted between the first protruding portion and the second protruding portion of the first mold, and the circuit sheet is not displaced by flow of the molten resin and can be fixed at a predetermined position of the molded body with high accuracy.

In the method for manufacturing the molded article described above, the first protruding portion, the second protruding portion, and the plateau portion of the first mold may be formed on a sliding block. In the introducing, the sliding block may be moved to form the cavity in a place where the first protruding portion, the second protruding portion, and the plateau portion were present before the sliding block is moved to introduce the molten material. In the method for manufacturing the molded article configured as described above, in a state in which the sliding block is pressed against the second mold, displacement of the circuit sheet during molding can be suppressed with the first protruding portion, the second protruding portion, and the plateau portion. In addition, after the sliding block is moved backward, the cavity expands and the molten material enters the place where the first protruding portion, the second protruding portion, and the plateau portion were present before the sliding. The fixation of the circuit sheet in the molded article is strengthened with the resin that has entered in this manner.

A molded article according to an aspect of the present disclosure includes a circuit sheet and a molded body. The circuit sheet includes a first main surface, a second main surface opposed to the first main surface, and a conductive pattern. The molded body covers an entirety of the first main surface of the circuit sheet. The molded body includes a plurality of resin supporting portions extending from a periphery of the circuit sheet while being in contact with the second main surface over an entirety of the periphery of the circuit sheet. The molded body includes a plurality of recessed portions arranged in the periphery of the circuit sheet over the entirety of the periphery of the circuit sheet. The plurality of resin supporting portions and the plurality of recessed portions are alternately arranged so as to be arranged along the periphery.

In the molded article configured as described above, a force received from the molten material by the circuit sheet is relaxed in the protruding portions formed in the mold for forming the recessed portions during manufacturing. The circuit sheet receives the force of the molten material for forming the resin supporting portions by the entirety of the periphery of the circuit sheet. Therefore, the displacement of the circuit sheet in the molded body is reduced, and the molded article with high accuracy of an arrangement position of the circuit sheet can be provided.

Advantageous Effects

According to the method for manufacturing the molded article of the present disclosure, the molded article in which the circuit sheet is inserted can be inexpensively provided.

DESCRIPTION OF EMBODIMENTS

First Embodiment (1) Overview of Molded Article

Figure 1:
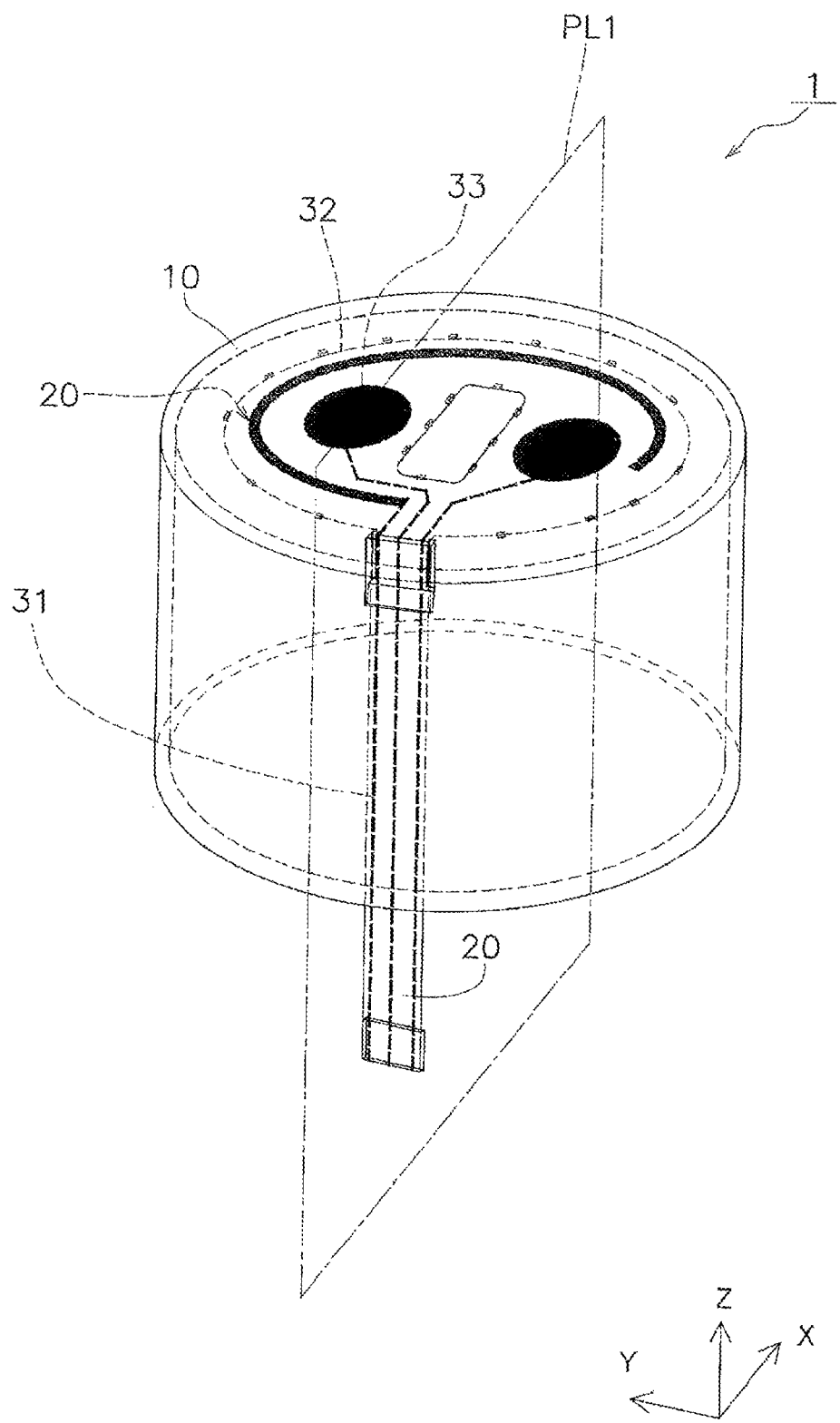
FIG. 1 is a perspective view illustrating an example of a molded article manufactured by a method for manufacturing the molded article according to a first embodiment.
Figure 2:
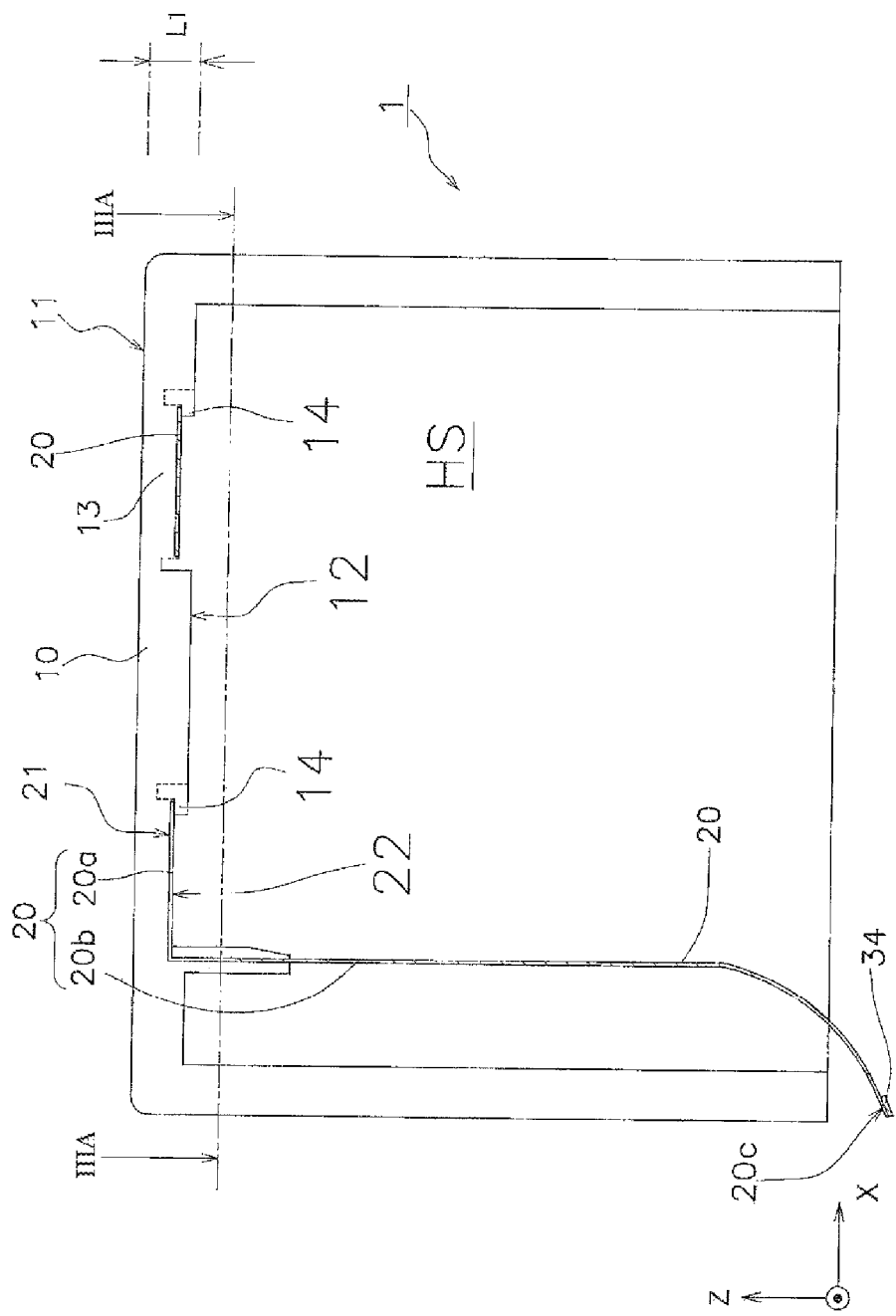
FIG. 2 is a cross-sectional view illustrating a cross-sectional shape of the molded article cut along a plane PL1 of FIG. 1.
Figure 3A:
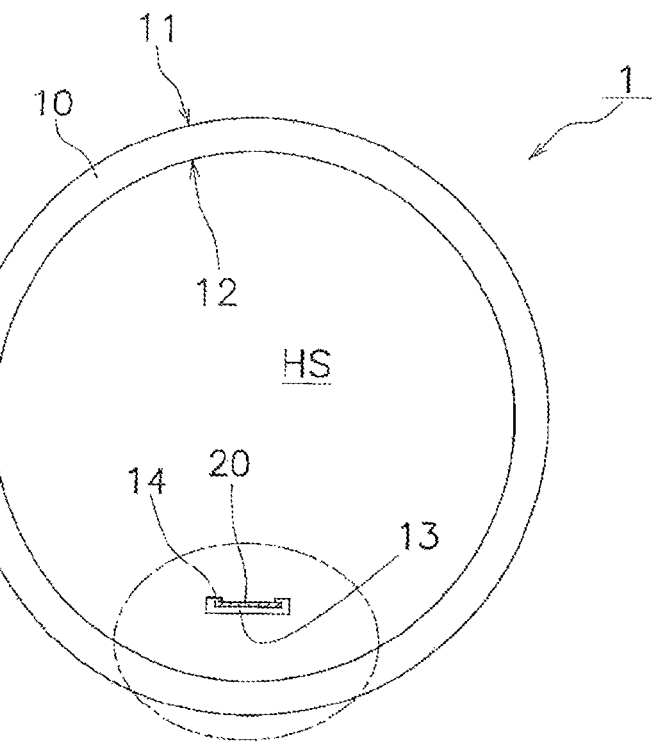
FIG. 3A is a cross-sectional view illustrating the cross-sectional shape of the molded article cut along the line IIIA-IIIA in FIG. 2.
Figure 3B:
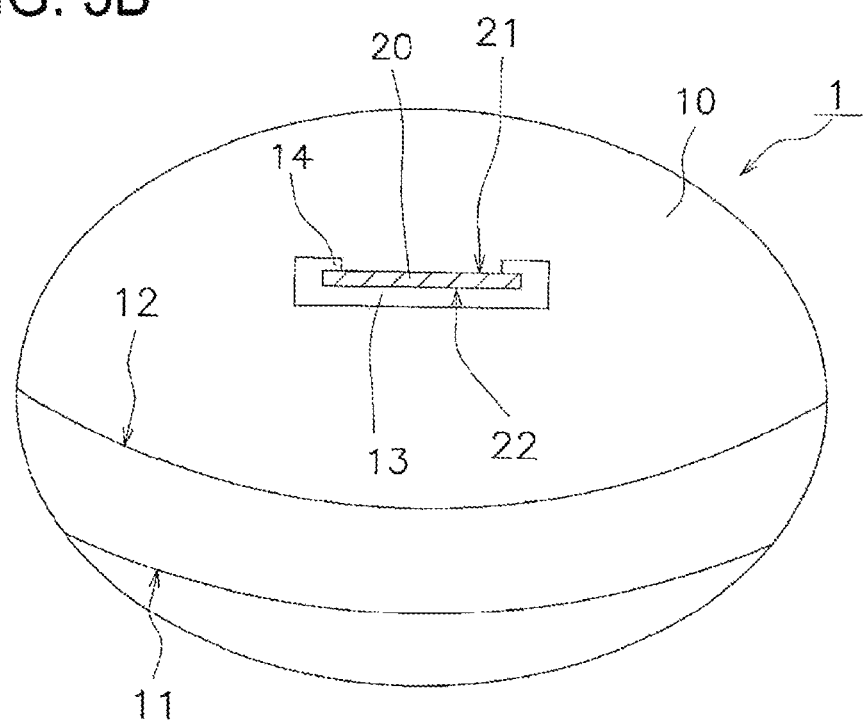
FIG. 3B is a partially enlarged cross-sectional view enlarging a part of the cross-section of the molded article illustrated in FIG. 3A.
Figure 4:
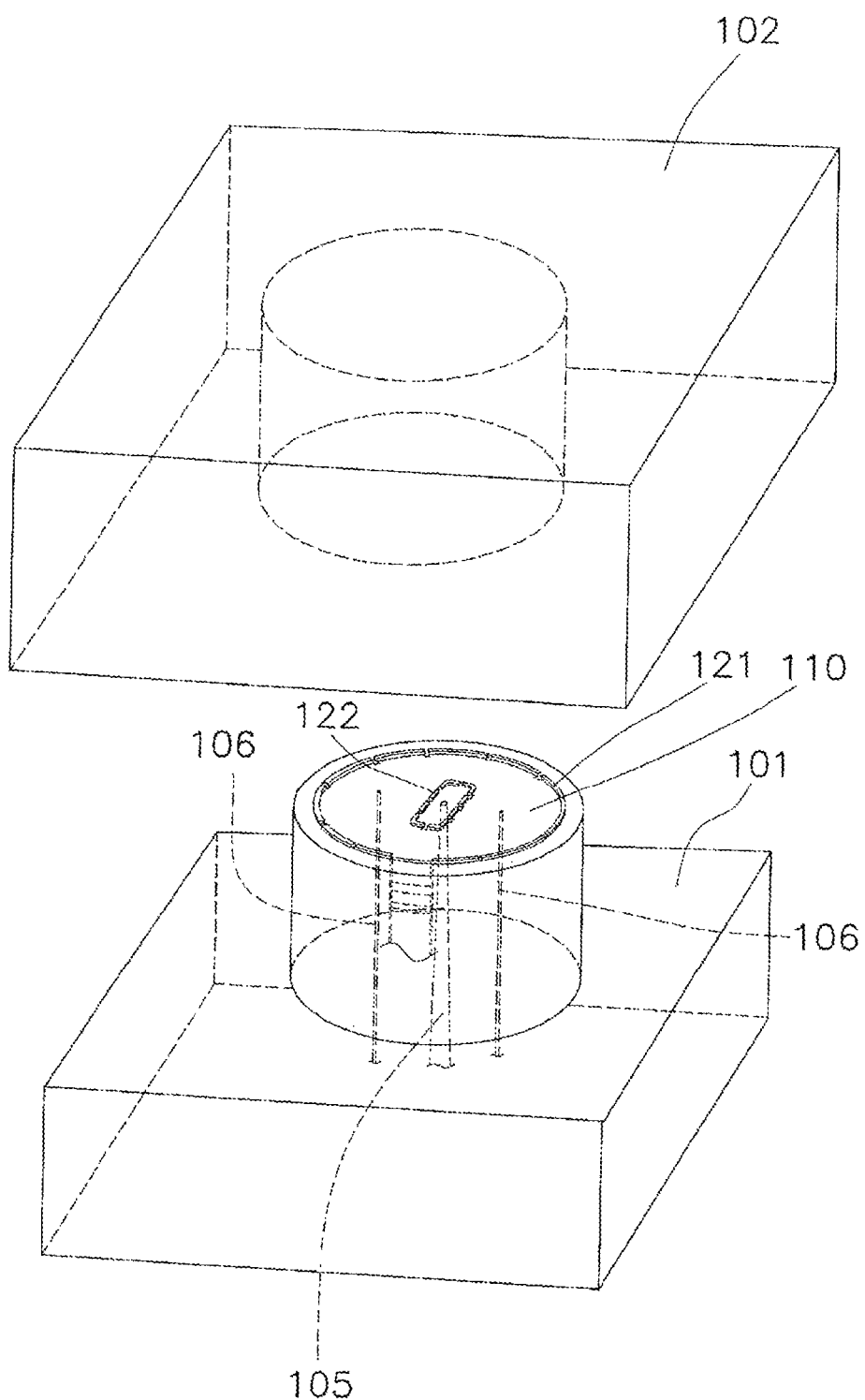
FIG. 4 is a perspective view of a first mold and a second mold for manufacturing the molded article of FIG. 1.
Figure 5:
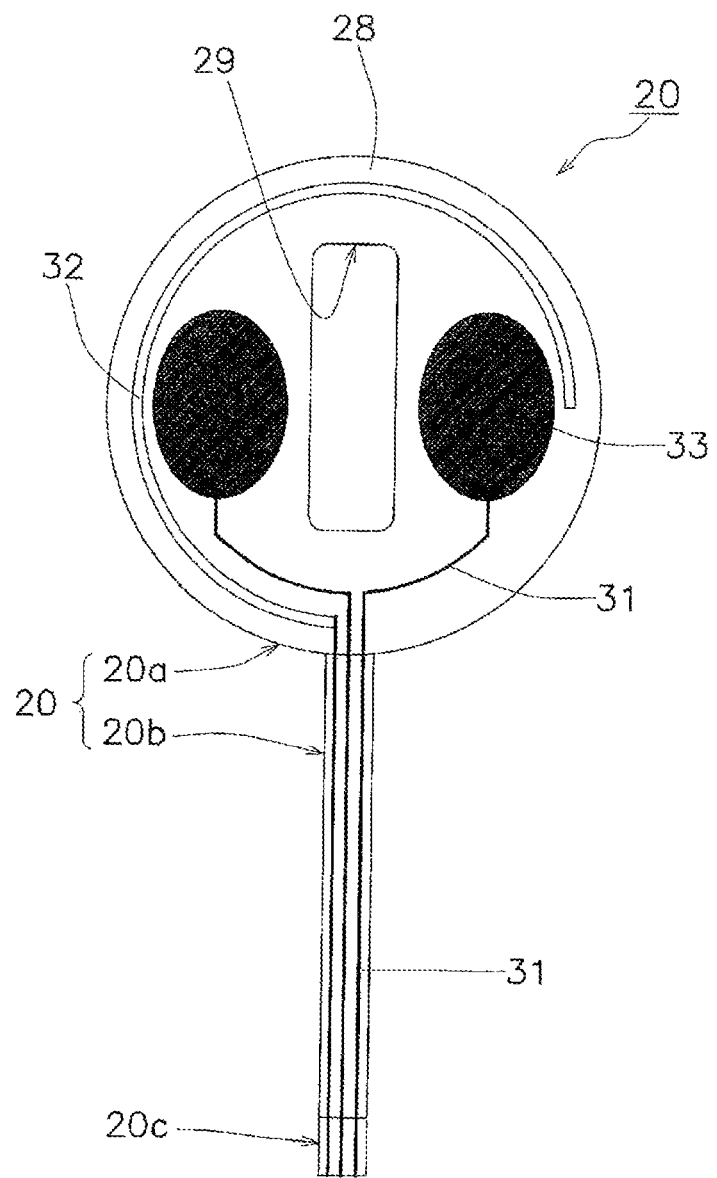
FIG. 5 is a plan view of a circuit sheet.

FIGS. 1 and 2 illustrate an example of a molded article 1. FIG. 2 illustrates a cross-sectional shape of the molded article 1 cut at a plane PL1 indicated by one dot chain line in FIG. 1. The plane PL1 is an XZ plane. FIG. 3A illustrates a cross-sectional shape of the molded article 1 cut along the line IIIA-IIIA in FIG. 2, in other words, a cross-sectional shape of the molded article 1 cut at a plane (XY plane) perpendicular to a Z direction in FIGS. 1 and 2. FIG. 3B illustrates an enlarged part surrounded by one dot chain line in FIG. 3A. FIG. 4 illustrates a first mold 101 and a second mold 102 for manufacturing the molded article 1 illustrated in FIG. 1. FIG. 5 illustrates a circuit sheet 20 before being folded.

The shape of the molded article 1 is a hollow, three-dimensional shape having a housing space HS therein. The molded article 1 includes a molded body 10 and the circuit sheet 20. The molded article 1 illustrated in FIGS. 1 and 2 is formed by integrating the molded body 10 and the circuit sheet 20 by one-shot insert molding. In FIGS. 2, 3A, and 3B, hatching indicating the cross section of the molded body 10 is omitted to avoid the drawings being difficult to be seen.

The molded body 10 has an outer surface 11 and an inner surface 12. The inner surface 12 is exposed to the housing space HS. Resin may be exposed on the outer surface 11 of the molded body 10. A decorative layer may be formed on the outer surface 11 of the molded body 10 simultaneously with molding. The outer surface 11 of the molded body 10 may be coated after molding. The circuit sheet 20 has a first main surface 21 and a second main surface 22. The molded body 10 is arranged in contact with the first main surface 21 of the circuit sheet 20 and is arranged in contact with the second main surface 22 of the circuit sheet 20. In FIG. 2, an outer peripheral portion 13 is a portion in contact with the first main surface 21 of the circuit sheet 20, and an inner peripheral portion 14 is a portion in contact with the second main surface 22 of the circuit sheet 20. In other words, the circuit sheet 20 is inserted into the molded body 10 so as to be sandwiched between the outer peripheral portion 13 and the inner peripheral portion 14. The circuit sheet 20 inserted into the molded body 10 in this manner is sandwiched between and fixed from both sides of the first main surface 21 and the second main surface 22 with a constituent material constituting the molded body 10. When the circuit sheet 20 is fixed by being sandwiched between both sides of the first main surface 21 and the second main surface 22 as described above, an adhesive for bonding the circuit sheet 20 and the molded body 10 together can be omitted. When the adhesive is omitted, an adhesive application step can be omitted. However, an adhesive for bonding the circuit sheet 20 and the molded body 10 together may be provided.

The molded article 1 is manufactured using the first mold 101 and the second mold 102 illustrated in FIG. 4. An opening 29 is provided in the central portion of the circuit sheet 20. The portion where the circuit sheet 20 is arranged is a plateau portion 110 of the first mold 101 located around the opening 29 of the circuit sheet 20. The first mold 101 has air suction holes 106. The circuit sheet 20 set in the first mold 101 is sucked and held by the air suction holes 106. A gate 105 through which molten resin is injected is provided at the central portion of the first mold 101. The resin is injected from the gate 105 through the opening 29. Here, the gate 105 is provided in the opening 29 of the circuit sheet 20 at the central portion of the first mold 101. However, the position where the gate 105 is provided is not limited to the above-described position. The gate 105 only needs to be provided at a position where the molten resin is not directly injected onto the second main surface 22 of the circuit sheet 20.

(1-1) Circuit Sheet 20

The circuit sheet 20 is, for example, a metal sheet, a sheet in which a metal sheet and an insulating film are laminated, a printed circuit film, a flexible wiring board (hereinafter referred to as an FPC in some cases), or a combination thereof. The metal sheet is obtained by punching a copper foil into a predetermined shape, for example. The metal sheet may be processed to have a three-dimensional shape. For example, the punched copper foil may be bent by press working. The printed circuit film is formed by thick-film printing of a wiring pattern on an insulating film with conductive ink. In the printed circuit film, for example, a portion coated with conductive ink containing a conductive substance, such as silver particles, functions as the wiring pattern after drying. The insulating film used in the printed circuit film and the FPC is made of, for example, an organic material. An example of the organic material constituting the insulating film is resin. Examples of the resin constituting the insulating film include a polyimide resin, a polycarbonate resin, and a polyester resin. The printed circuit film and the FPC may be obtained by processing an insulating film on which a wiring pattern is formed into a three-dimensional shape, for example.

(1-1-1) Case where Circuit Sheet 20 is Printed Circuit Film

The circuit sheet 20 illustrated in FIGS. 1 to 3B and 5 is the printed circuit film. The circuit sheet 20 illustrated in FIG. 1 includes wiring patterns 31 formed by printing, an antenna 32, and a touch switch 33 on a film-like base substrate 28. The base substrate 28 is, for example, an insulating resin film. The antenna 32 and the touch switch 33 are connected to, for example, a device outside the molded article 1 with the wiring patterns 31. These wiring patterns 31 are conductive patterns provided on the circuit sheet 20. The antenna 32 is a functional component for a device connected to the circuit sheet 20 to communicate. The touch switch 33 is a functional component for inputting information, such as ON/OFF, to the device connected to the circuit sheet 20. The opening 29 having a rectangular shape in plan view is provided in a substantially central portion of the circuit sheet 20.

The circuit sheet 20 is divided into a main portion 20a in which the antenna 32 and the touch switch 33 are formed and a lead portion 20b in which the wiring patterns 31 mainly led out to the outside of the molded article 1 are formed. A connecting portion 20c connected to a wiring line outside the circuit sheet 20 is provided at the distal end of the lead portion. The circuit sheet 20 is bent by a simple bending device before being integrally molded with the molded body 10 such that the main portion 20a and the lead portion 20b are orthogonal to one another. Although the case where the main portion 20a and the lead portion 20b are orthogonal to one another is described here as an example, the main portion 20a and the lead portion 20b need not be orthogonal to one another. A reinforcing plate 34 is attached to the back surface of the connecting portion 20c. The back surface of the connecting portion 20c is a surface opposite to the formation surface of the wiring line. The reinforcing plate 34 may be attached after molding the molded body 10.

(1-1-2) Case where Circuit Sheet 20 is Metal Sheet

Figure 6:
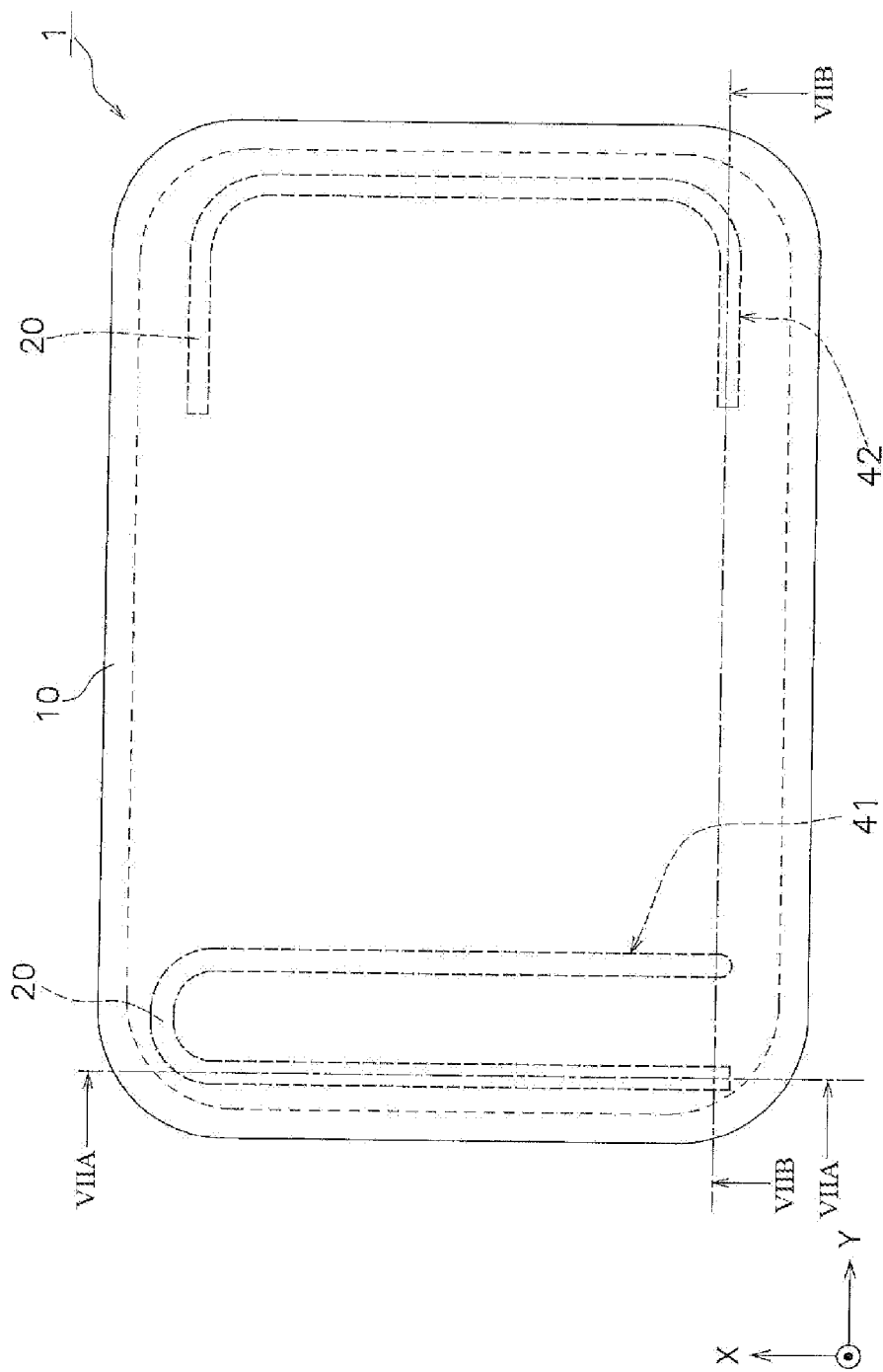
FIG. 6 is a top view illustrating another example of the molded article manufactured by the method for manufacturing the molded article according to the first embodiment.
Figure 7A:
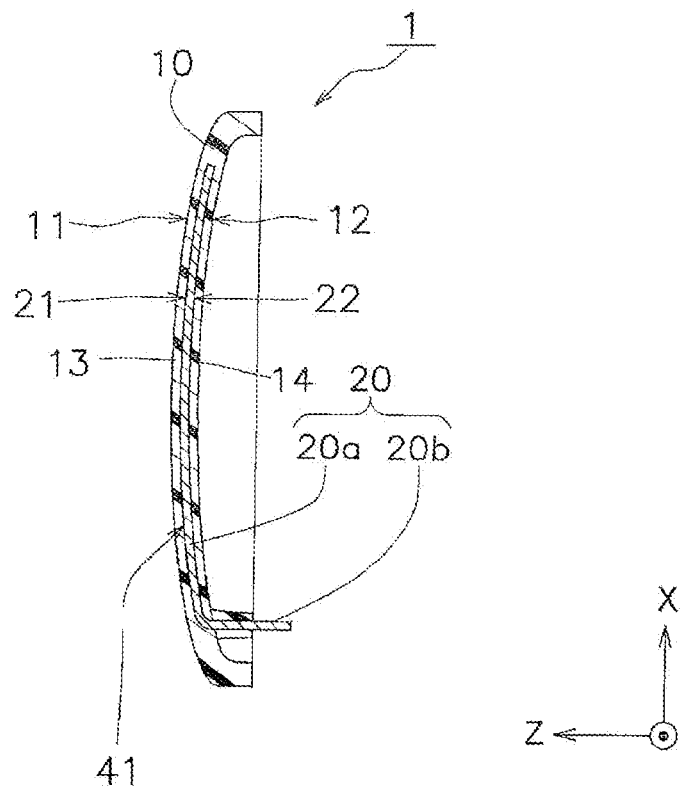
FIG. 7A is a cross-sectional view illustrating the cross-sectional shape of the molded article cut along the line VIIA-VIIA in FIG. 6.
Figure 7B:
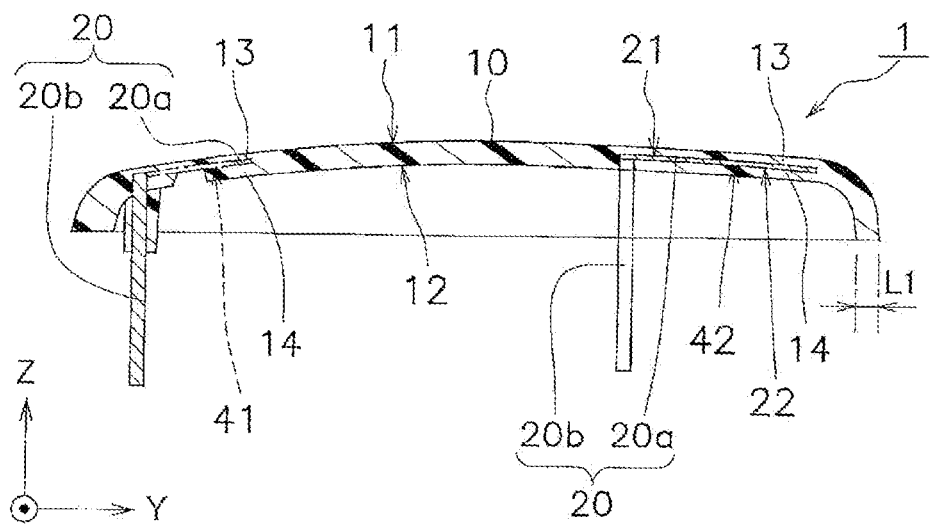
FIG. 7B is a cross-sectional view illustrating the cross-sectional shape of the molded article cut along the line VIIA-VIIA in FIG. 6.

FIGS. 6, 7A, and 7B illustrate the molded article 1 in which the circuit sheet 20 is a metal sheet. FIG. 6 illustrates a state in which the molded article 1 is viewed from above (a state of being seen in the Z-axis direction). FIG. 7A illustrates the cross-sectional shape of the molded article 1 cut along the line VIIA-VIIA in FIG. 6. FIG. 7B illustrates the cross-sectional shape of the molded article 1 cut along the line VIIB-VIIB in FIG. 6.

The circuit sheet 20 illustrated in FIG. 6 is an antenna 41 and a touch switch 42 formed by a metal sheet. The metal sheet is, for example, a sheet of copper or a copper alloy. For example, when a terminal portion connected to a device is provided, a phosphor bronze plate having excellent spring characteristics is used for the circuit sheet 20. The circuit sheet 20 is shaped in a three-dimensional shape as necessary, punched into a predetermined shape, finished into a shape suitable for insertion, and then usually plated with nickel or gold to prevent corrosion. The thickness of the phosphor bronze plate is from 0.05 mm to 0.5 mm, and the thickness suitable for press working is from 0.07 mm to 0.3 mm. A portion extending along the outer surface 11 of the molded body 10 is the main portion 20a for the antenna 41 and the touch switch 42. A portion of the phosphor bronze plate extending in the Z-axis direction is the lead portion 20b for the antenna 41 and the touch switch 42. The connecting portion 20c is connected to a device accommodated on the inner surface 12 side of the molded body 10. Also in the circuit sheet 20 illustrated in FIGS. 7A and 7B, the outer peripheral portion 13 of the molded body 10 is in contact with the first main surface 21 of the circuit sheet 20, and the inner peripheral portion 14 is in contact with the second main surface 22 of the circuit sheet 20.

(1-1-3) Case where Circuit Sheet 20 is FPC

Figure 8:
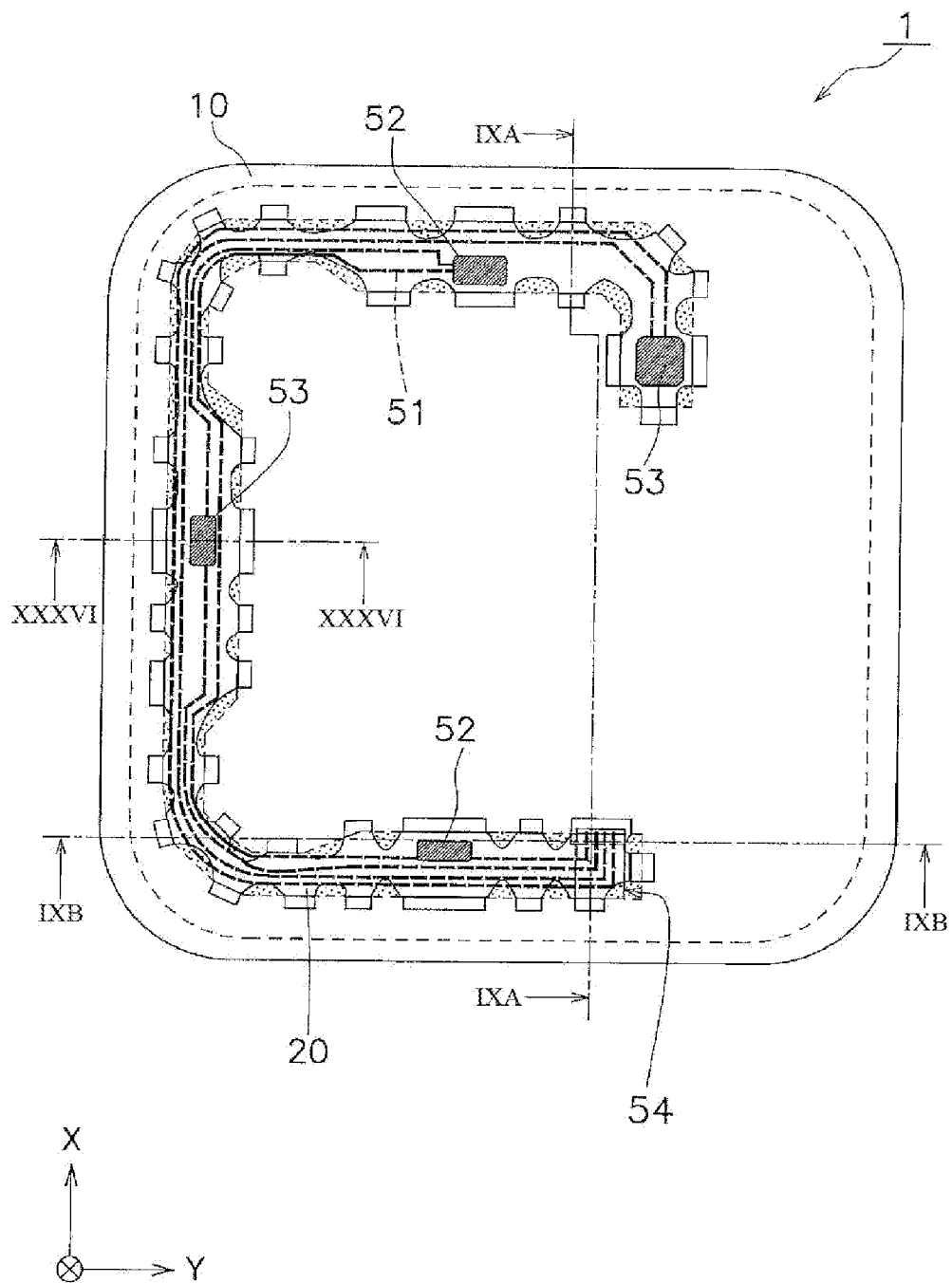
FIG. 8 is a bottom view illustrating yet another example of the molded article manufactured by the method for manufacturing the molded article according to the first embodiment.
Figure 9A:
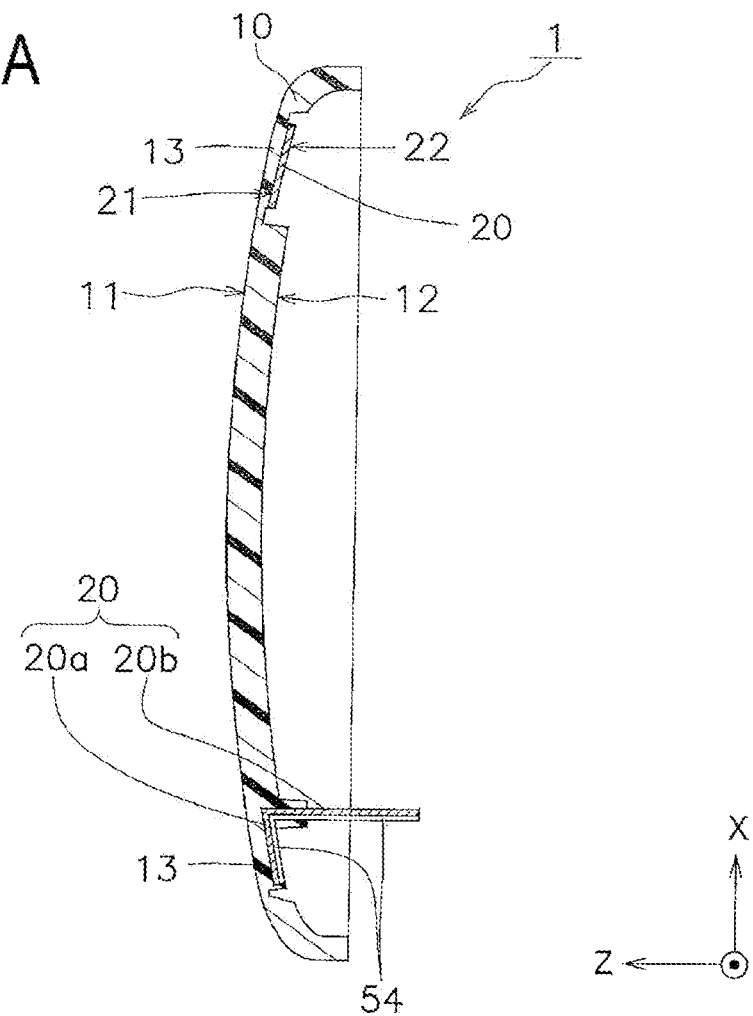
FIG. 9A is a cross-sectional view illustrating the cross-sectional shape of the molded article cut along the line IXA-IXA in FIG. 8.
Figure 9B:
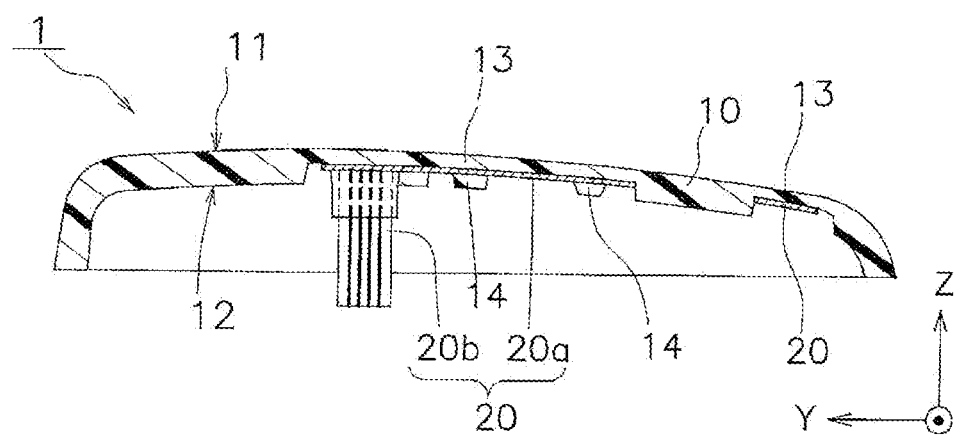
FIG. 9B is a cross-sectional view illustrating the cross-sectional shape of the molded article cut along the line IXB-IXB in FIG. 8.

FIGS. 8, 9B, and 9B illustrate the molded article 1 in which the circuit sheet 20 is the FPC. FIG. 8 illustrates a state in which the molded article 1 is viewed from the back surface (a state of being seen in the Z-axis direction). FIG.

9A illustrates the cross-sectional shape of the molded article 1 cut along the line IXA-IXA in FIG. 8. FIG. 9B illustrates the cross-sectional shape of the molded article 1 cut along the line IXB-IXB in FIG. 8. In FIG. 8, a portion indicated by dot hatching is a portion where the circuit sheet 20 is covered with the molded body 10.

The circuit sheet 20 illustrated in FIG. 8 includes wiring patterns 51 formed by etching or plating, LEDs 52, and high-function electronic components 53, such as integrated circuits. The wiring patterns 51 are covered with a cover film. The wiring patterns 51 are an example of conductive patterns. The LED described above is an abbreviation for a light emitting diode. The LED 52 and the high-function electronic component 53 are connected to, for example, a device outside the molded article 1 with the wiring patterns 51. The LED 52 is a functional component for notifying information to the outside of the molded article 1 by light. The high-function electronic component 53 is a functional component that achieves a complicated function in response to an input from the device connected to the circuit sheet 20, for example. The circuit sheet 20 is divided into the main portion 20a in which the LEDs 52 and the high-function electronic components 53 are formed and the lead portion 20b in which the wiring patterns 51 mainly led out to the outside of the molded article 1 are formed. The circuit sheet 20 is bent by a simple bending device before being integrally molded with the molded body 10 such that the main portion 20a and the lead portion 20b are orthogonal to one another. As illustrated in FIG. 9A, a reinforcing plate 54 is pasted to the connecting portion 20c of the circuit sheet 20. The reinforcing plate 54 before being bent has a rectangular shape. A part of the reinforcing plate 54 extends up to a part of the main portion 20a. The reinforcing plate 54 is made of, for example, a thin plate of thermoplastic resin or stainless steel. The cross-sectional shape of the reinforcing plate 54 after bending is an L-shape.

(1-2) Molded Body 10

The molded body 10 is formed by solidifying a molten material injected during injection molding. The thickness (a distance L1 between the outer surface 11 and the inner surface 12) of the molded body 10 is, for example, 2.5 mm (see FIGS. 2, 7B, and 9B). The distance L1 between the outer surface 11 and the inner surface 12 is set within a range from 0.6 mm to 5 mm, for example. The molded body 10 may be colored or need not be colored. The molded body 10 is molded using at least one of transparent, translucent, or opaque thermoplastic resin and thermoplastic elastomer. The molten material here is, for example, a material obtained by melting at least one of thermoplastic resin and thermoplastic elastomer by heat. As the material of the molded body 10, a general-purpose thermoplastic resin, such as a polystyrene resin, a polyolefin resin, an ABS resin, or an AS resin, is used. Additionally, a polycarbonate resin, a polyacetal resin, an acrylic resin, a polybutylene terephthalate resin, an engineering resin (for example, a polysulfone resin, a polyphenylene sulfide resin, a polyphenylene oxide resin, and a polyacrylate resin), a polyamide resin, or a urethane, polyester, or styrene elastomer is used as the material of the molded body 10. Furthermore, natural rubber or synthetic rubber is used as the material of the molded body 10. The molded body 10 need not be constituted only by the solidified molten material. A resin reinforcing material, such as glass fiber, or an inorganic filler for increasing a dielectric constant, such as barium titanate, may be added to the molded body 10. Further, it is also possible to use thermosetting resin that is in a fluid state by heating before introduction of, for example, a silicone resin, a phenol resin, or an epoxy resin, but cures by a chemical reaction in a mold, or a urethane resin obtained by mixing two liquids. The circuit sheet 20 can be physically fixed to the molded body 10 even when the molded body 10 is molded with, for example, a polyacetal resin and an engineering resin that are difficult to bond to the circuit sheet 20, or a thermosetting resin that does not bond to a general-purpose adhesive. The molding method is not limited to injection molding, and only needs to be selected from, for example, transfer molding, foam molding, blow molding, and RIM molding, suitable for the material of each molded body.

(2) Method for Manufacturing Molded Article

Figure 10:
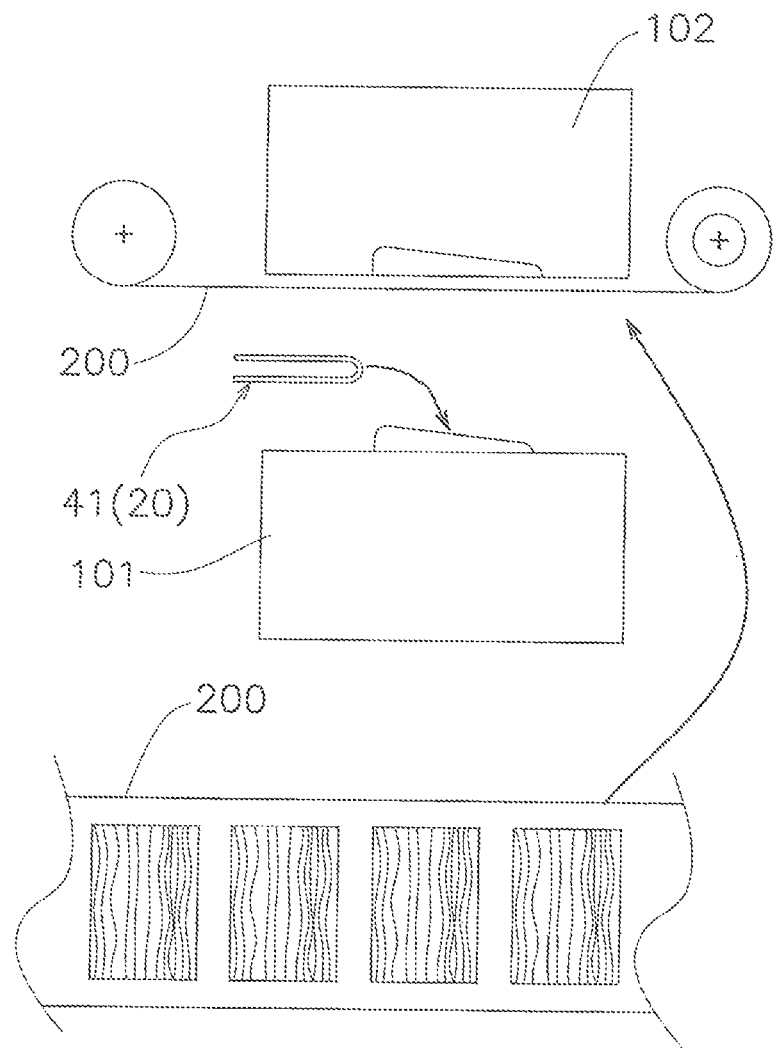
FIG. 10 is a schematic view illustrating the first mold and the second mold before clamping.
Figure 11:
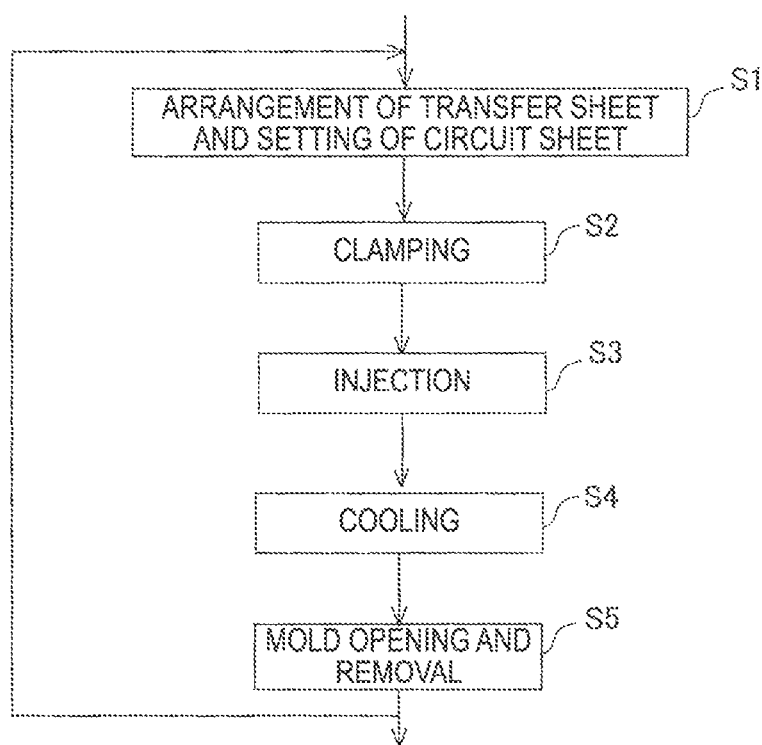
FIG. 11 is a flowchart depicting steps of the method for manufacturing the molded article.

The molded article 1 is manufactured using, for example, the first mold 101 and the second mold 102 illustrated in FIG. 10. FIG. 11 depicts an outline of a manufacturing flow of the molded article 1.

In a transfer sheet arranging step (Step Si) illustrated in FIG. 11, as illustrated in FIG. 10, a transfer sheet 200 is arranged between the opened molds (the first mold 101 and the second mold 102).

The arranged transfer sheet 200 is fixed to the second mold 102 with, for example, a clamp (not illustrated). The transfer sheet 200 is obtained by forming a transfer layer and an adhesive layer on a base substrate film. In the method for manufacturing the molded article 1 illustrated in FIGS. 10 and 11, the transfer layer is bonded to the outer surface 11 of the molded body 10 with the adhesive layer. In most cases, the base substrate film constituting the transfer sheet 200 is formed of a polyolefin resin, a polycarbonate resin, or a polyethylene terephthalate resin.

Together with the arrangement of the transfer sheet 200, or before or after the arrangement of the transfer sheet 200, the circuit sheet 20 is set in the first mold 101 (Step S1). After the circuit sheet 20 is set, the first mold 101 and the second mold 102 are clamped (Step S2). By clamping the first mold 101 and the second mold 102, a cavity Cv (see FIGS. 14A and 14B) surrounded by the first mold 101 and the second mold 102 is formed.

Molten resin is injected into the cavity Cv of the first mold 101 and the second mold 102 (Step S3). A predetermined pressure is continuously applied such that the resin injected into the cavity Cv has an appropriate density. In the first embodiment, molten resin will be described as an example of the molten material. However, the molten material may be other than the molten resin. For example, as the molten material instead of the molten resin, a molten thermoplastic elastomer may be used, and the molten material may be thermosetting resin that becomes a fluid state by heating and causes a chemical reaction to cure by heat in the mold or may be urethane resin produced by mixing two liquids of a main agent and a reactant to cause a chemical reaction in the mold.

Next, the molten resin in the cavity Cv is cooled (Step S4). The resin cooled and solidified in the cavity Cv becomes the molded body 10.

Finally, the first mold 101 and the second mold 102 are opened to take out the molded article 1 (Step S5).

Figure 12:
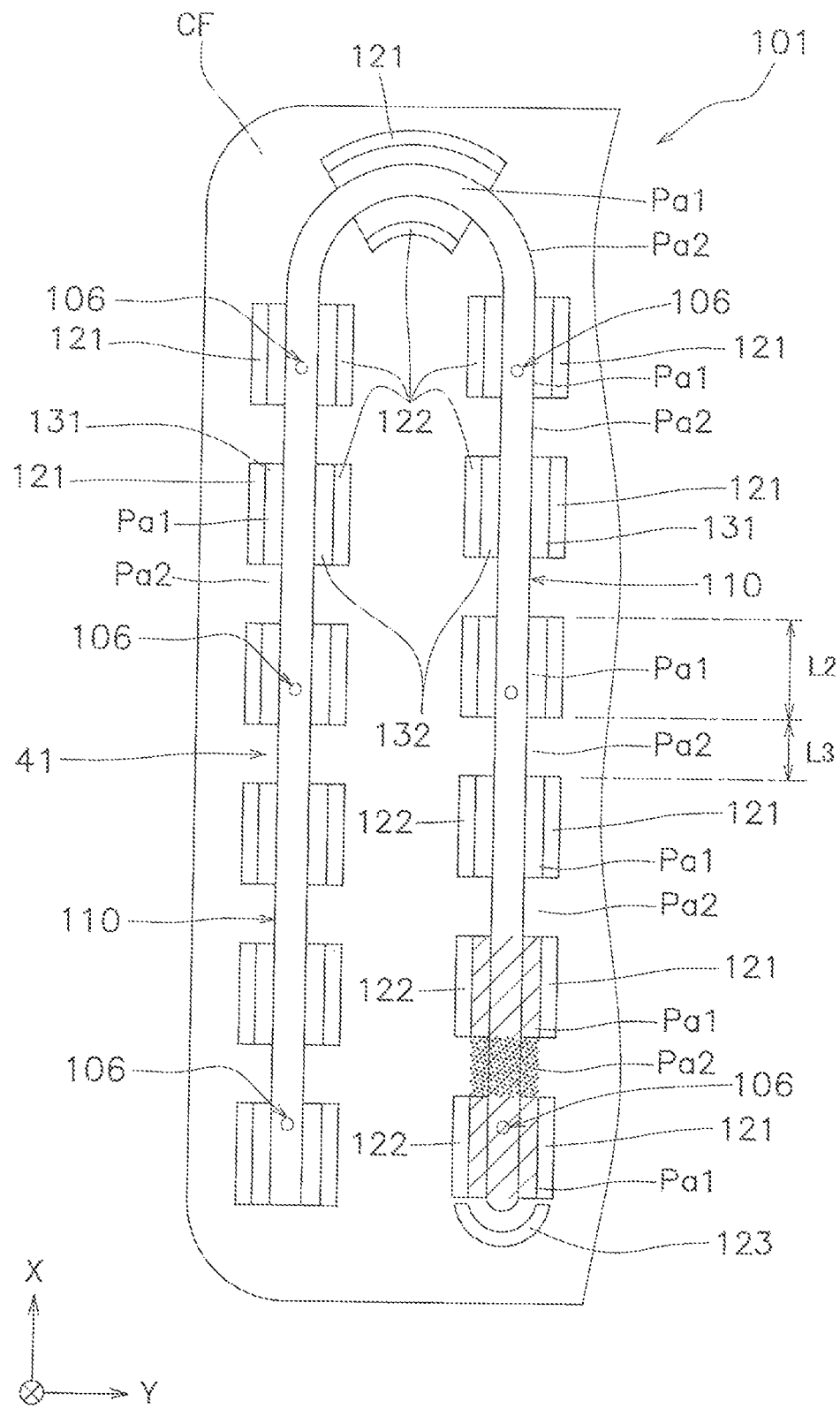
FIG. 12 is a partially enlarged plan view illustrating a part of the first mold.
Figure 13:
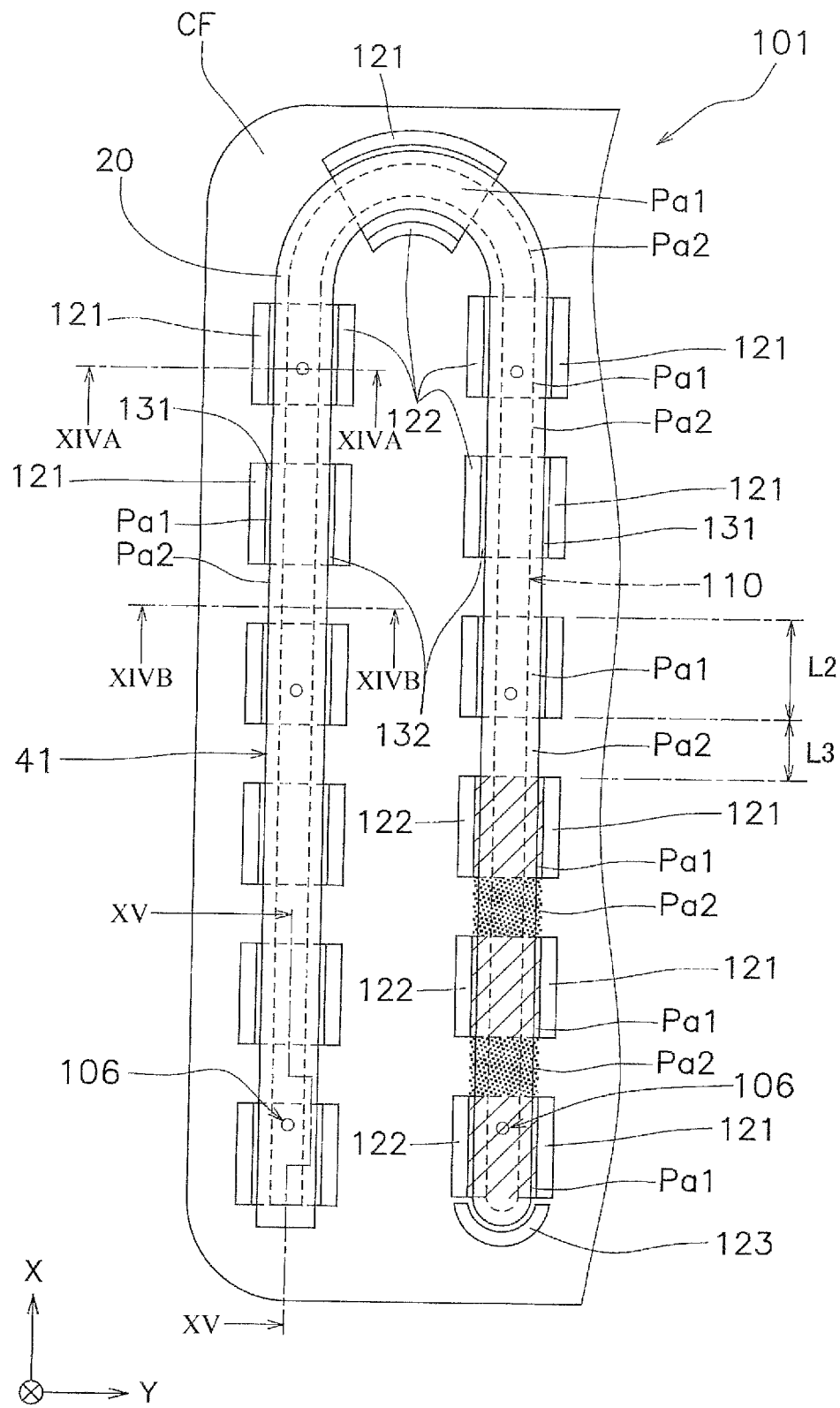
FIG. 13 is a partially enlarged plan view illustrating a part of the first mold and the circuit sheet.
Figure 14A:
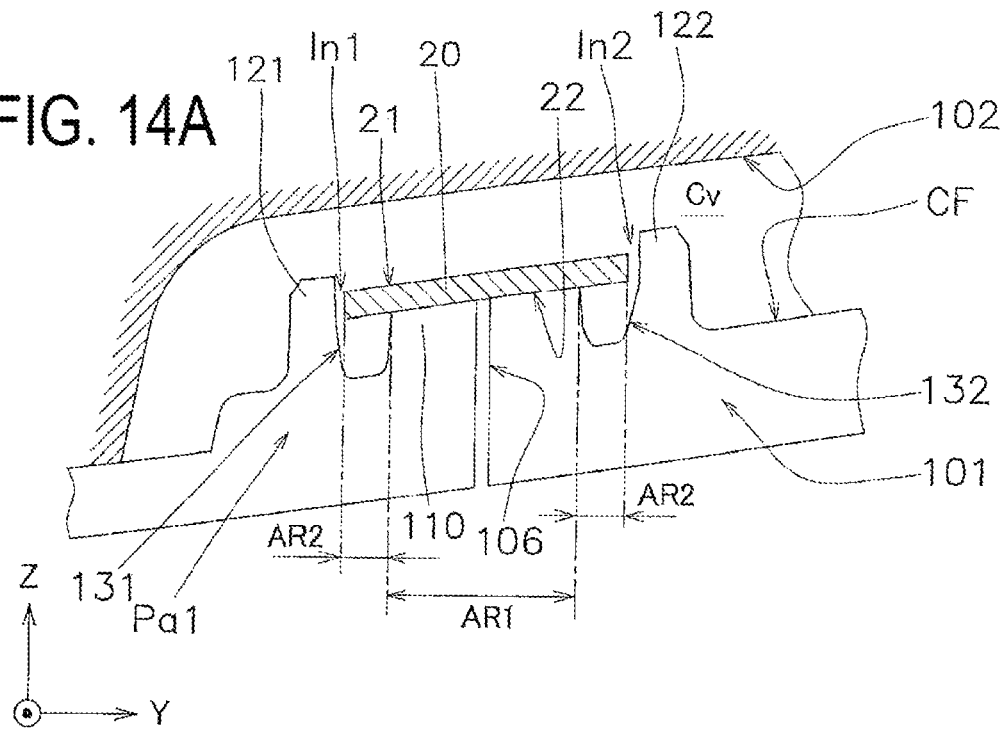
FIG. 14A is a partially enlarged cross-sectional view of the first mold, the second mold, and the circuit sheet cut at a position along the line XIVA-XIVA in FIG. 13.
Figure 14B:
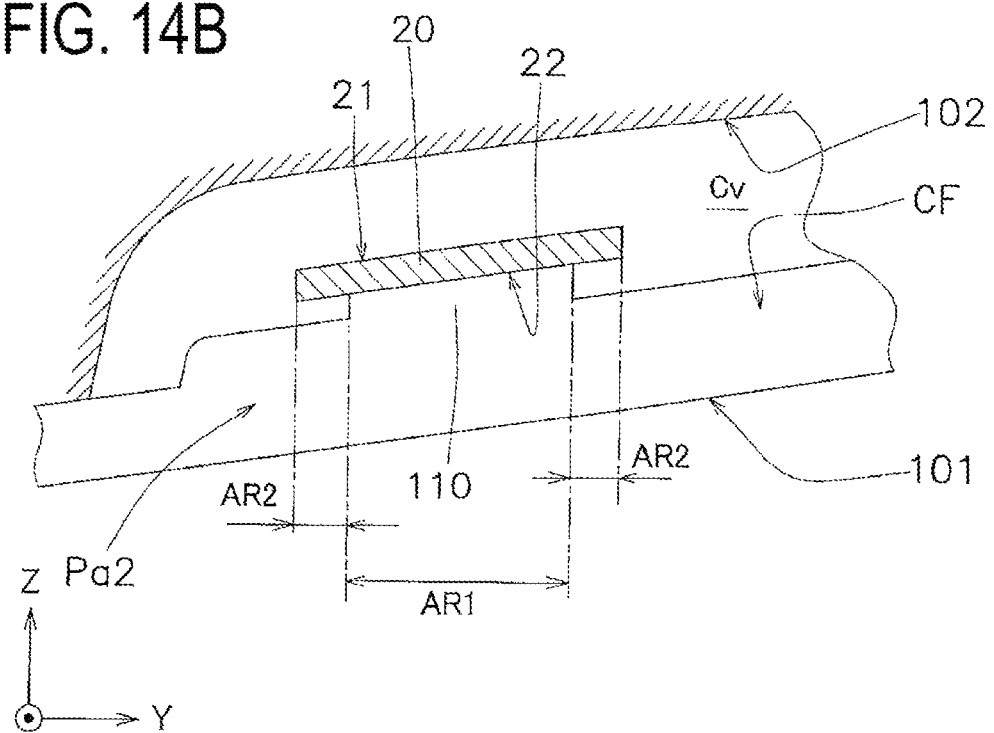
FIG. 14B is a partially enlarged cross-sectional view of the first mold, the second mold, and the circuit sheet cut at a position along the line XIVB-XIVB in FIG. 13.
Figure 15A:
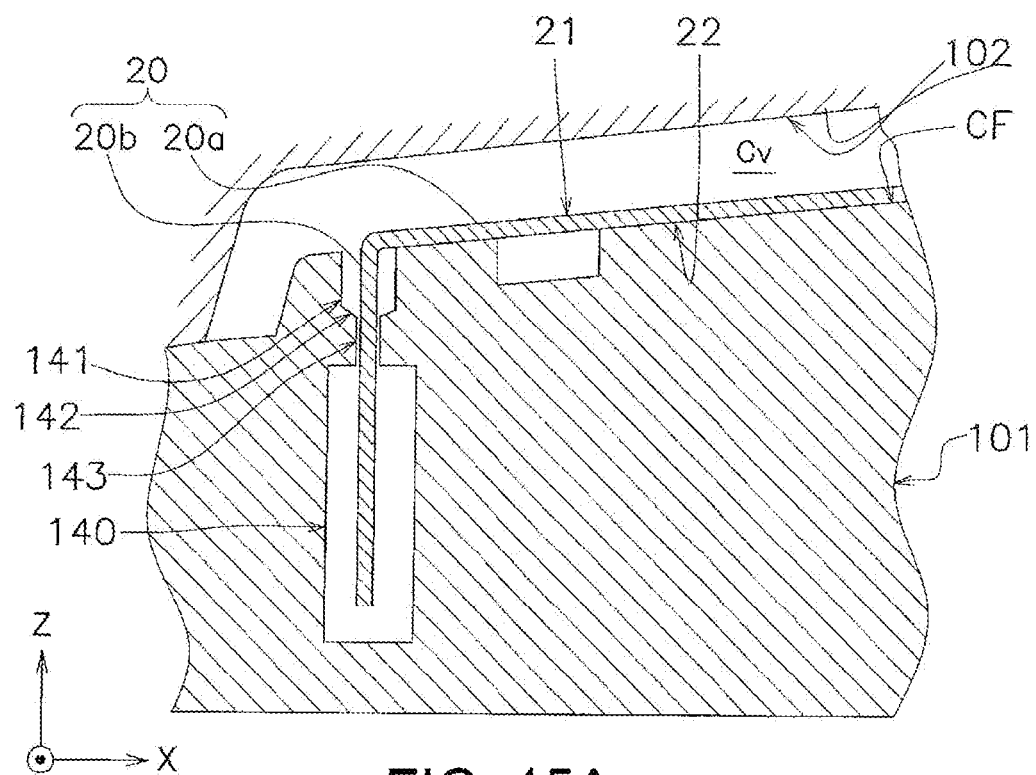
FIG. 15A is a partially enlarged cross-sectional view illustrating one example of the first mold, the second mold, and the circuit sheet cut at a position along the line XV-XV in FIG. 13.
Figure 15B:
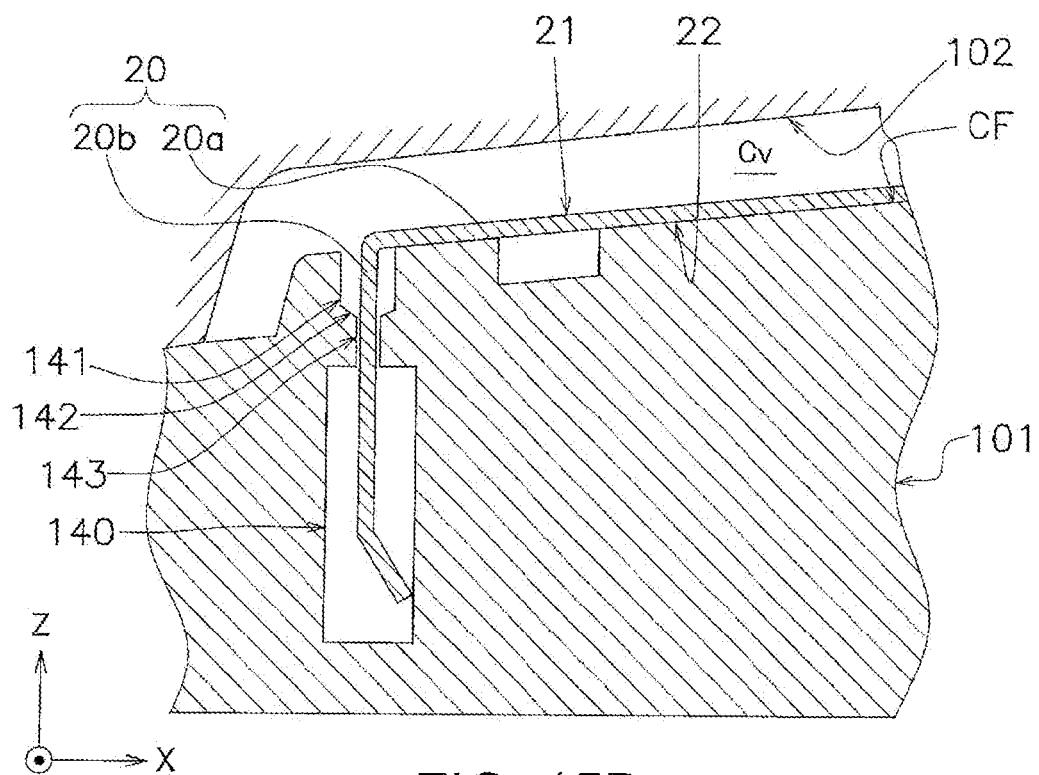
FIG. 15B is a partially enlarged cross-sectional view illustrating another example of the first mold, the second mold, and the circuit sheet cut at a position along the line XV-XV in FIG. 13.

The setting of the circuit sheet 20 to the first mold 101 in the above-described Step S1 (first step) will be described in more detail. FIGS. 12 and 13 illustrate a part of the enlarged first mold 101 illustrated in FIG. 10. In FIG. 13, a core surface CF of the first mold 101 and the circuit sheet 20 constituting the antenna 41 set on the core surface CF are enlarged. FIG. 14A illustrates an enlarged cross-sectional shape of the first mold 101 and the second mold 102 in the clamped state and the circuit sheet 20 cut at a position along the line XIVA-XIVA in FIG. 13. FIG. 14B illustrates an enlarged cross-sectional shape of the first mold 101 and the second mold 102 in the clamped state and the circuit sheet 20 cut along the line XIVB-XIVB in FIG. 13. FIGS. 15A and 15B illustrate an enlarged cross-sectional shape of the first mold 101 and the second mold 102 in the clamped state and the circuit sheet 20 cut at a position along the line XV-XV in FIG. 13. The difference between FIGS. 15A and 15B is whether the connecting portion 20c of the lead portion 20b of the circuit sheet 20 is bent or not.

As illustrated in FIGS. 14A and 14B, the first mold 101 has the plateau portion 110 on the core surface CF. In FIGS. 14A and 14B, hatching indicating the cross section of the first mold 101 is omitted to avoid the drawings being difficult to be seen. The plateau portion 110 is a portion having a flat surface and that is raised from the surrounding core surface CF. A part of the second main surface 22 of the circuit sheet 20 is in contact with the plateau portion 110. A part of the second main surface 22 in contact with the plateau portion 110 is a first region AR1. Further, a part of the second main surface 22 of the circuit sheet 20 is not in contact with the plateau portion 110. A part of the second main surface 22 not in contact with the plateau portion 110 is a second region AR2. A plurality of the air suction holes 106 are provided in the plateau portion 110.

A first protruding portion 121 and a second protruding portion 122 are provided along the plateau portion 110. More specifically, the first protruding portion 121 and the second protruding portion 122 are provided along positions opposed to both side surface portions of the plateau portion 110. For example, when the thickness of the molded article (the distance between the core surface CF and the inner surface of the second mold 102) is 2.0 mm, and the height of the plateau portion 110 from the core surface CF is greater than 0 and 1.3 mm or less. The heights of the first protruding portion 121 and the second protruding portion 122 only need to be the height of the first main surface, which is equal to or greater than the half of the thickness of the circuit sheet 20 set on the plateau portion 110. As described above, the first protruding portion 121 and the second protruding portion 122 are higher than the plateau portion 110 when viewed from the core surface CF. The heights of the first protruding portion 121 and the second protruding portion 122 are preferably equal to or higher than the end surface of the circuit sheet 20 set in the first mold 101. The first protruding portion 121 and the second protruding portion 122 may have different heights from one another. A first portion Pa1 and a second portion Pa2 on which the circuit sheet 20 is arranged will be described using three sets of the first protruding portions 121 and the second protruding portions 122 in FIG. 13. In the three sets of the first protruding portions 121 and the second protruding portions 122 in FIG. 13, the portions hatched with oblique lines between the first protruding portions 121 and the second protruding portions 122 are the first portions Pa1. The second portions Pa2 are portions hatched with dots in FIG. 13. To avoid the drawings being difficult to be seen, hatching is provided to only a part of the first portions Pa1 and the second portions Pa2 in FIG. 13. Therefore, in FIG. 13, even in a portion not hatched in the portion where the circuit sheet 20 is arranged, a portion between the first protruding portion 121 and the second protruding portion 122 is the first portion Pa1. In addition, in FIG. 13, even in a portion not hatched in the portion where the circuit sheet 20 is arranged, a portion along the plateau portion 110 where neither the first protruding portion 121 nor the second protruding portion 122 is arranged is the second portion Pa2. A length L2 of the first portion Pa1 is, for example, from 1 mm to 10 mm, and a length L3 of the second portion Pa2 is, for example, from 0.5 mm to 5 mm.

As illustrated in FIGS. 12 and 13, the second portion Pa2 is a portion where the width of the plateau portion 110 is narrower than the width of the circuit sheet 20. Therefore, the circuit sheet 20 protrudes from the plateau portion 110 by the difference in width between the plateau portion 110 and the circuit sheet 20. The portion of the circuit sheet 20 protruding from the plateau portion 110 becomes the second region AR2 not in contact with the plateau portion 110.

In the first portion Pa1, groove portions 131 and 132 are formed between the first protruding portion 121 and the plateau portion 110 and between the second protruding portion 122 and the plateau portion 110.

A third protruding portion 123 is provided at one end portion of the plateau portion 110. The third protruding portion 123 is higher than the plateau portion 110 when viewed from the core surface CF. By providing such the third protruding portion 123, a force that the circuit sheet 20 receives from the molten resin when the molten resin is injected is weakened by the third protruding portion 123. Due to the action of the third protruding portion 123, displacement of one end portion of the circuit sheet 20 by the force applied from the molten resin to the circuit sheet 20 is suppressed.

As illustrated in FIGS. 15A and 15B, in the state where the circuit sheet 20 is set in the first mold 101, the lead portion 20b of the circuit sheet 20 is accommodated in an opening 141, a slit 143, and an accommodating portion 140. The opening 141 is wider and thicker than the lead portion 20b. During molding, molten resin enters the opening 141. The molten resin that has entered the opening 141 becomes a support portion 17 at the root of the bent portion of the lead portion 20b after molding. The width and the thicknesses of the slit 143 are only slightly larger than the width and the thicknesses of the lead portion 20b of the circuit sheet 20. Since the lead portion 20b is inserted into the slit 143, the molten resin cannot enter the slit 143 and the resin does not enter the accommodating portion 140. Therefore, since the connecting portion 20c is exposed even after molding, electrical connection can be performed using the connecting portion 20c. The first mold 101 is provided with a tapered portion 142 extending from the opening 141 to the slit 143 to easily guide the lead portion 20b to the slit 143. Further, the molten resin enters the opening 141 wider and thicker than the slit 143, and the rising portion of the connecting portion 20c is reinforced.

In the above-described Step S2 (second step), as illustrated in FIGS. 14A and 14B, the first mold 101 and the second mold 102 are clamped such that the circuit sheet 20 is not in contact with the second mold 102. In the above-described Step S3 (third step), the molten resin is injected into the cavity Cv, and comes into contact with the first main surface 21 and the second regions AR2 of the second main surface 22 of the circuit sheet 20. Further, in Step S4 (fourth step), the molten resin is cooled and solidified to form the molded article 1 made of resin having the outer surface 11 opposed to the first main surface 21 of the circuit sheet 20 and the inner surface 12 opposed to the second regions AR2 of the second main surface 22. In Step S5 (fifth step), the first mold 101 and the second mold 102 are opened to take out the molded article 1. A decorative layer 19 is transferred to the outer surface 11 of the molded body 10.

Figure 16:
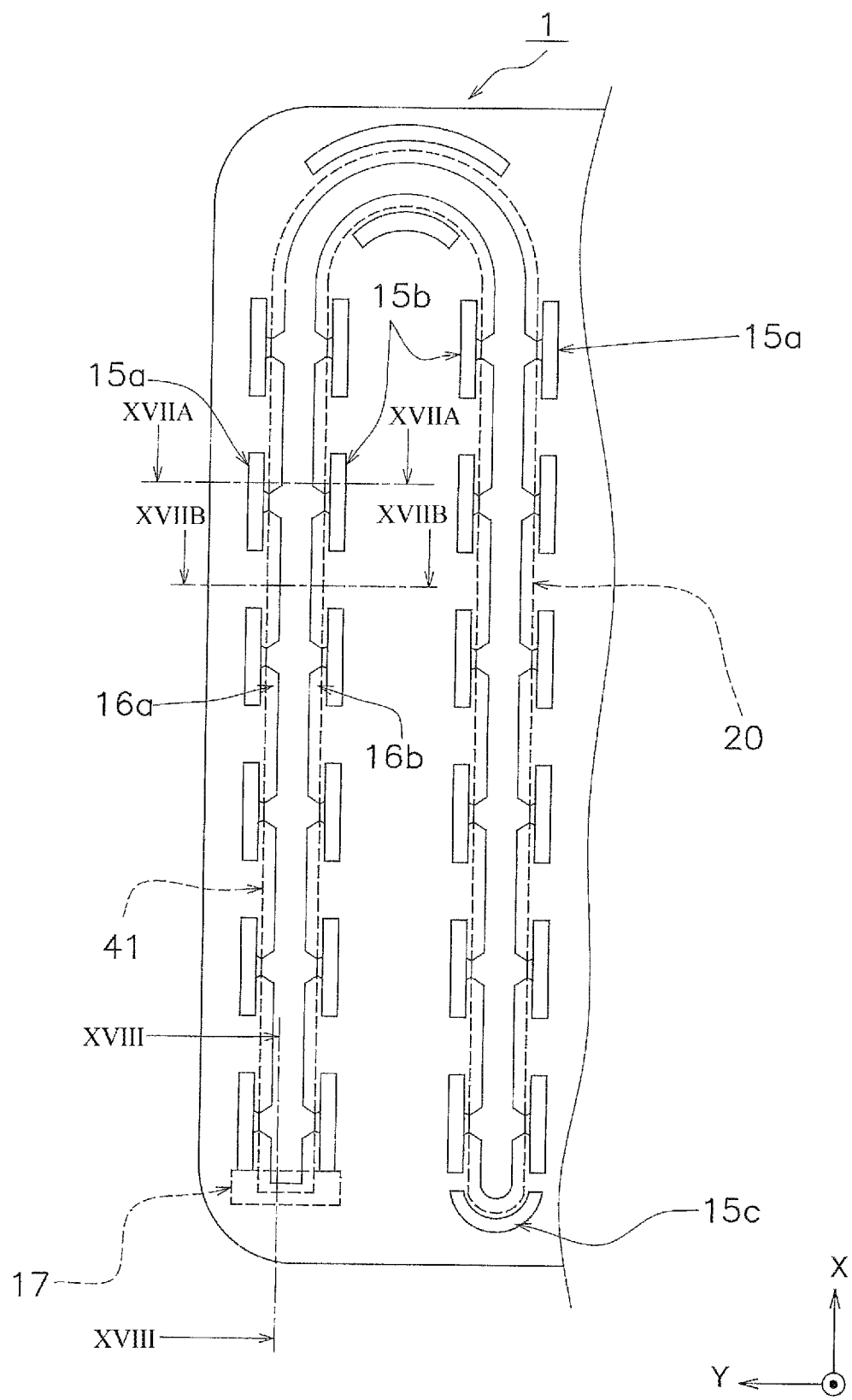
FIG. 16 is a partially enlarged bottom view in which a part of the molded article is enlarged.
Figure 17A:
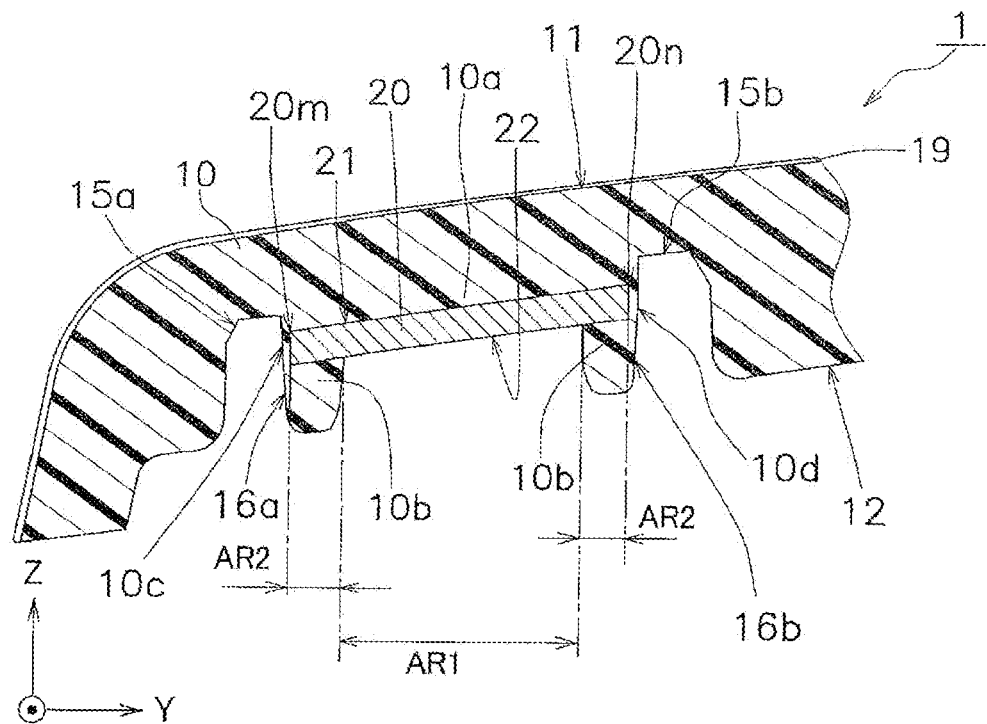
FIG. 17A is a partial cross-sectional view of the molded article cut along the line XVIIA-XVIIA in FIG. 16.
Figure 17B:
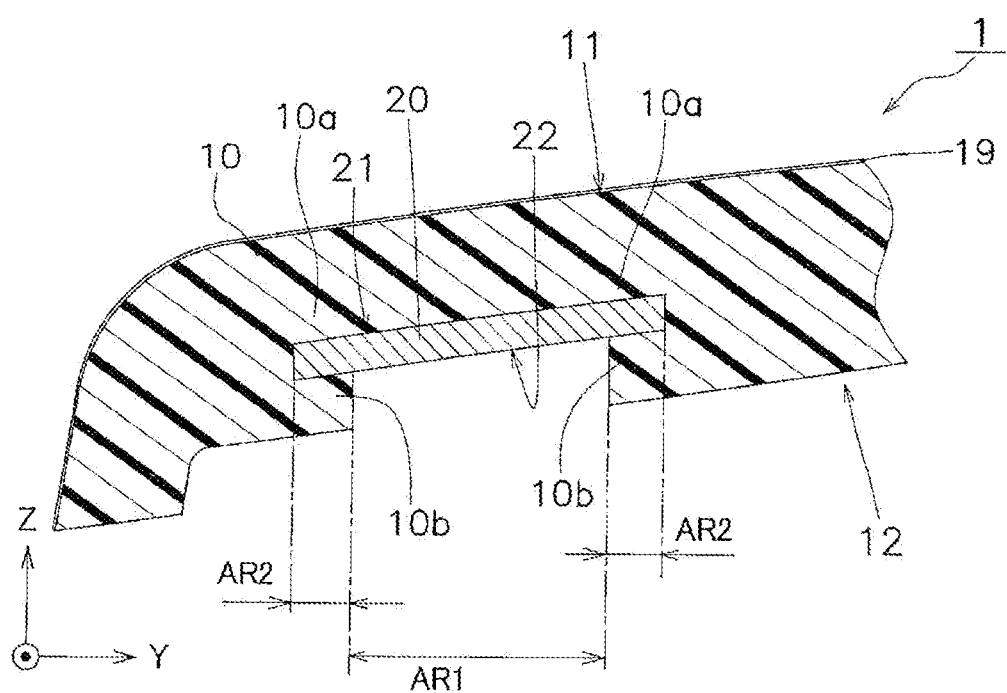
FIG. 17B is a partial cross-sectional view of the molded article cut along the line XVIIB-XVIIB in FIG. 16.
Figure 18A:
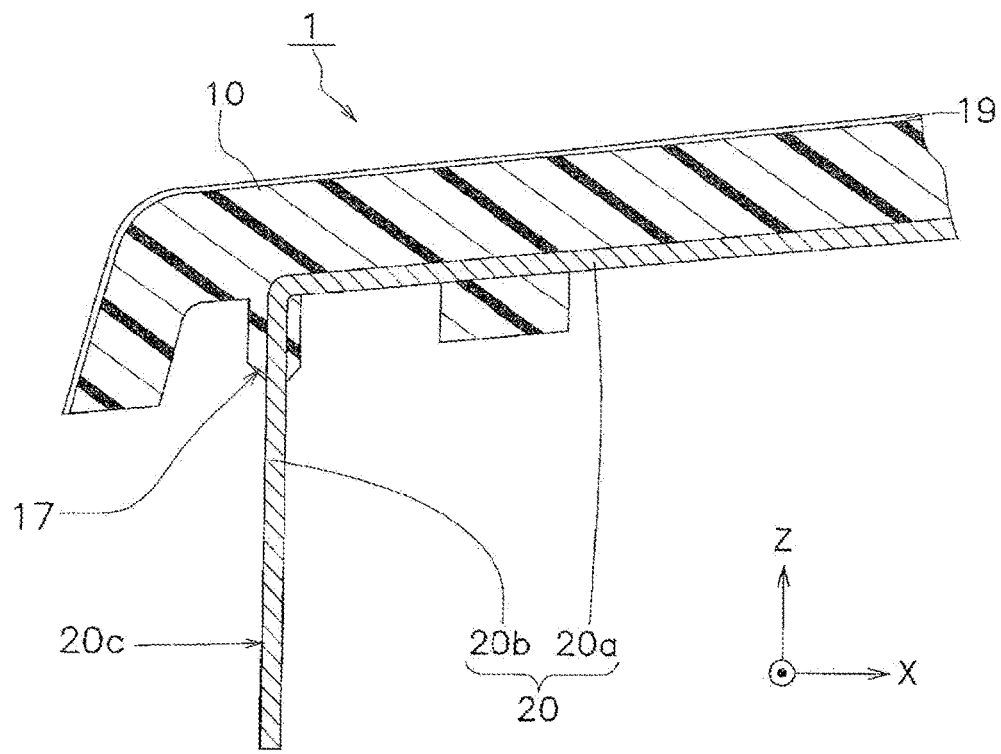
FIG. 18A is a cross-sectional view illustrating an example of the molded article cut along the line XVIII-XVIII in FIG. 16.
Figure 18B:
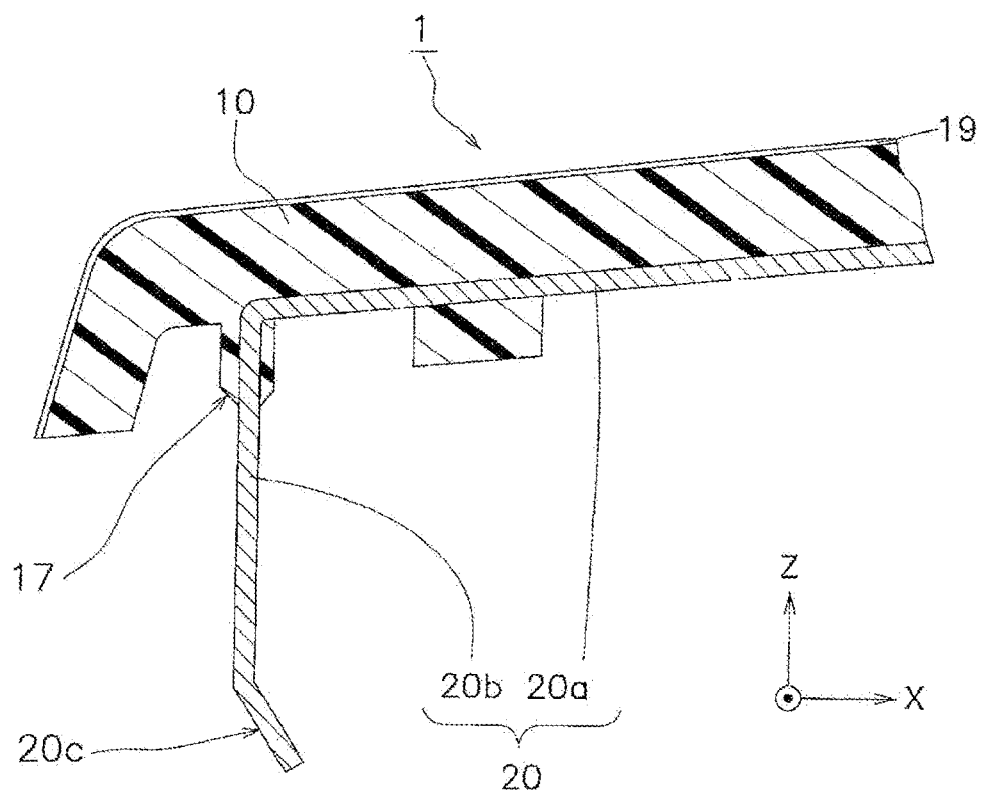
FIG. 18B is a cross-sectional view illustrating another example of the molded article cut along the line XVIII-XVIII in FIG. 16.

As illustrated in FIGS. 13 to 15B, the molded article 1 molded using the antenna 41 set in the first mold 101 and the second mold 102 is illustrated in FIGS. 16, 17A, 17B, 18A, and 18B. FIG. 17A illustrates an enlarged cross-sectional shape of the molded article 1 cut along the line XVIIA-XVIIA in FIG. 16. FIG. 17B illustrates an enlarged cross-sectional shape of the molded article 1 cut along the line XVIIB-XVIIB in FIG. 16. FIGS. 18A and 18B illustrate the enlarged cross-sectional shape of the molded article 1 cut along the line XVIII-XVIII in FIG. 16. Neither the first protruding portion 121 nor the second protruding portion 122 is provided along the plateau portion 110 on the second portion Pa2 of the first mold 101. As illustrated in FIG. 17B, resin supporting portions 10*b* of the molded body 10 are in contact with the second regions AR2 of the second main surface 22 of the circuit sheet 20 in the second portion Pa2 where neither the first protruding portion 121 nor the second protruding portion 122 is provided along the plateau portion 110. Since the circuit sheet 20 is sandwiched between the resin supporting portions 10*b* in contact with the second regions AR2 of the second main surface 22 and a resin 10*a* in contact with the first main surface 21 opposed to the second regions AR2, the circuit sheet 20 is firmly fixed by the resin 10*a* on the first main surface 21 side and the resin supporting portions 10*b* on the second main surface 22 side between which the circuit sheet 20 is sandwiched.

Recessed portions 15*a* and 15*b* illustrated in FIG. 17A are recesses formed when the first protruding portion 121 and the second protruding portion 122 illustrated in FIG. 14A come off. Ribs 16*a* and 16*b* adjacent to the recessed portions 15*a* and 15*b* are formed by the molten resin entering the groove portions 131 and 132 illustrated in FIG. 14A. The circuit sheet 20 is sandwiched between the ribs 16*a* and 16*b* and the resin 10*a* on the first main surface 21 side opposed to the ribs 16*a* and 16*b*. The resins (ribs 16*a* and 16*b*) entering the groove portions 131 and 132 in this manner reinforce the fixation of the circuit sheet 20 in the molded article 1.

As illustrated in FIG. 14A, a gap In1 is provided between the circuit sheet 20 and the first protruding portion 121. Similarly, a gap In2 is provided between the circuit sheet 20 and the second protruding portion 122. The gaps In1 and In2 serve as margins when the circuit sheet 20 is set between the first protruding portion 121 and the second protruding portion 122. Therefore, the narrower the gaps In1 and In2 become, the higher the positional accuracy of the circuit sheet 20 in the molded body 10 becomes, but the shape of the circuit sheet 20 is required to be highly accurate at all portions. To prevent the set circuit sheet 20 from falling off from the first mold 101, one or more air suction holes may be provided at any portion of the plateau portion 110. Regarding fixation of the circuit sheet 20, the molten resin also enters the gaps In1 and In2 to form resin side walls 10*c* and 10*d* outside a first end side 20*m* and a second end side 20*n* of the circuit sheet 20, and the fixation of the circuit sheet 20 is strengthened by the side walls 10*c* and 10*d*. The total size of the widths of the gaps In1 and In2 is, for example, from 0.01 mm to 0.2 mm.

As illustrated in FIGS. 18A and 18B, the resin does not bond to the connecting portion 20*c* of the circuit sheet 20. Therefore, the circuit sheet 20 can be satisfactorily electrically connected to a device outside the molded article 1 using the connecting portion 20*c*. The resin that has entered the opening 141 in FIGS. 15A and 15B becomes the support portion 17 that reinforces the root of the bent portion of the lead portion 20*b*. The circuit sheet 20 in FIGS. 18A and 18B is made of a thin plate of phosphor bronze and is a metal sheet having an excellent spring property. As illustrated in FIG. 18A, the connecting portion 20*c* may be used in a straight shape without being bent. However, as illustrated in FIG. 18B, before or after insert-molding of the molded article 1, the connecting portion 20*c* made of the metal sheet may be deformed into a shape suitable for electrical connection by, for example, press working.

Second Embodiment

In the first embodiment, as illustrated in FIG. 14A, the case where the molded article 1 is manufactured using the first mold 101 in which the groove portions 131 and 132 are formed between the plateau portion 110 and the first protruding portion 121 and the second protruding portion 122 has been described. However, the molded article 1 may be manufactured using the first mold 101 in which the groove portion 131 or 132 is not formed.

In the second embodiment, a method for manufacturing the molded article 1 using the first mold 101 in which the groove portion 131 or 132 is not formed and a molded article manufactured by the method will be described.

(3) Method for Manufacturing Molded Article

Figure 19:
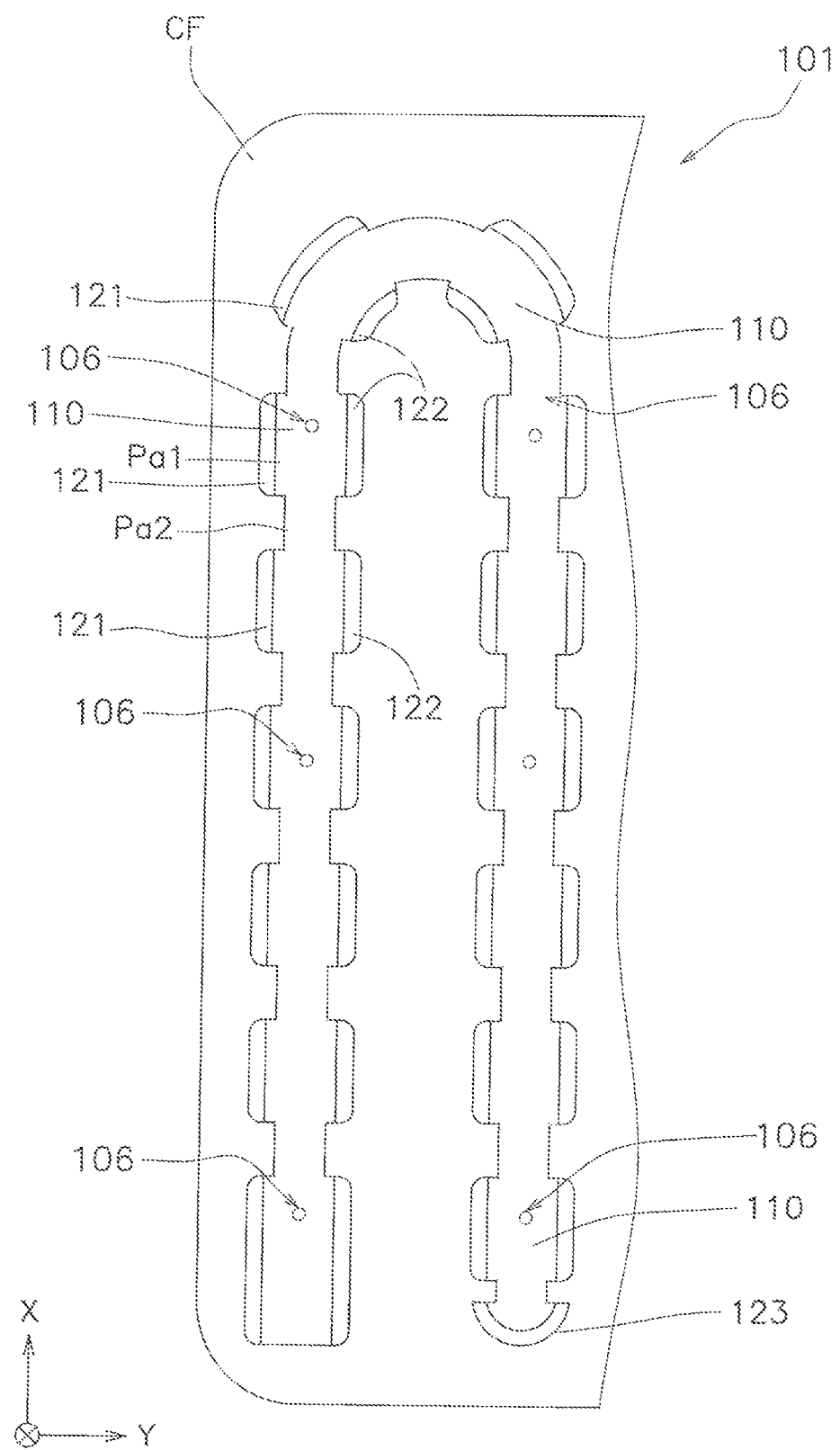
FIG. 19 is a partially enlarged plan view illustrating a part of a first mold of a second embodiment.

The molded article 1 is manufactured using, for example, the first mold 101 illustrated in FIG. 19. As a manufacturing flow of the molded article 1 of the second embodiment, a manufacturing flow depicted in FIG. 11 can be used similarly to the first embodiment. Since the manufacturing method of the second embodiment is the same as the manufacturing method of the first embodiment except that the first mold 101 illustrated in FIG. 19 is used, the description of the outline of the manufacturing flow according to the second embodiment will be omitted.

Figure 20:
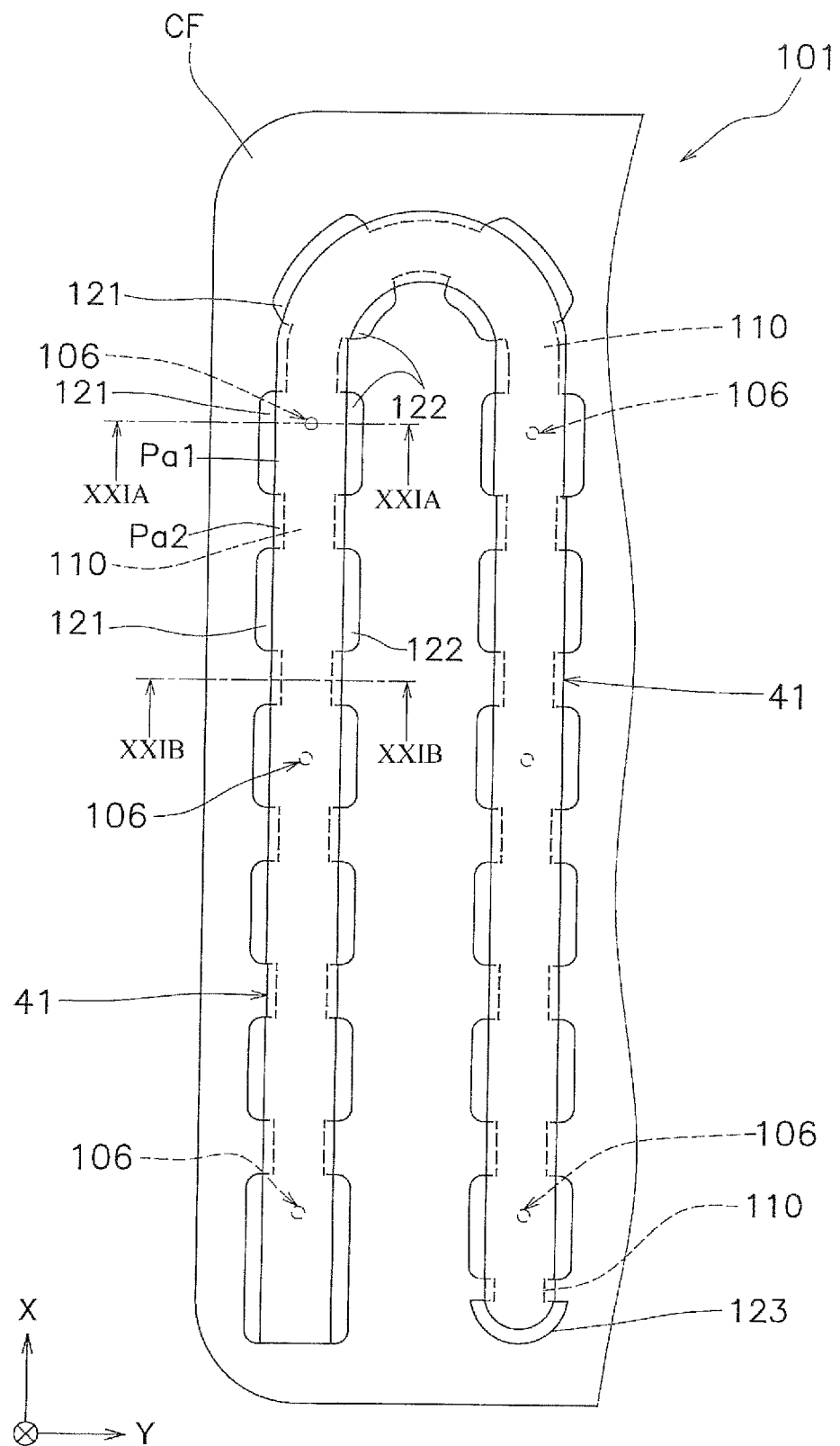
FIG. 20 is a partially enlarged plan view illustrating a part of the first mold and a circuit sheet of the second embodiment.
Figure 21A:
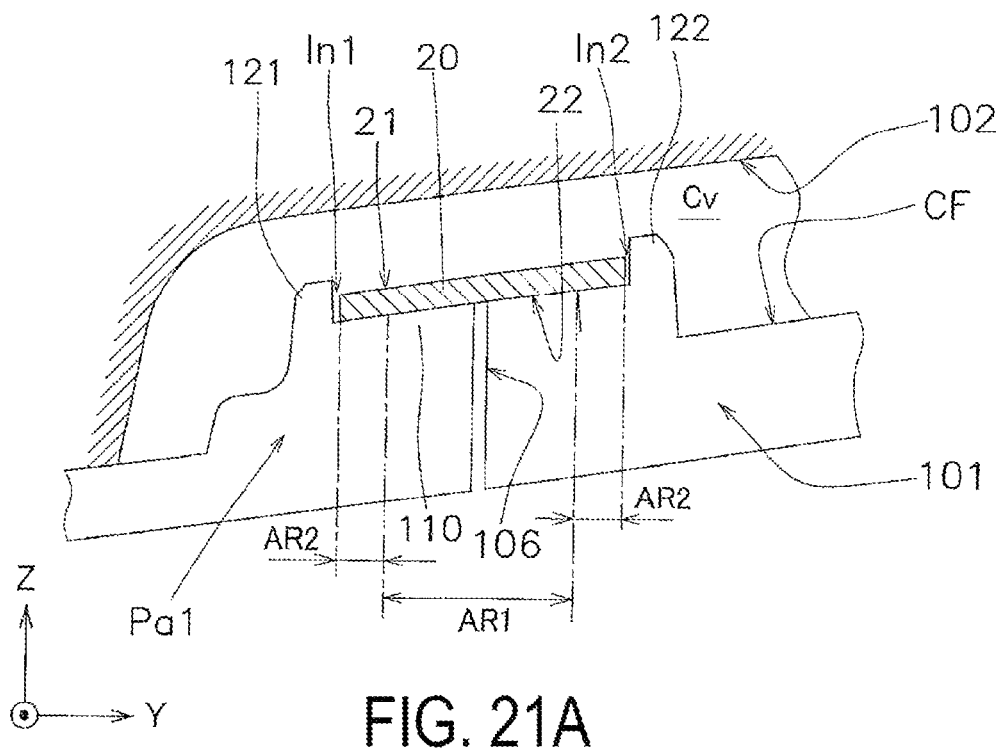
FIG. 21A is a partially enlarged cross-sectional view of the first mold, the second mold, and the circuit sheet cut at a position along the line XXIA-XXIA in FIG. 20.
Figure 21B:
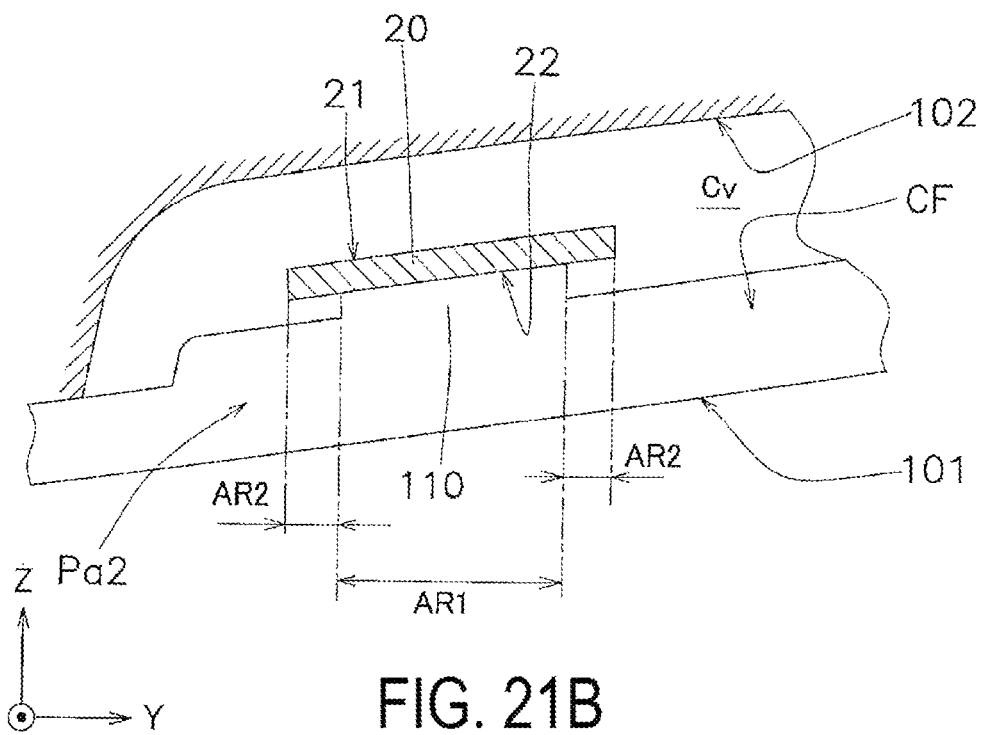
FIG. 21B is a partially enlarged cross-sectional view of the first mold, the second mold, and the circuit sheet cut at a position along the line XXIB-XXIB in FIG. 20.

The setting of the circuit sheet 20 to the first mold 101 in the above-described Step S1 (first step) will be described in more detail. FIGS. 19 and 20 illustrate a part of the enlarged first mold 101 illustrated in FIG. 10. In FIG. 20, the core surface CF of the first mold 101 and the circuit sheet 20 constituting the antenna 41 set on the core surface CF are enlarged. FIG. 21A illustrates an enlarged cross-sectional shape of the first mold 101 and the second mold 102 in the clamped state and the circuit sheet 20 cut at a position along the line XXIA-XXIA in FIG. 20. FIG. 21B illustrates an enlarged cross-sectional shape of the first mold 101 and the second mold 102 in the clamped state and the circuit sheet 20 cut along the line XXIB-XXIB in FIG. 20. In FIGS. 21A and 21B, hatching indicating the cross section of the first mold 101 is omitted to avoid the drawings being difficult to be seen. Note that the components of the first mold 101 of the second embodiment same as those of the first mold 101 of the first embodiment are denoted by the same reference numerals, and description thereof is omitted.

As illustrated in FIGS. 19 and 20, the second portion Pa2 is a portion where the width of the plateau portion 110 is narrower than the width of the circuit sheet 20. Therefore, the circuit sheet 20 protrudes from the plateau portion 110 by the difference in width between the plateau portion 110 and the circuit sheet 20. The portion of the circuit sheet 20 protruding from the plateau portion 110 becomes the second region AR2 not in contact with the plateau portion 110.

In contrast to the second portion Pa2, the first portion Pa1 is a portion where the width of the plateau portion 110 is wider than the width of the circuit sheet 20. Therefore, the plateau portion 110 protrudes from the circuit sheet 20 by the difference in width between the plateau portion 110 and the circuit sheet 20.

In the second embodiment, as illustrated in FIGS. 19 and 20, in the first portion Pa1, a groove portion is not formed between the first protruding portion 121 and the plateau portion 110 or between the second protruding portion 122 and the plateau portion 110. The third protruding portion 123 is provided at one end portion of the plateau portion 110. A groove is not formed between the third protruding portion 123 and the plateau portion 110 as well.

In the above-described Step S2 (second step), as illustrated in FIGS. 21A and 21B, the first mold 101 and the second mold 102 are clamped such that the circuit sheet 20 is not in contact with the second mold 102. In the above-described Step S3 (third step), molten resin is injected into the cavity Cv. Further, in Step S4 (fourth step), the molten resin is cooled and solidified to form the molded article 1 made of resin having the outer surface 11 opposed to the first main surface 21 of the circuit sheet 20 and the inner surface 12 opposed to the second regions AR2 of the second main surface 22. In Step S5 (fifth step), the first mold 101 and the second mold 102 are opened to take out the molded article 1. The decorative layer 19 is transferred to the outer surface 11 of the molded body 10.

Figure 22A:
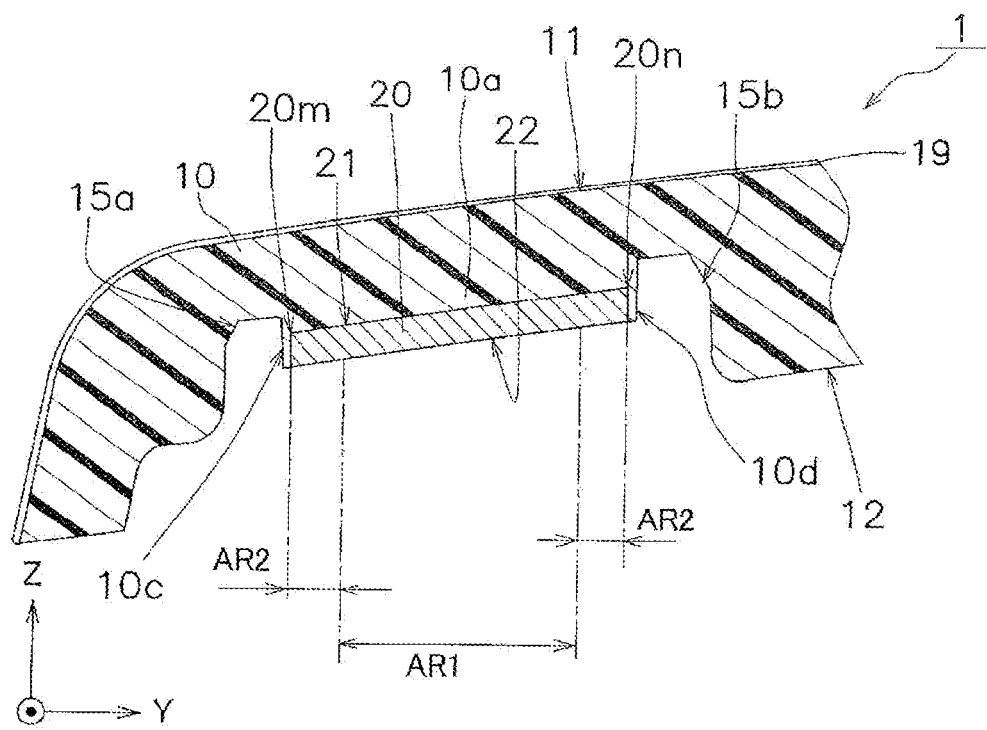
FIG. 22A is a partial cross-sectional view of the molded article cut at a position corresponding to the position of FIG. 21A.
Figure 22B:
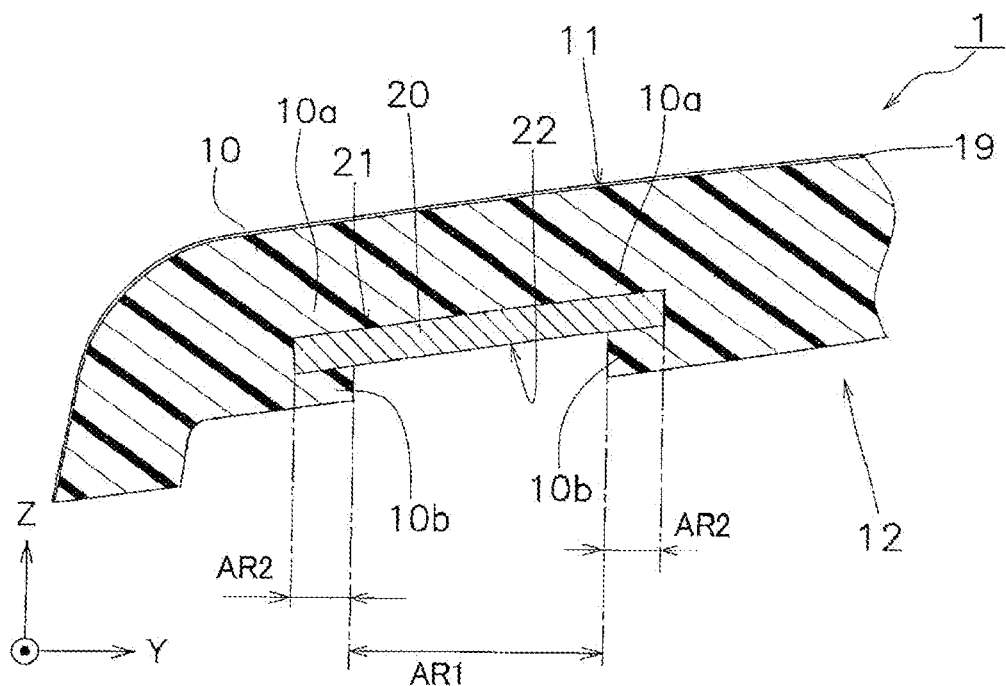
FIG. 22B is a partial cross-sectional view of the molded article cut at a position corresponding to the position of FIG. 21B.

As illustrated in FIGS. 20 to 21B, the molded article 1 molded using the antenna 41 set in the first mold 101 and the second mold 102 is illustrated in FIGS. 22A and 22B. FIG. 22A illustrates the enlarged cross-sectional shape of the molded article 1 corresponding to FIG. 21A. FIG. 22B illustrates the enlarged cross-sectional shape of the molded article 1 corresponding to FIG. 21B. Neither the first protruding portion 121 nor the second protruding portion 122 is provided along the plateau portion 110 on the second portion Pa2 of the first mold 101. In the second portion Pa2 where neither the first protruding portion 121 nor the second protruding portion 122 is provided along the plateau portion 110, the width of the plateau portion 110 is narrower than the width of the circuit sheet 20. Therefore, as illustrated in FIG. 22B, resin supporting portions 10b of the molded body 10 are in contact with the second regions AR2 of the second main surface 22 of the circuit sheet 20 in the second portion Pa2. Since the circuit sheet 20 is sandwiched between the resin supporting portions 10b in contact with the second regions AR2 of the second main surface 22 and the resin 10a in contact with the first main surface 21 opposed to the second regions AR2, the circuit sheet 20 is firmly fixed by the resin 10a on the first main surface 21 side and the resin supporting portions 10b on the second main surface 22 side between which the circuit sheet 20 is sandwiched.

The recessed portions 15a and 15b illustrated in FIG. 22A are recesses formed when the first protruding portion 121 and the second protruding portion 122 illustrated in FIG. 21A come off. As illustrated in FIG. 21A, the gap In1 is provided between the circuit sheet 20 and the first protruding portion 121. The gap In2 is provided between the circuit sheet 20 and the second protruding portion 122. To prevent the set circuit sheet 20 from falling off from the first mold 101, one or more air suction holes may be provided at any portion of the plateau portion 110. When the molten resin also enters the gaps In1 and In2 to form the resin side walls 10c and 10d outside the first end side 20m and the second end side 20n of the circuit sheet 20, the fixation of the circuit sheet 20 is strengthened by the side walls 10c and 10d.

Figure 23A:
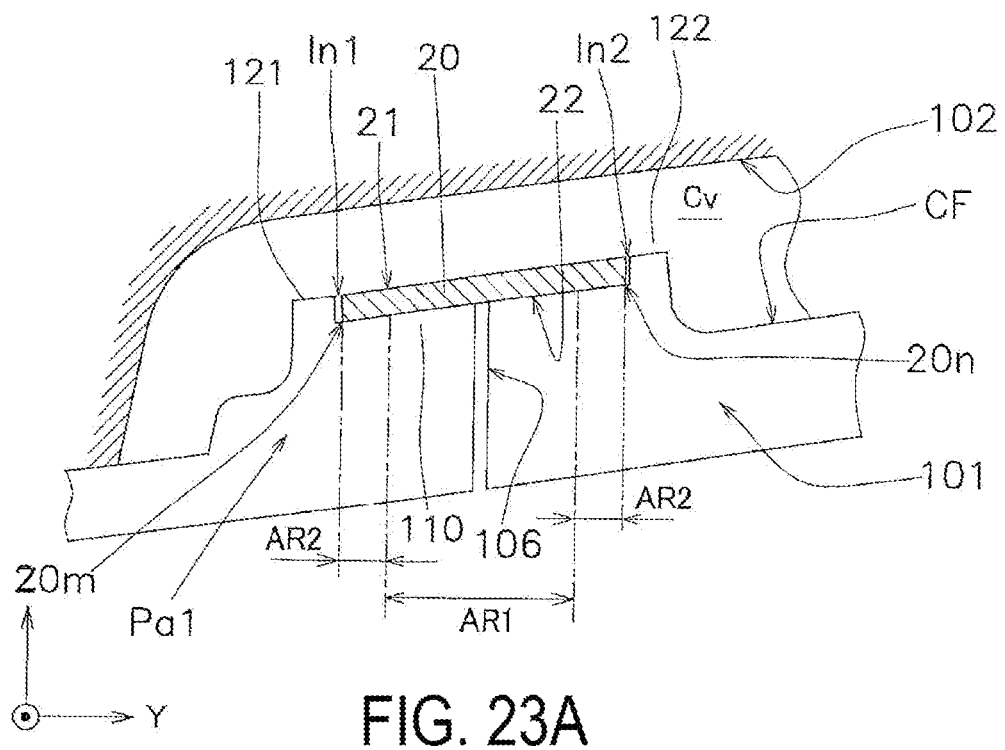
FIG. 23A is a partially enlarged cross-sectional view illustrating another configuration of the first mold, the second mold, and the circuit sheet of the second embodiment.
Figure 23B:
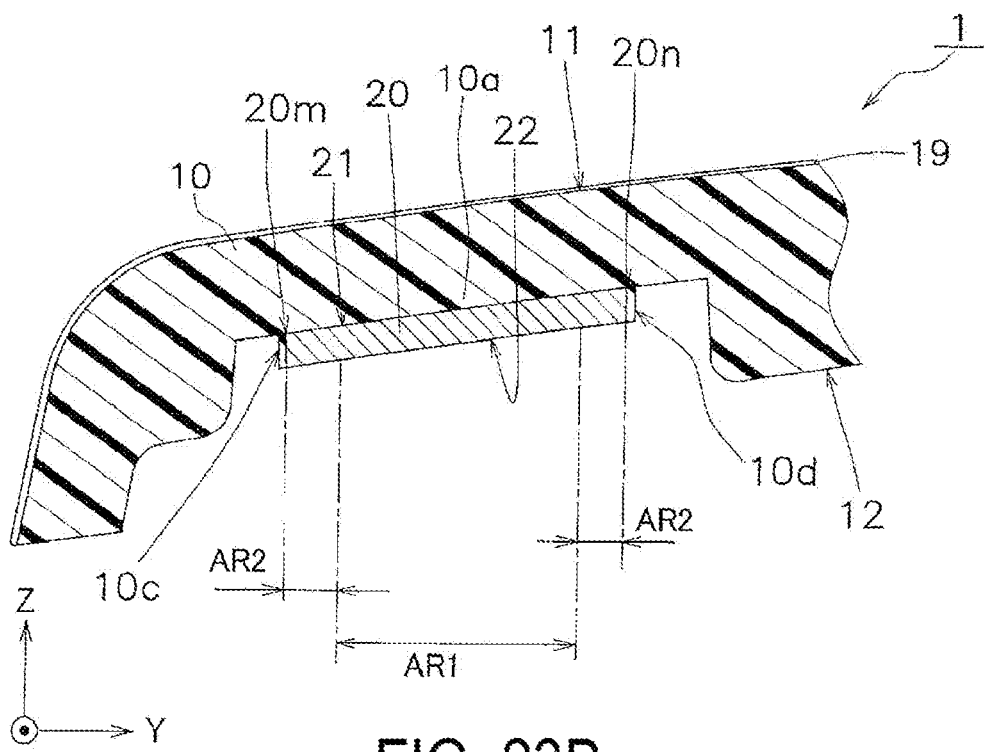
FIG. 23B is a partial cross-sectional view illustrating another configuration of the molded article of the second embodiment.

As illustrated in FIG. 21A, the case in which the first protruding portion 121 and the second protruding portion 122 of the second embodiment are higher than the height of the end surface (the end surface including the first end side 20m and the second end side 20n) of the circuit sheet 20 has been described. However, when the air suction hole 106 is provided, it becomes possible to firmly suck and hold the circuit sheet 20, the first protruding portion 121 and the second protruding portion 122 may be formed as illustrated in FIG. 23A. The heights of the first protruding portion 121 and the second protruding portion 122 illustrated in FIG. 23A are the same as the height of the end surface (the end surface including the first end side 20m and the second end side 20n) of the circuit sheet 20. FIG. 23B illustrates the cross-sectional shape of the molded article 1 corresponding to the portion illustrated in FIG. 23A.

(4) Modification Examples (4-1) Modification Example A

As illustrated in FIG. 17B of the first embodiment, in the second portion Pa2 in the first mold 101, the first region AR1 of the second main surface 22 of the circuit sheet 20 is supported to the plateau portion 110 of the first mold 101. However, in the second portion Pa2 of the first mold 101, the first mold 101 configured such that the circuit sheet 20 is not supported by the plateau portion 110 may be used.

With reference to FIGS. 24 to 27, the configuration of the first mold 101 configured such that the circuit sheet 20 is not supported by the plateau portion 110 will be described. The molded article 1 molded with the first mold 101 and the second mold 102 illustrated in FIGS. 24 to 27 will be described with reference to FIGS. 28 to 30.

Figure 24:
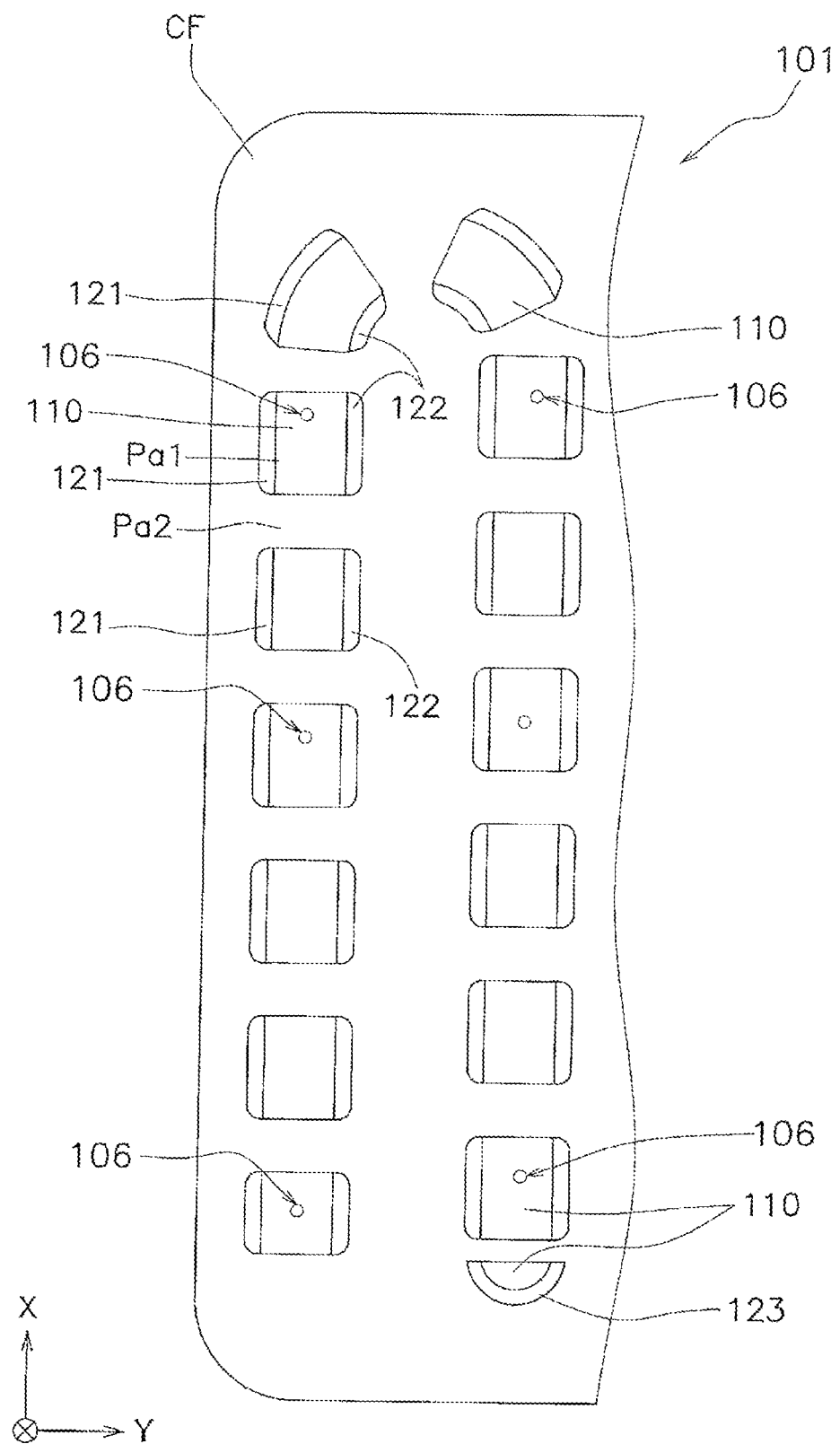
FIG. 24 is a partially enlarged plan view illustrating a part of the first mold.
Figure 25:
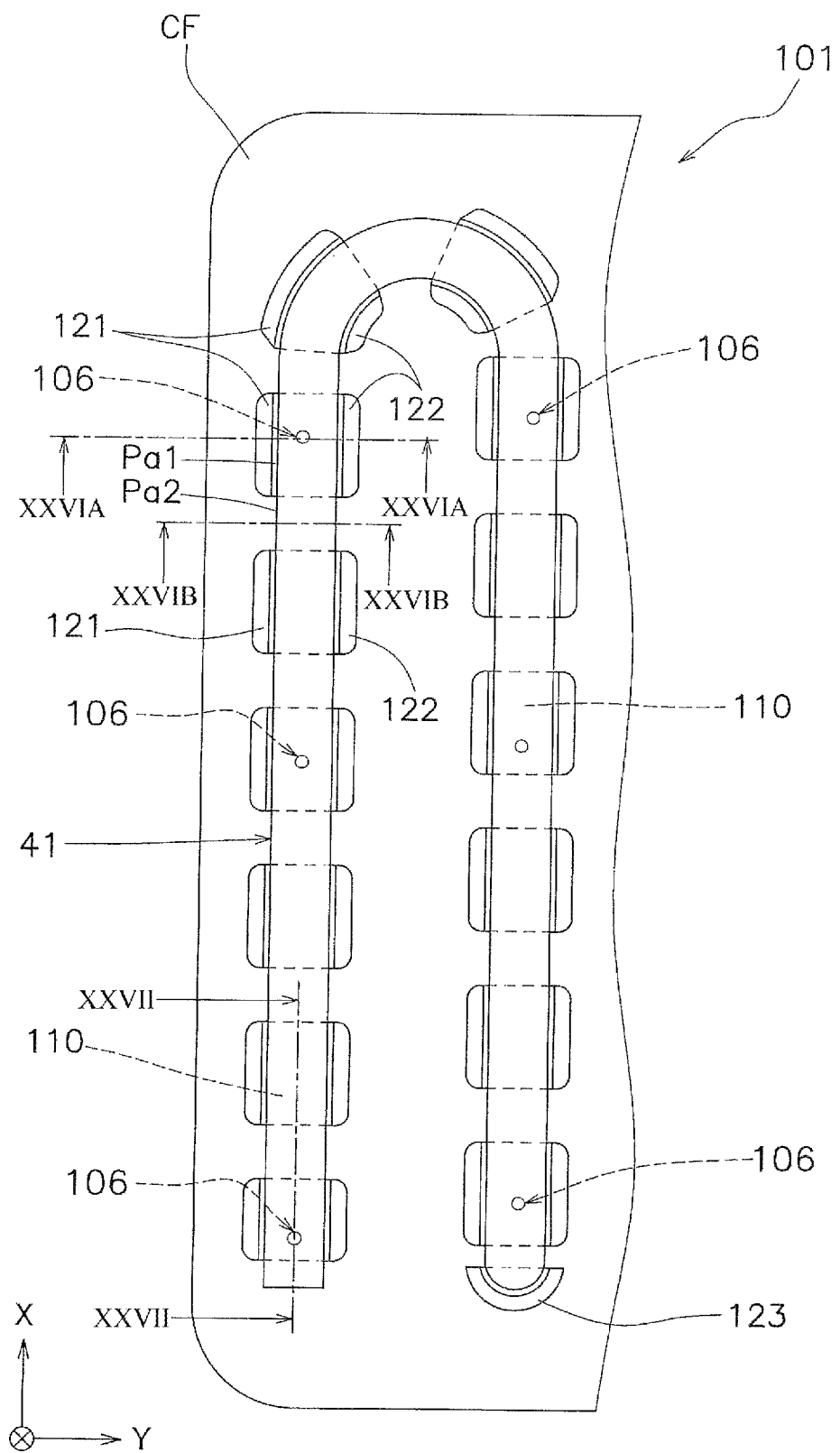
FIG. 25 is a partially enlarged plan view illustrating a part of the first mold and the circuit sheet.
Figure 26A:
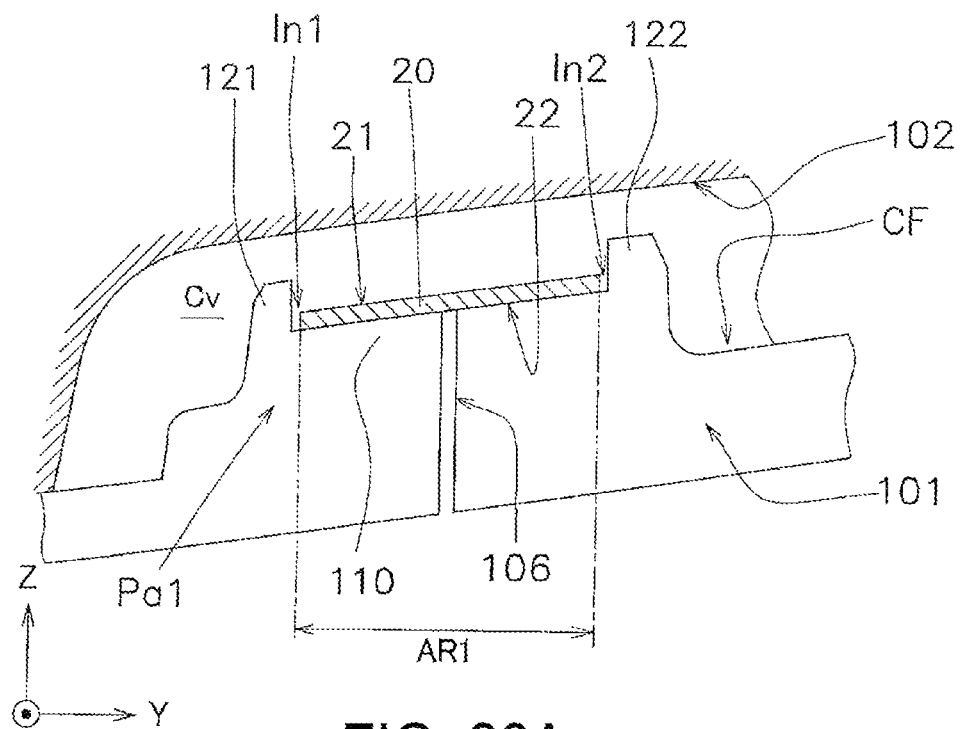
FIG. 26A is a partially enlarged cross-sectional view of the first mold, the second mold, and the circuit sheet cut at a position along the line XXVIA-XXVIA in FIG. 25.
Figure 26B:
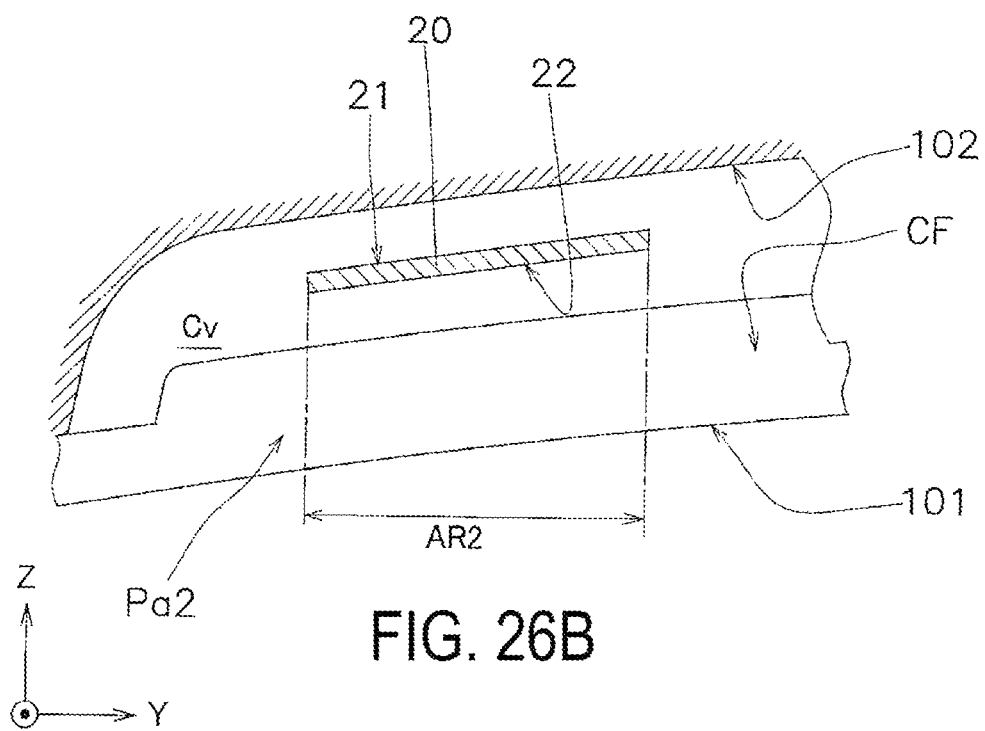
FIG. 26B is a partially enlarged cross-sectional view of the first mold, the second mold, and the circuit sheet cut at a position along the line XXVIB-XXVIB in FIG. 25.
Figure 27:
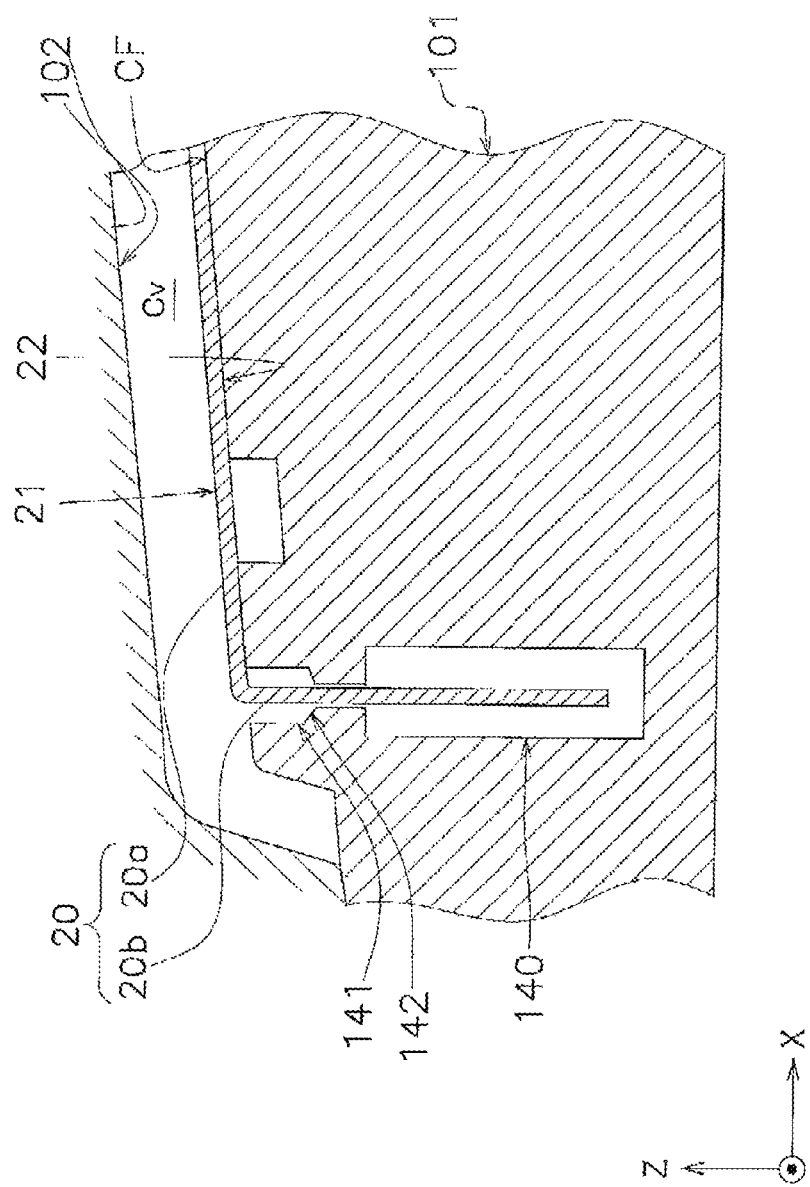
FIG. 27 is a partially enlarged cross-sectional view of the first mold, the second mold, and the circuit sheet cut at a position along the line XXVII-XXVII in FIG. 25.

The setting of the circuit sheet 20 to the first mold 101 in Step S1 (first step) of FIG. 11 will be described in more detail. FIGS. 24 and 25 illustrate a part of the enlarged first mold 101 illustrated in FIG. 10. In FIG. 25, the core surface CF of the first mold 101 and the circuit sheet 20 constituting the antenna 41 set on the core surface CF are enlarged. FIG. 26A illustrates an enlarged cross-sectional shape of the first mold 101 and the second mold 102 in the clamped state and the circuit sheet 20 cut along the line XXVIA-XXVIA in FIG. 25. FIG. 26B illustrates an enlarged cross-sectional shape of the first mold 101 and the second mold 102 in the clamped state and the circuit sheet 20 cut along the line XXVIB-XXVIB in FIG. 25. FIG. 27 illustrates an enlarged cross-sectional shape of the first mold 101 and the second mold 102 in the clamped state and the circuit sheet 20 cut along the line XXVII-XXVII in FIG. 25.

As illustrated in FIG. 26A, the first mold 101 has the plateau portion 110 on the core surface CF. However, as illustrated in FIG. 26B, the first mold 101 does not include the plateau portion 110 in the second portion Pa2, and thus the circuit sheet 20 is not supported. The second portion Pa2 is a portion that divides the plateau portion 110. In other words, the plateau portion 110 is divided by the second portion Pa2. Further, it can be reworded that the plateau portion 110 has the two divided portions of the plateau portions 110 on both sides of the second portion Pa.

In FIGS. 26A and 26B, hatching indicating the cross section of the first mold 101 is omitted to avoid the drawings being difficult to be seen. In the first portion Pa1 of the first mold 101, a part of the second main surface 22 of the circuit sheet 20 is in contact with the plateau portion 110. A part of the second main surface 22 in contact with the plateau portion 110 is the first region AR1. In the second portion Pa2 of the first mold 101, a part of the second main surface 22 of the circuit sheet 20 is not in contact with the plateau portion 110. A part of the second main surface 22 not in contact with the plateau portion 110 is the second region AR2. As can be seen from FIG. 26B, the circuit sheet 20 is laid across the divided portions of the plateau portions 110 adjacent to one another so as not to contact the first mold 101 in the second portion Pa2. In other words, the circuit sheet 20 is in a state of floating in the second portion Pa2 in the cavity Cv.

The first protruding portion 121 and the second protruding portion 122 are provided along the plateau portion 110. As illustrated in FIG. 26A, in the first portion Pa1, a groove portion is not formed between the first protruding portion 121 and the plateau portion 110 or between the second protruding portion 122 and the plateau portion 110. As illustrated in FIG. 25, the third protruding portion 123 is provided at one end portion of the plateau portion 110. As illustrated in FIG. 27, in the state where the circuit sheet 20 is set in the first mold 101, the lead portion 20b of the circuit sheet 20 is inserted into the opening 141, the slit 143, and the accommodating portion 140. The tapered portion 142 extending from the opening 141 to the slit 143 is provided to easily guide the lead portion 20b to the slit 143.

In Step S2 (second step) of FIG. 11, as illustrated in FIGS. 26A and 26B, the first mold 101 and the second mold 102 are clamped such that the circuit sheet 20 is not in contact with the second mold 102. In Step S3 (third step) of FIG. 11, the molten resin is injected into the cavity Cv, and comes into contact with the first main surface 21 and the second regions AR2 of the second main surface 22 of the circuit sheet 20. Further, in Step S4 (fourth step), the molten resin is cooled and solidified to form the molded article 1 made of resin having the outer surface 11 opposed to the first main surface 21 of the circuit sheet 20 and the inner surface 12 opposed to the second regions AR2 of the second main surface 22 (see FIGS. 29A to 29C). In Step S5 (fifth step), the first mold 101 and the second mold 102 are opened to take out the molded article 1.

Figure 28:
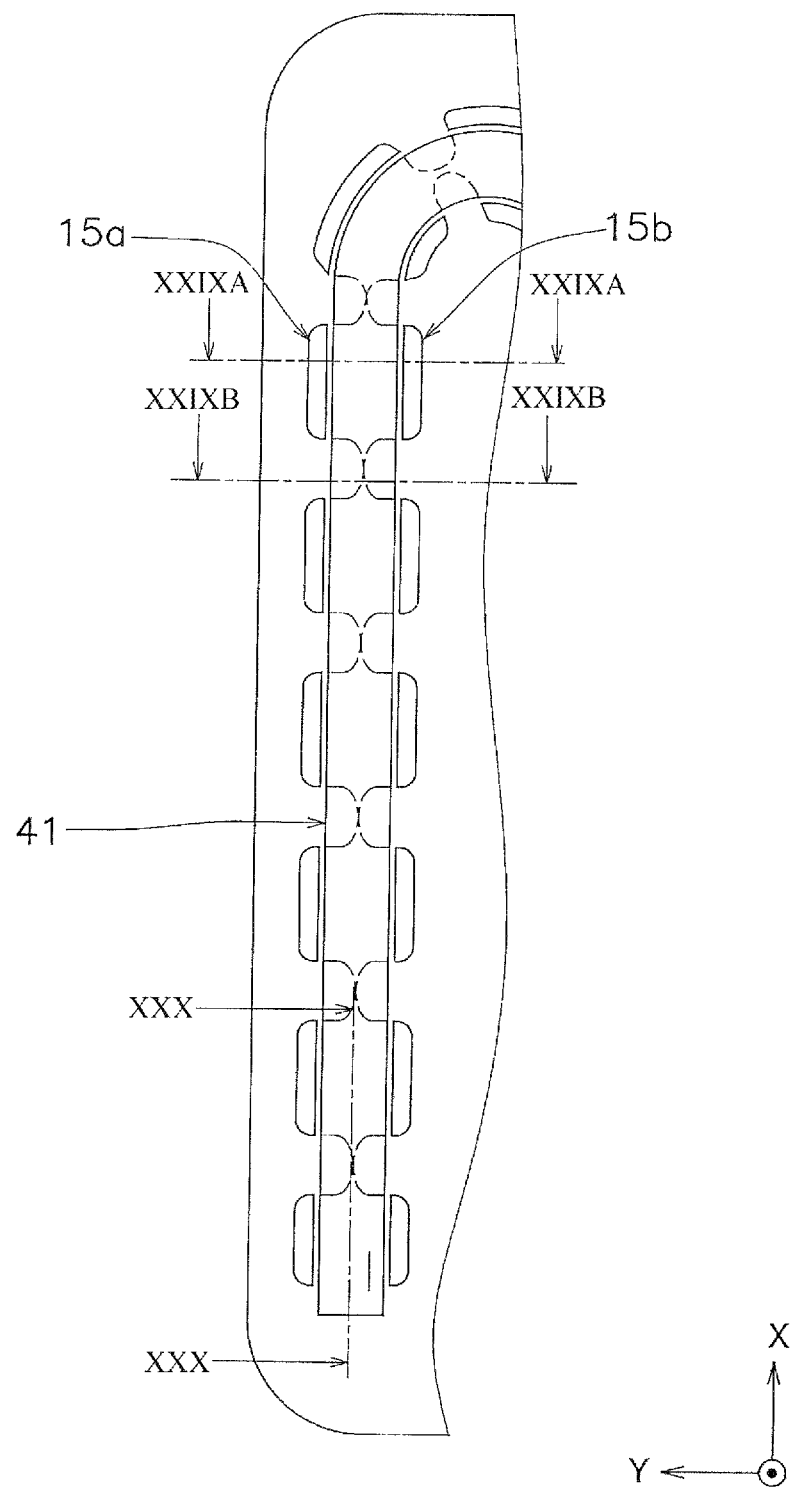
FIG. 28 is a partially enlarged bottom view in which a part of the molded article is enlarged
Figure 29A:
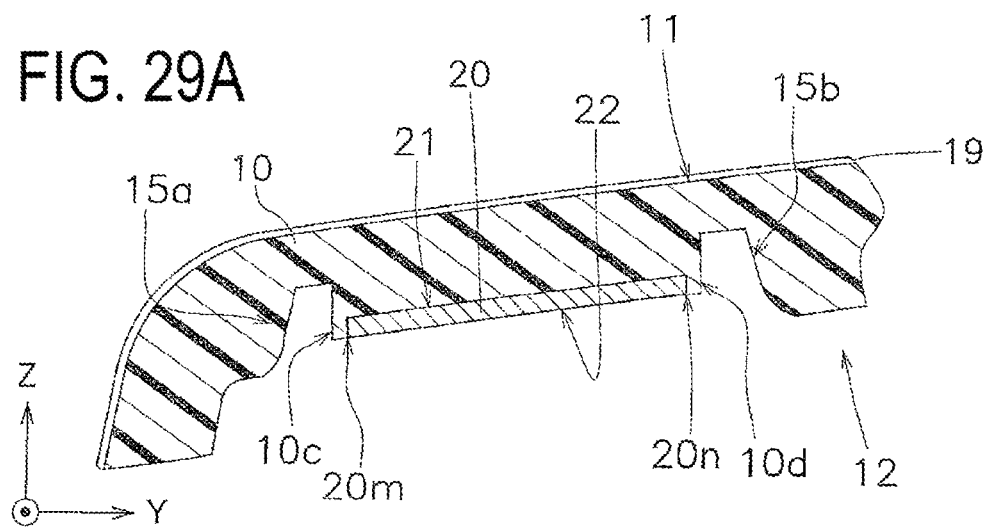
FIG. 29A is a partial cross-sectional view of the molded article cut along the line XXIXA-XXIXA in FIG. 28, and FIGS. 29B and 29C are partial cross-sectional views of the molded article cut along the line XXIXB-XXIXB in FIG. 28.
Figure 29B:
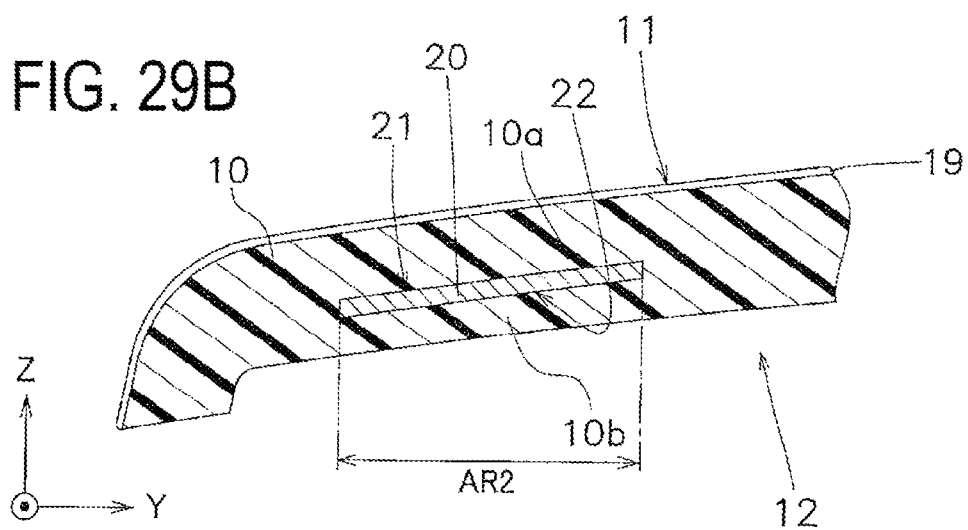
Figure 29C:
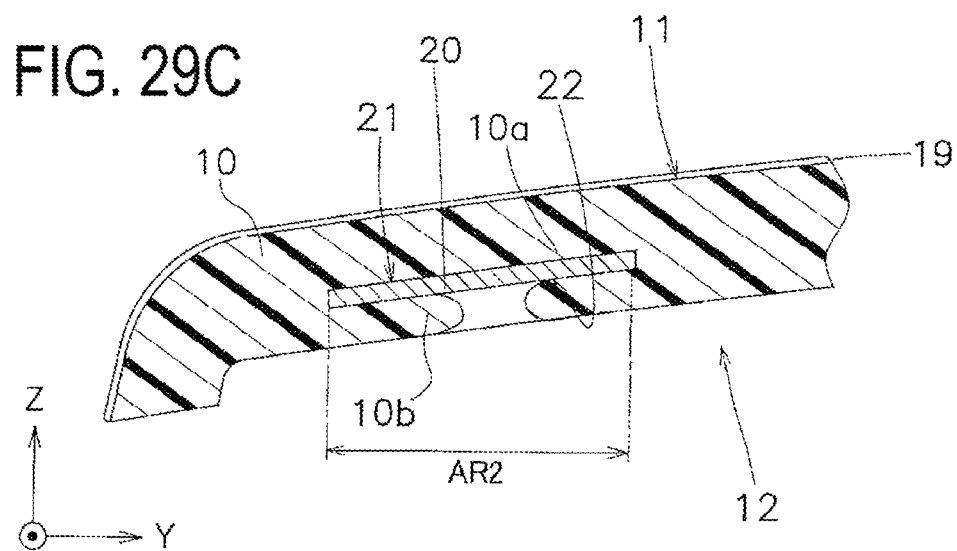
Figure 30:
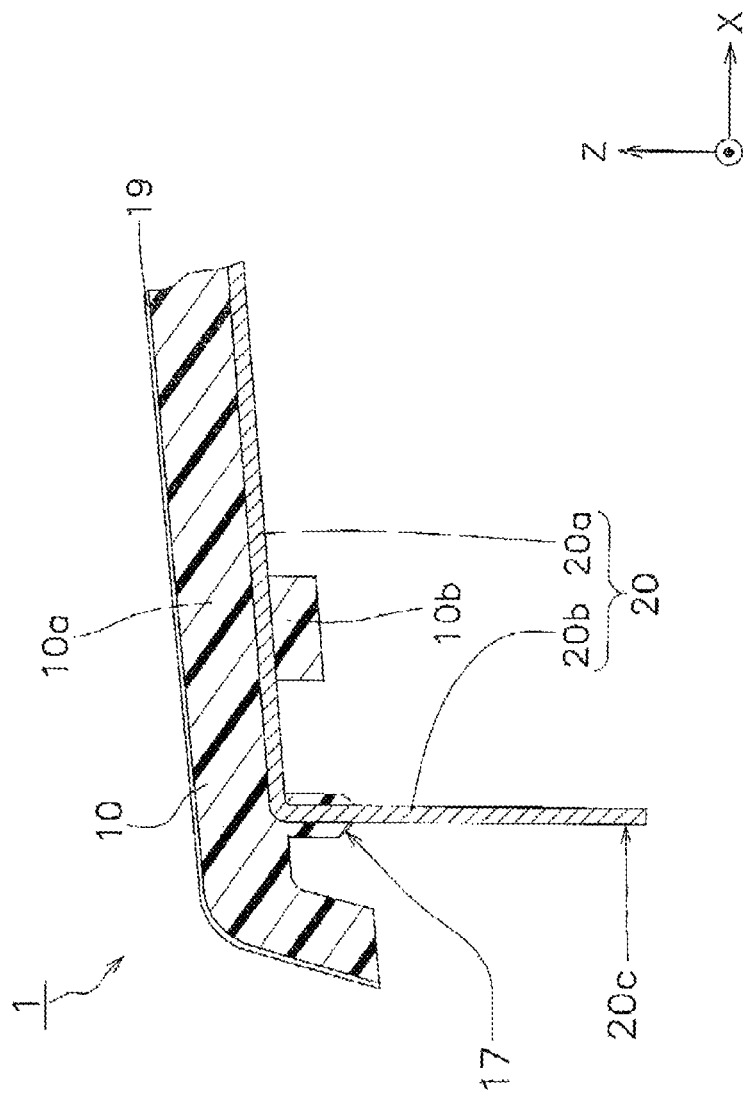
FIG. 30 is a partial cross-sectional view of the molded article cut along the line XXX-XXX in FIG. 28.

As illustrated in FIGS. 25 to 27, the molded article 1 molded using the antenna 41 set in the first mold 101 and the second mold 102 is illustrated in FIGS. 28 to 30. FIG. 29A illustrates an enlarged cross-sectional shape of the molded article 1 cut along the line XXIXA-XXIXA in FIG. 28. FIGS. 29B and 29C illustrate an enlarged cross-sectional shape of the molded articles 1 cut along the line XXIXB-XXIXB in FIG. 28. FIG. 30 illustrates an enlarged cross-sectional shape of the molded article 1 cut along the line XXX-XXX in FIG. 28.

Neither the first protruding portion 121 nor the second protruding portion 122 is provided along the plateau portion 110 on the second portion Pa2 of the first mold 101. Further, the plateau portion 110 is not provided on the second portion Pa2. Therefore, as illustrated in FIG. 29B or 29C, in the second portion Pa2 where the plateau portion 110, the first protruding portion 121, or the second protruding portion 122 is not provided, the resin 10a and the resin supporting portion 10b of the molded body 10 are arranged so as to surround the first main surface 21 and the second main surface 22 of the circuit sheet 20. FIGS. 29B and 29C differ in the shape of the resin supporting portion 10b in contact with the second main surface 22 of the circuit sheet 20. The difference in the state of the resin supporting portion 10b is caused by, for example, a difference in the timing and the flow rate at which the injection-molded molten resin enters from both sides of the second region AR2. When the molten resin flowing from one side of the circuit sheet 20 and the molten resin flowing from the other side are joined together, the resin supporting portion 10b connected from one side to the other side of the circuit sheet 20 on the second main surface 22 side is formed (see FIG. 29B). Further, when the injection is finished before the molten resins flowing from both sides of the circuit sheet 20 are joined together, the resin remains to be not filled in the vicinity of the center as illustrated in FIG. 29C. Since the circuit sheet 20 is sandwiched between the resin supporting portions 10b in contact with the second regions AR2 of the second main surface 22 and the resin 10a in contact with the first main surface 21 opposed to the second regions AR2, the circuit sheet 20 is firmly fixed by the resin 10a on the first main surface 21 side and the resin supporting portions 10b on the second main surface 22 side between which the circuit sheet 20 is sandwiched.

The recessed portions 15a and 15b illustrated in FIG. 29A are recesses formed when the first protruding portion 121 and the second protruding portion 122 illustrated in FIG. 26A come off. As illustrated in FIG. 26A, the gap In1 is provided between the circuit sheet 20 and the first protruding portion 121. Similarly, the gap In2 is provided between the circuit sheet 20 and the second protruding portion 122. The molten resin also enters the gaps In1 and In2 to arrange the resin side walls 10c and 10d outside the first end side 20m and the second end side 20n of the circuit sheet 20. The side walls 10c and 10d arranged on both sides of the circuit sheet 20 strengthen the fixation of the circuit sheet 20. As illustrated in FIG. 30, the resin does not bond to the connecting portion 20c of the circuit sheet 20. The portions denoted by the same reference numerals as the reference numerals illustrated in FIGS. 18A and 18B have the same configurations as the portions with the same reference numerals in FIGS. 18A and 18B, and thus description thereof will be omitted. After molding the molded article 1, the connecting portion 20c made of a metal sheet may be deformed into a shape suitable for electrical connection by, for example, press working.

(4-2) Modification Example B

In the first portion Pa1 of the first mold 101 illustrated in FIG. 13 of the embodiment and FIG. 16 of Modification Example A, the first protruding portion 121 and the second protruding portion 122 are provided along the plateau portion 110. However, the first protruding portion 121 or the second protruding portion 122 may be provided on one side of the plateau portion 110 in the first portion Pa1 of the first mold 101. It is only necessary that the first protruding portion 121 or the second protruding portion 122 is provided at any position, and the first protruding portion 121 and the second protruding portion 122 need not be provided regularly.

Figure 31:
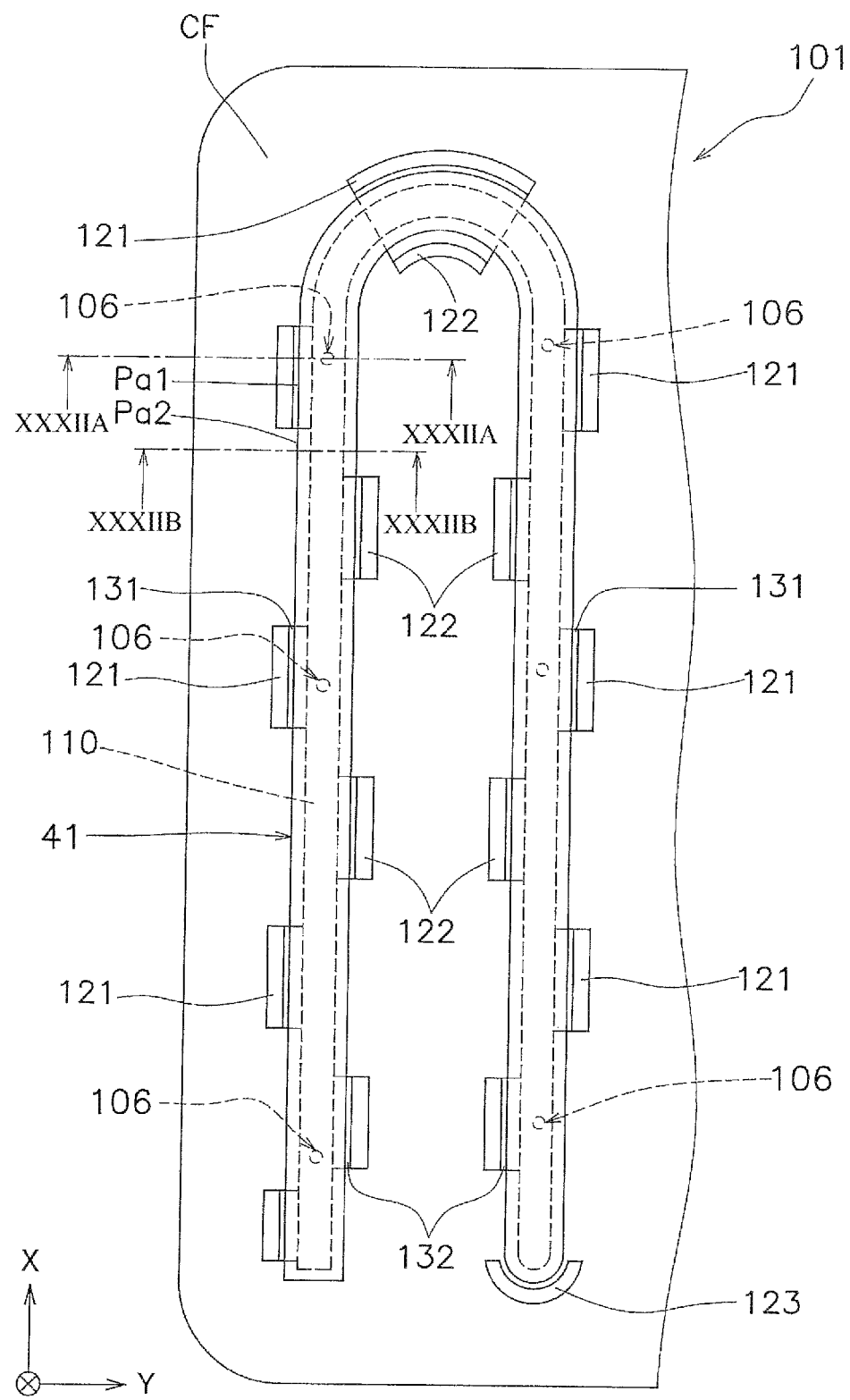
FIG. 31 is a partially enlarged plan view illustrating a part of the first mold and the circuit sheet.
Figure 32A:
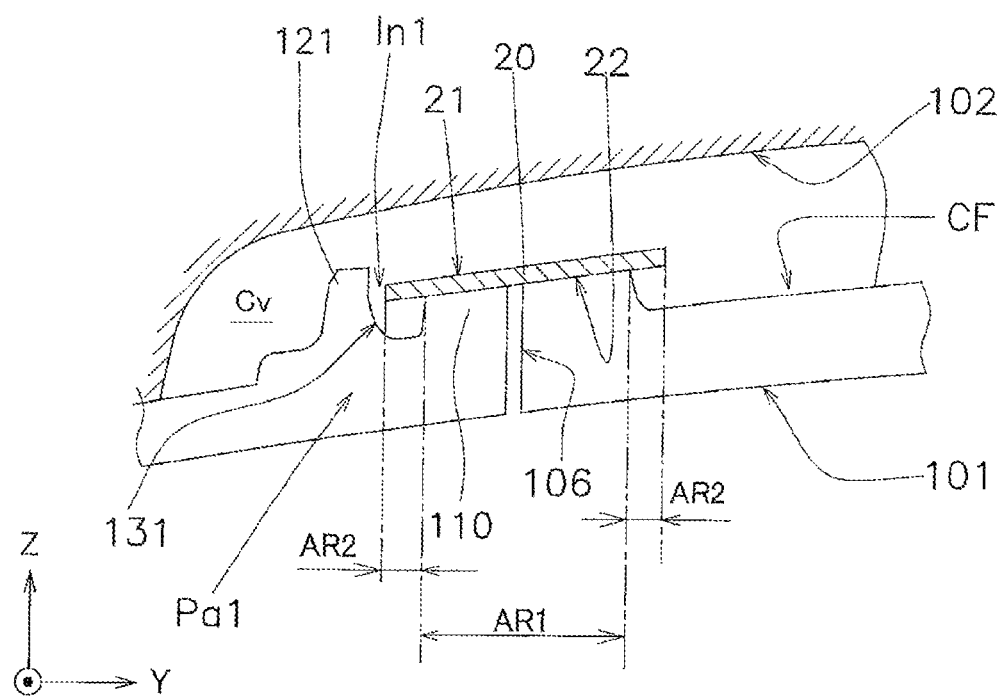
FIG. 32A is a partially enlarged cross-sectional view of the first mold, the second mold, and the circuit sheet cut at a position along the line XXXIIA-XXXIIA in FIG. 31.
Figure 32B:
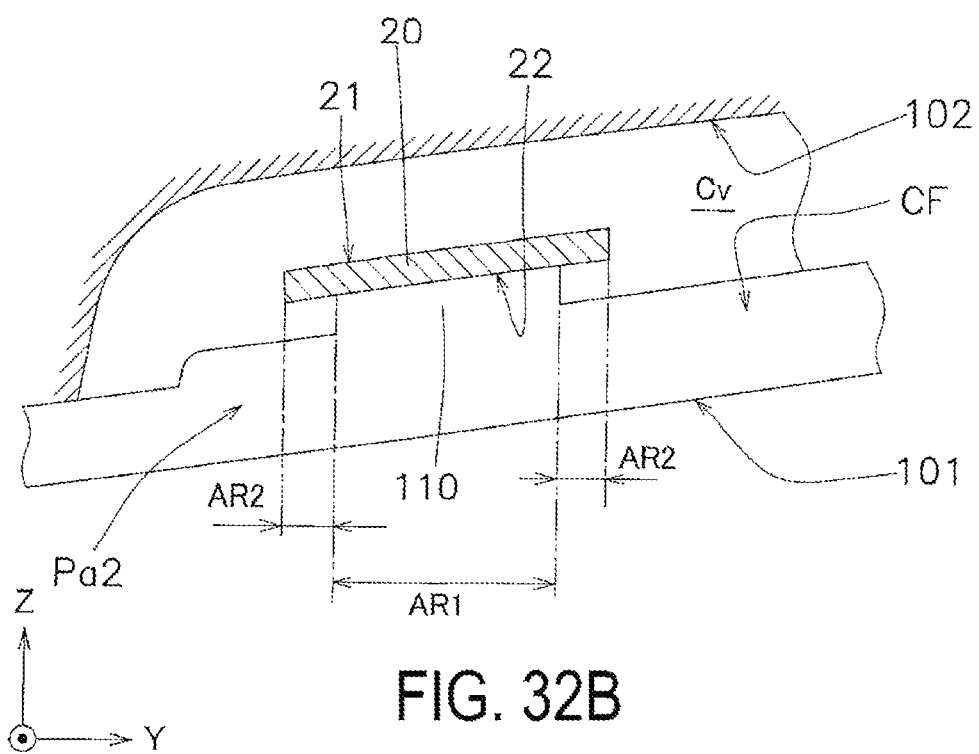
FIG. 32B is a partially enlarged cross-sectional view of the first mold, the second mold, and the circuit sheet cut at a position along the line XXXIIB-XXXIIB in FIG. 31.
Figure 33:
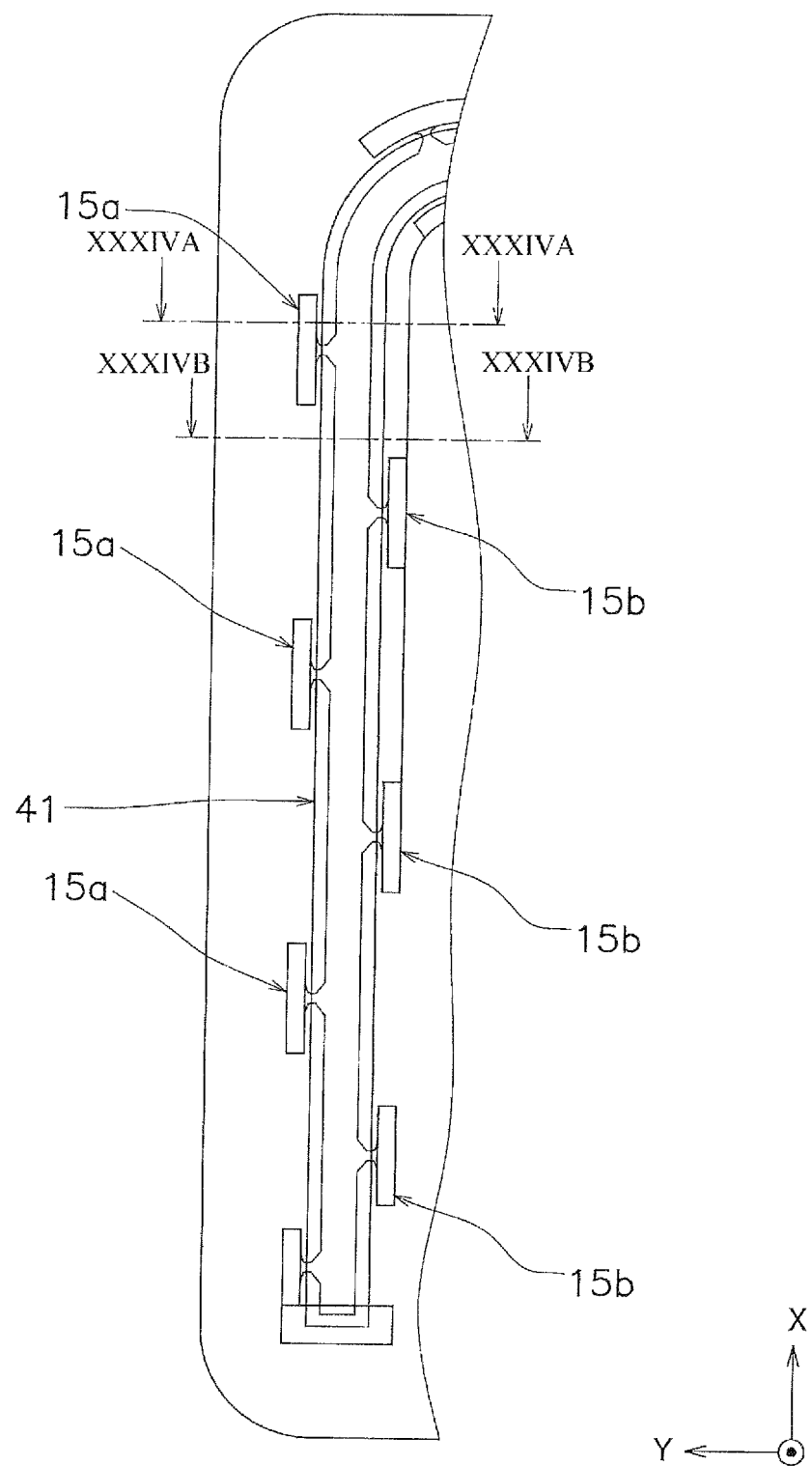
FIG. 33 is a partially enlarged bottom view in which a part of the molded article is enlarged.
Figure 34A:
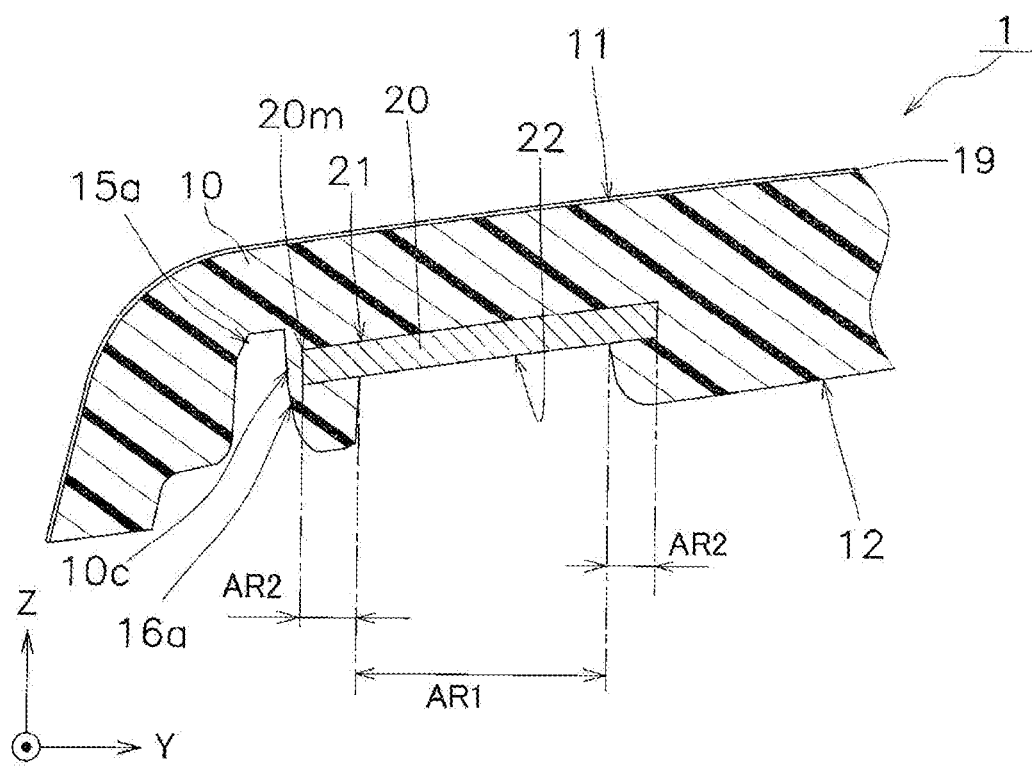
FIG. 34A is a partial cross-sectional view of the molded article cut along the line XXXIVA-XXXIVA in FIG. 33.
Figure 34B:
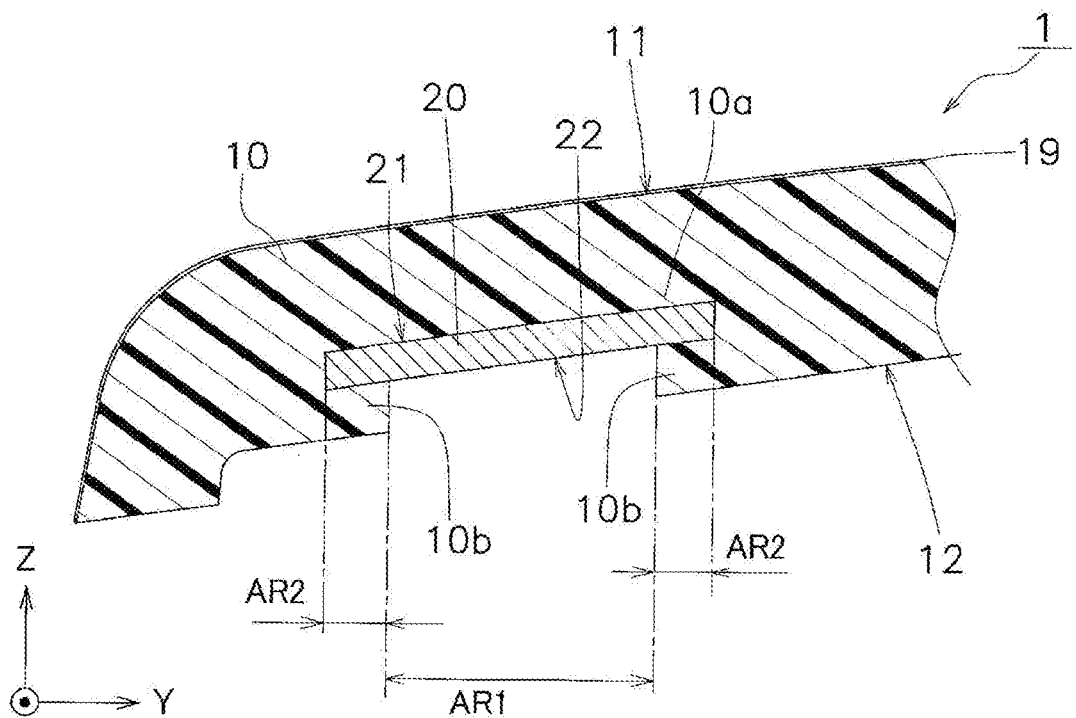
FIG. 34B is a partial cross-sectional view of the molded article cut along the line XXXIVB-XXXIVB in FIG. 33.

FIGS. 31, 32A and 32B illustrate the configuration of the first mold 101 in which the first protruding portion 121 or the second protruding portion 122 is provided on one side of the plateau portion 110. FIGS. 33, 34A, and 34B illustrate the molded article 1 molded with the first mold 101 and the second mold 102 illustrated in FIGS. 31 to 32B.

In FIG. 31, the core surface CF of the first mold 101 and the circuit sheet 20 constituting the antenna 41 set on the core surface CF are enlarged. FIG. 32A illustrates an enlarged cross-sectional shape of the first mold 101 and the second mold 102 in the clamped state and the circuit sheet 20 cut along the line XXXIIA-XXXIIA in FIG. 31. FIG. 32B illustrates an enlarged cross-sectional shape of the first mold 101 and the second mold 102 in the clamped state and the circuit sheet 20 cut along the line XXXIIB-XXXIIB in FIG. 31.

Among the configurations illustrated in FIGS. 31 to 32B, the same configurations as those illustrated in FIGS. 13 to 15B are denoted by the same reference numerals, and description thereof is omitted. As illustrated in FIG. 31, the first protruding portions 121 and the second protruding portions 122 are alternately arranged so as not to be opposed to one another. As can be seen from the comparison between FIGS. 32A and 14A, in the first portion Pa1, the first protruding portion 121 is arranged on one side of the plateau portion 110 of Modification Example B, and the second protruding portion 122 is not arranged on the opposite side. In the second portion Pa2, the configuration of FIG. 32B is the same as the configuration of FIG. 14B.

FIGS. 33, 34A, and 34B illustrate the molded article 1 molded using the antenna 41 set in the first mold 101 and the second mold 102 is illustrated in FIGS. 31 to 32B. FIG. 34A illustrates an enlarged cross-sectional shape of the molded article 1 cut along the line XXXIVA-XXXIVA in FIG. 33. FIG. 34B illustrates an enlarged cross-sectional shape of the molded article 1 cut along the line XXXIVB-XXXIVB in FIG. 33.

Among the configurations illustrated in FIGS. 33 to 34B, the same configurations as those illustrated in FIGS. 16 to 18B are denoted by the same reference numerals, and description thereof is omitted. As illustrated in FIG. 33, the recessed portions 15a and the recessed portions 15b are alternately arranged so as not to be opposed to one another. In Modification Example B, the ribs 16a and the ribs 16b are also alternately arranged so as not to be opposed to one another. As can be seen from the comparison between FIGS. 34A and 14A, in the first portion Pa1, the rib 16a is arranged on one side of the circuit sheet 20 of Modification Example B, and the rib 16b is not arranged on the portion corresponding to the rib 16a on the opposite side of the circuit sheet 20. In the second portion Pa2, the configuration of FIG. 34B is the same as the configuration of FIG. 14B.

In Modification Example B, the case in which the groove portions 131 and 132 are provided has been described. However, in the first mold 101 of Modification Example B, it may be configured such that the groove portion 131 or 132 is not formed.

(4-3) Modification Example C

Figure 35A:
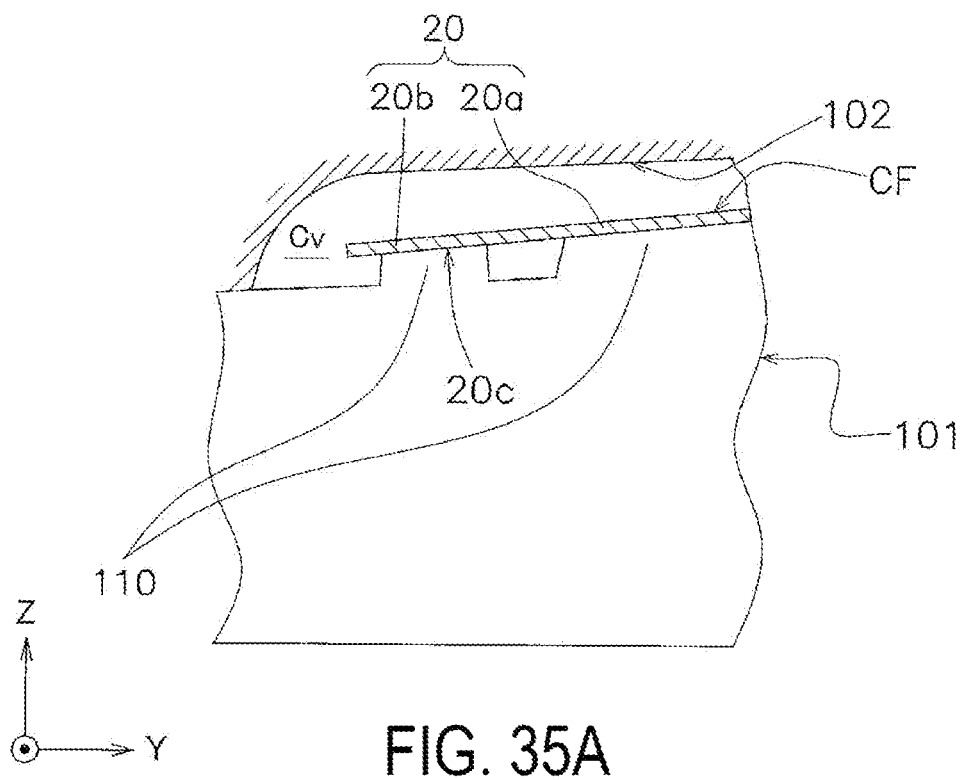
FIG. 35A is a partially enlarged cross-sectional view of a first mold, a second mold, and a circuit sheet according to Modification Example C.
Figure 35B:
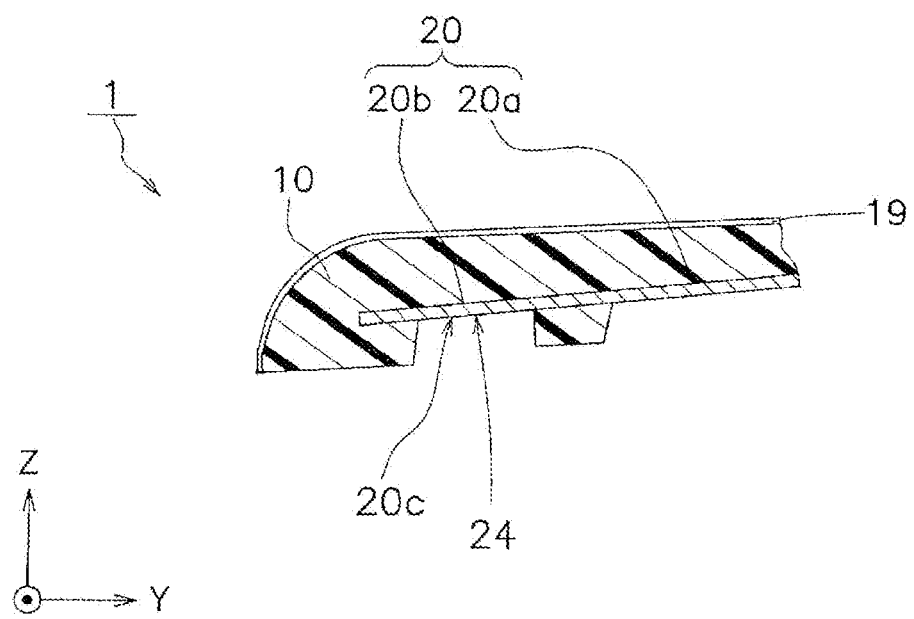
FIG. 35B is a partially enlarged cross-sectional view in which a part of the molded article according to Modification Example C is enlarged.

In the embodiment, Modification Example A, and Modification Example B, the case in which the lead portion 20b of the circuit sheet 20 is bent toward the inner surface 12 side of the molded body 10 and the connecting portion 20c is drawn out of the molded body 10 has been described. However, the connecting portion 20c of the circuit sheet 20 may be arranged in the molded body 10. FIG. 35A illustrates the cross section of the first mold 101 and the second mold 102 when the connecting portion 20c is arranged in the molded body 10. In Modification Example C, the connecting portion 20c is arranged in contact with the plateau portion 110. By injecting the molten resin into the cavity Cv of the first mold 101 and the second mold 102 as in FIG. 35A, as illustrated in FIG. 35B, an inner surface exposed portion 24 can be formed at any portion of the connecting portion 20c arranged on the inner surface 12 side of the molded body 10. For electrical connection with the circuit sheet 20 having the inner surface exposed portion 24, electrical connection can be performed by, for example, bringing a pogo pin or a leaf spring terminal installed on a mating substrate into contact with the inner surface exposed portion 24, or a flexible terminal member may be connected with a conductive adhesive or solder as necessary.

(4-4) Modification Example D

In the embodiment and Modification Examples A to C, a movable portion is not provided in the first mold 101 or the second mold 102, but the movable portion may be provided in at least one of the first mold 101 and the second mold 102. For example, a sliding block connected to a hydraulic or pneumatic cylinder and can be driven at any timing even during clamping may be provided at a position where the high-function electronic component 53 illustrated in FIG. 8 is arranged.

Figure 36A:
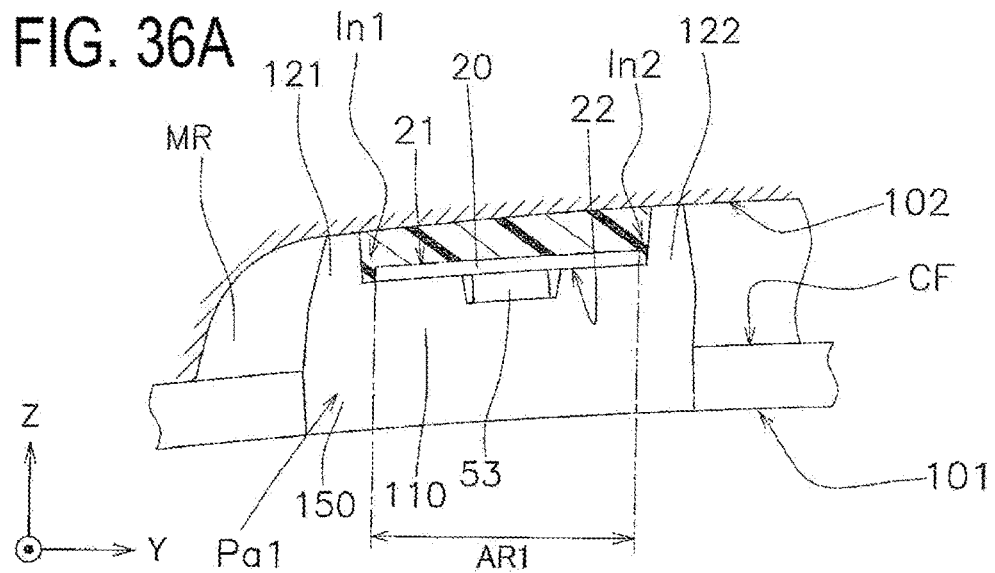
FIGS. 36A and 36B are partially enlarged cross-sectional views of a first mold, a second mold, and a circuit sheet according to Modification Example D.
Figure 36B:
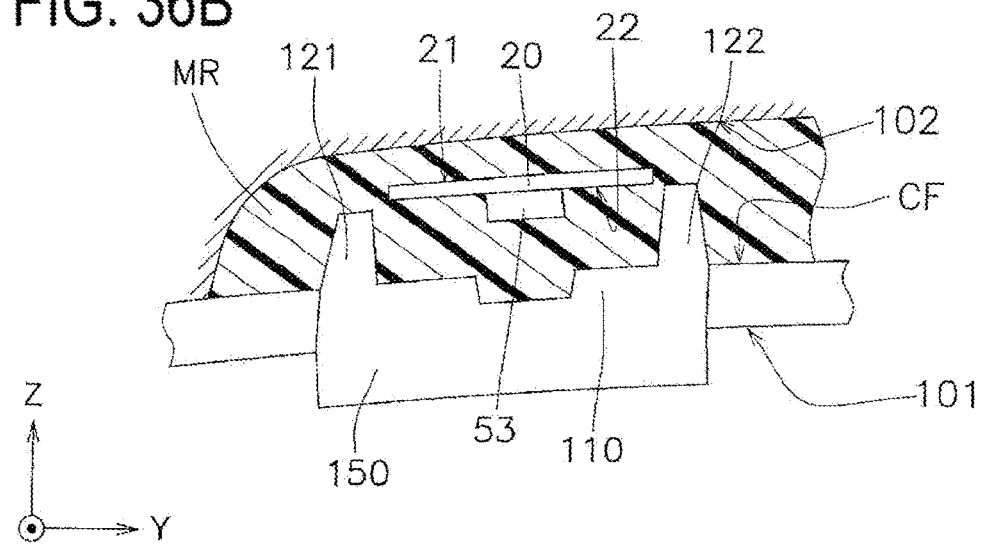
Figure 36C:
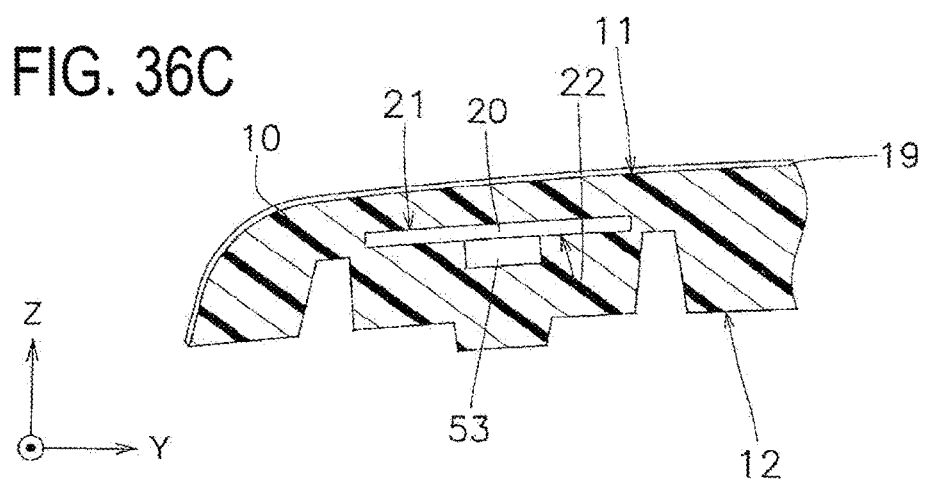
FIG. 36C is a partially enlarged cross-sectional view in which a part of the molded article according to Modification Example D cut at a position along the line XXXVI-XXXVI in FIG. 8 is enlarged.

FIGS. 36A and 36B illustrate an enlarged cross-sectional shape of the first mold 101 and the second mold 102 in the clamped state and the circuit sheet 20 cut along the line XXXVI-XXXVI in FIG. 8. FIG. 36A illustrates a state in which a sliding block 150 is pressed against the second mold 102. FIG. 36B illustrates a state in which the sliding block 150 is separated from the second mold 102. FIG. 36C illustrates an enlarged cross-sectional shape of the molded article 1 cut along the line XXXVI-XXXVI in FIG. 8.

As illustrated in FIGS. 36A and 36B, the first protruding portion 121 and the second protruding portion 122 of the first mold 101 and the plateau portion 110 are formed on the sliding block 150. In Step S3 (third step) of FIG. 11 after the clamping, as illustrated in FIG. 36A, molten resin MR is injected before the sliding block 150 is moved backward. At this time, the second main surface 22 of the circuit sheet 20 is in contact with the plateau portion 110 of the first mold 101. In the first portion Pa1 of the first mold 101, since the circuit sheet 20 is located between the first protruding portion 121 and the second protruding portion 122 during injection in FIG. 36A, the circuit sheet 20 is less likely to be displaced even when receiving a force from the molten resins MR.

When the molten resin MR injected when the sliding block 150 is in the state illustrated in FIG. 36A becomes solidified, the sliding block 150 moves. When the sliding block 150 is moved to the position illustrated in FIG. 36B, the cavity Cv is formed in the place where the first protruding portion 121, the second protruding portion 122, and the plateau portion 110 were present before the movement of the sliding block 150. FIG. 36B illustrates a state in which the molten resin has been injected into the cavity Cv formed by the movement of the sliding block 150.

Before the sliding block 150 is slid, displacement of the circuit sheet 20 during injection molding is suppressed with the first protruding portion 121, the second protruding portion 122, and the plateau portion 110. After the sliding block 150 is slid, the molten resin enters the place where the first protruding portion 121, the second protruding portion 122, and the plateau portion 110 were present before the sliding. As a result, the high-function electronic component 53 is enclosed and embedded in the molded body 10.

Although FIGS. 36A and 36B illustrate only one set of the first protruding portion 121 and the second protruding portion 122, a plurality of the first protruding portions 121 and a plurality of the second protruding portions 122 may be formed on the sliding block 150. In addition, the plateau portion 110 formed on the sliding block 150 is not limited to the plateau portion 110 between a pair of the first protruding portion 121 and the second protruding portion 122. For example, the plateau portion 110 may be formed between a plurality of pairs of the first protruding portions 121 and the second protruding portions 122 on the sliding block 150. In addition, the plateau portion 110 of the second portion Pa2 of the first mold 101 may be formed on the sliding block 150.

(4-5) Modification Example E

Figure 37A:
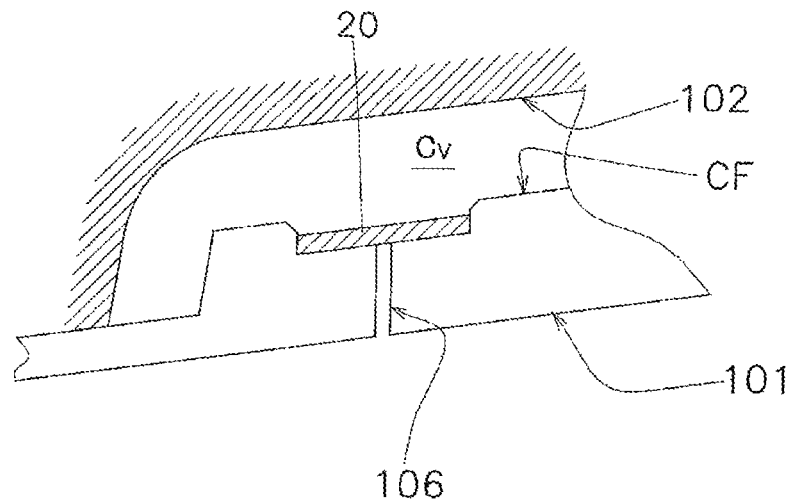
FIG. 37A is a partially enlarged cross-sectional view in which a first mold, a second mold, and a circuit sheet according to Modification Example E are cut at one position.
Figure 37B:
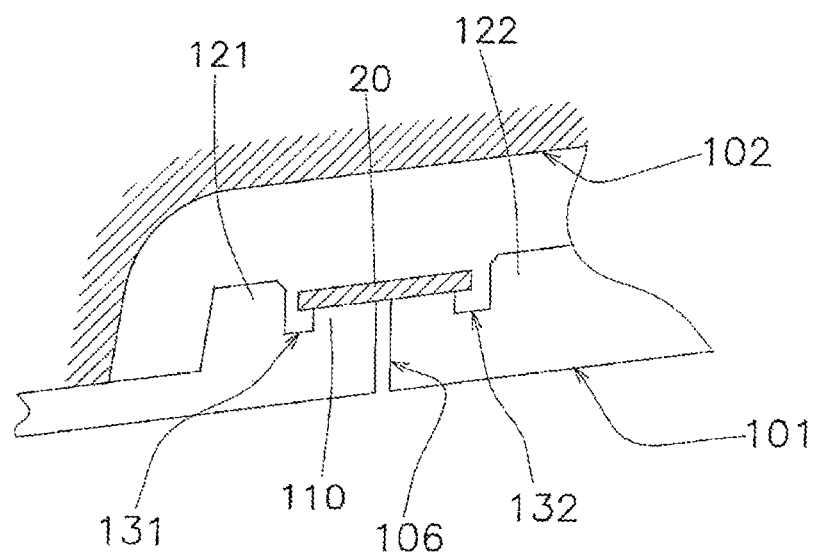
FIG. 37B is a partially enlarged cross-sectional view in which the first mold, the second mold, and the circuit sheet according to Modification Example E are cut at another position.
Figure 38A:
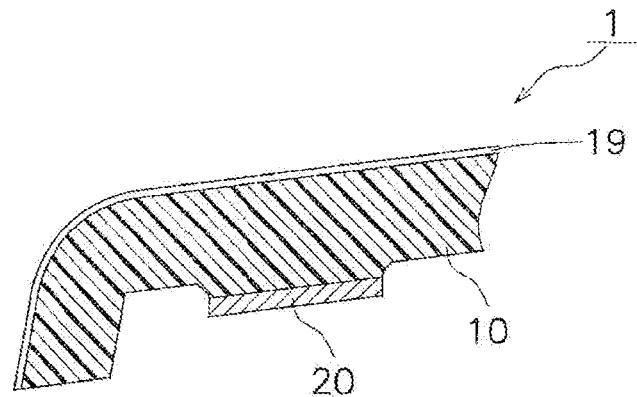
FIG. 38A is a cross-sectional view of the molded article according to Modification Example E cut at one position.
Figure 38B:
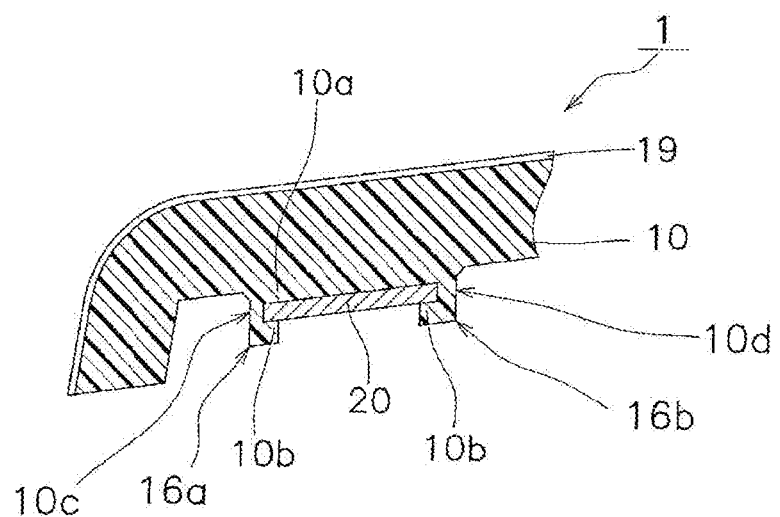
FIG. 38B is a cross-sectional view of the molded article according to Modification Example E cut at another position.

As illustrated in FIGS. 37A and 37B, the circuit sheet 20 may be inserted into a position lower than the core surface CF. FIGS. 38A and 38B illustrate the molded article 1 molded by inserting the circuit sheet 20 into the position lower than the core surface CF. Note that portions of respective components of Modification Example E corresponding to the respective components of the embodiment are denoted by the same reference numerals, and description thereof is omitted. The heights of the first protruding portion 121 and the second protruding portion 122 illustrated in FIGS. 37A and 37B are the same as the height of the core surface CF. As illustrated in FIG. 38B, only the ribs 16a and 16b (resin supporting portions 10b) support the circuit sheet 20.

(4-6) Modification Example F

In the embodiment, the case where the decorative layer 19 is provided by transfer has been described, but the decorative layer may be provided by insert molding of a decorative film. Further, the decorative layer 19 need not be formed in the molded article 1.

(5) Features (5-1)

In the methods for manufacturing the molded articles 1 according to the embodiment and the modification examples, in Step S1 (first step) depicted in FIG. 11, for example, as illustrated in FIG. 14A, a first fixed portion of the circuit sheet 20 is arranged in the first portion Pa1 of the first mold 101. Further, in Step S1 of FIG. 11, for example, as illustrated in FIG. 14B, a second fixed portion of the circuit sheet 20 including the second region AR2 of the circuit sheet 20 is arranged in the second portion Pa2 of the first mold 101. The first fixed portion of the circuit sheet 20 is mainly a portion where the first main surface 21 is fixed, and is, for example, a portion along at least one of the recessed portions 15*a* and 15*b* as illustrated in FIG. 17A. On the other hand, the second fixed portion of the circuit sheet 20 is a portion where the first main surface 21 and the second main surface 22 are sandwiched and fixed by resins, and is a portion not along the recessed portion 15*a* or 15*b* as illustrated in FIG. 17B, for example. The first fixed portion of the circuit sheet 20 is the portion illustrated in FIGS. 21A, 26A, or 32A, and the second fixed portion of the circuit sheet 20 is the portion illustrated in FIGS. 21B, 26B, or 32B. At least a part of the first fixed portion of the circuit sheet 20 is arranged to be in contact with the plateau portion 110.

As described above, the molded article 1 including the circuit sheet 20 inserted into the resin can be manufactured by injecting the molten resin from the clamping of the first mold 101 and the second mold 102 until opening the molds. The molded article 1 including the circuit sheet 20 can be manufactured with one set of the first mold 101 and the second mold 102, and it is not necessary to use a plurality of assembled molds as in the conventional one, and thus it is possible to reduce the cost required for the molds. In addition, since it is not necessary to replace the mold and perform injection of molten resin by a plurality of times as in the conventional one, it is possible to reduce the time required for manufacturing one molded article 1 and to reduce the manufacturing cost.

In other words, the molded article 1 in which the circuit sheet 20 is fixed to the inside of the molded body 10 can be manufactured by one-time molding instead of two color molding, and the cost advantage is large. In addition, even when the molded body 10 has a curved shape, the circuit sheet 20 can be fixed to the inside of the molded body 10 by one molding.

Even when an adhesive layer having adhesiveness with molded resin is not provided in the circuit sheet 20, by the first main surface 21 and the second main surface 22 of the circuit sheet 20 being partially sandwiched between the molded resins, the circuit sheet 20 inserted into the molded body 10 can be fixed. Therefore, a material having extremely poor adhesiveness can be used for the base substrate 28 of the circuit sheet 20 and the molding resin.

In a case where the injection-molded resin shrinks in volume in the cooling process and the circuit sheet 20 hardly changes, when the circuit sheet 20 is firmly bonded by using an adhesive, deformation, such as warping or twisting of the molded body 10, occurs. At this time, since an internal stress against the contraction of the molding resin is generated in the circuit sheet 20, there is a case where the circuit sheet 20 is peeled off due to a change in environment, such as temperature and humidity, or an impact from the outside. However, in a case where an adhesive is not used, such a problem can be suppressed.

In the first mold 101, the first protruding portions 121, the second protruding portions 122, and the third protruding portion 123 are dividedly provided according to the planar shape of the circuit sheet 20 such that the circuit sheet 20 can be set at a predetermined position. Therefore, the circuit sheet 20 can be inserted and fixed at the predetermined position of the molded body 10 with high accuracy. When the air suction holes are further provided, the circuit sheet 20 can be fixed at the predetermined position of the molded body 10 after molding with further high accuracy by the effect of air suction. Although the case where the circuit sheet 20 has the planar shape is described here, the circuit sheet 20 may have a three-dimensional shape other than the planar shape. For example, the circuit sheet 20 may be curved. Even in such a case, in the first mold 101, the first protruding portions 121, the second protruding portions 122, and the third protruding portion 123 only need to be dividedly provided in accordance with the surface shape of the circuit sheet 20 such that the circuit sheet 20 can be set at the predetermined position.

For example, as illustrated in FIGS. 16, 17A, and 17B, the molded article 1 has a plurality of the resin supporting portions 10*b* extending from the periphery of the circuit sheet 20 while being in contact with the second main surface 22 over an entirety of the periphery of the circuit sheet 20. The molded article 1 has a plurality of the recessed portions 15*a*, 15*b*, and 15*c* arranged around the circuit sheet 20 over the entirety of the periphery of the circuit sheet 20. The plurality of resin supporting portions 10*b* and the plurality of recessed portions 15*a*, 15*b*, and 15*c* are arranged such that the resin supporting portions and the recessed portions are alternately arranged along the periphery of the circuit sheet 20. In the molded article 1, the first protruding portion 121, the second protruding portion 122, and the third protruding portion 123 formed in the first mold 101 for forming the recessed portions 15*a*, 15*b*, and 15*c* serve as barriers for preventing the molten resin from directly contacting the end surface of the circuit sheet 20 during manufacturing, and the molten resin flows into the groove portions 131 and 132 in a state of a pressure is dispersed and relaxed to form the resin supporting portions 10*b*. This reduces the displacement of the circuit sheet 20 in the molded body 10, and therefore the molded article with high accuracy of the arrangement position of the circuit sheet 20 can be provided.

(5-2)

For example, the second portion Pa2 of the first mold 101 described with reference to FIGS. 12 and 13 is a portion in which the width of the plateau portion 110 is narrower than the width of the circuit sheet 20. As can be seen from FIG. 12, in the configuration of the plateau portion 110 in this case, since the central portion of the plateau portion 110 is not divided, there is no portion that is deformed toward the second main surface 22 side by the pressure of the molten resin applied to the first main surface 21 of the circuit sheet 20. Therefore, in the manufacturing method using the first mold 101, the structure of the molded article 1 is simplified, and the molded article 1 is easily manufactured.

(5-3)

For example, the second portion Pa2 of the first mold 101 described with reference to FIG. 26B is a portion that divides the plateau portion 110. In Step S1 of FIG. 11, the circuit sheet 20 is laid across the divided portions of the plateau portions 110 adjacent to one another so as not to contact the first mold 101 in the second portion Pa2. In other words, the circuit sheet 20 is in a state of floating in the second portion Pa2. Therefore, in the second portion Pa2 of the first mold 101, the molten resin enters between the first mold 101 and the circuit sheet 20. As a result, as illustrated in FIG. 29A or 29B, the resin supporting portions 10b becomes large, and the circuit sheet 20 is firmly fixed in the molded article 1 by the large resin supporting portions 10b.

(5-4)

For example, in the first portion Pa1 of the first mold 101 described with reference to FIG. 14A, the groove portions 131 and 132 are formed between the first protruding portion 121 and the second protruding portion 122 and the plateau portion 110. The molten resin enters the groove portions 131 and 132 to the first mold 101. Accordingly, as described with reference to FIG. 17A, the ribs 16a and 16b are formed, and it is possible to increase the thicknesses of the resin supporting portions 10b in contact with the second regions AR2 of the circuit sheet 20 on both sides of the plateau portion 110. The thickened resins (for example, the ribs 16a and 16b) can improve the strength of the resins for fixing the circuit sheet 20.

(5-5)

For example, in the first mold 101 described with reference to FIG. 14A, the gaps In1 and In2 are formed between the first protruding portion 121 and the first end side 20m of the circuit sheet 20 and between the second protruding portion 122 and the second end side 20n of the circuit sheet 20. Therefore, the molten resins possibly enter between the gaps In1 and In2, and in this case, the support by the resins is strengthened at the end sides of the circuit sheet 20.

(5-6)

For example, in the first mold 101 described with reference to FIGS. 15A and 15B, the accommodating portion 140 into which the lead portion 20b of the circuit sheet 20 is inserted is formed. In Step S1 (first step) of FIG. 11, the lead portion 20b of the circuit sheet 20 is accommodated in the accommodating portion 140 of the first mold 101. In the molded article 1 manufactured in this way, as illustrated in FIG. 18B, the lead portion 20b of the circuit sheet 20 is drawn out to the inner surface 12 side of the molded article 1. As a result, it is possible to obtain the molded article 1 in which while the circuit sheet 20 is inserted into the molded body 10, the electrical connection between the circuit sheet 20 and a device outside the molded body 10 is easy.

(5-7)

For example, in the first mold 101 illustrated in FIG. 13, a plurality of sets of the first protruding portions 121 and the second protruding portions 122 are provided. In Step S1 (first step) of FIG. 11, the circuit sheets 20 are arranged between all of the plurality of pairs of the first protruding portions 121 and the second protruding portions 122. The plurality of sets of the first protruding portions 121 and the second protruding portions 122 make it difficult for the circuit sheets 20 to be displaced with respect to the first mold 101 when the molten resin is injected. By providing a plurality of sets of the first protruding portions 121 and the second protruding portions 122 in this manner, it is possible to suppress the circuit sheet 20 becoming largely displaced with respect to the first mold 101 and the molded article 1 becoming a defective product.

In particular, when the circuit sheet 20 is sucked and held by air suction, it is possible to reliably prevent the inserted circuit sheet 20 from being peeled off and detached from the first mold 101, to further reduce sheet displacement of the sheet of the circuit sheet 20, and to fix the circuit sheet 20 at a predetermined position of the molded body 10 with high accuracy.

Further, when the injection molding resin shrinks in volume in the cooling process and the circuit sheet 20 hardly changes, the circuit sheet 20 is warped by an amount corresponding to the amount of resin shrinkage. In the above-described method for manufacturing the molded article 1, the circuit sheet 20 is fixed at the large number of portions and the fixed portions are configured to be small areas as much as possible, and thus deformation of the circuit sheet 20 due to the warp can be uniformly dispersed.

(5-8)

In the first mold 101 described with reference to FIGS. 36A and 36B, the first protruding portion 121, the second protruding portion 122, and the plateau portion 110 are formed on the sliding block 150. By using the first mold 101 configured as described above, before the sliding block 150 is slid, the displacement of the circuit sheet 20 during injection molding can be suppressed with the first protruding portion 121, the second protruding portion 122, and the plateau portion 110. In addition, after the sliding block 150 is slid, the cavity Cv spreads and the molten resin enters the place where the first protruding portion 121, the second protruding portion 122, and the plateau portion 110 were present before the sliding. For example, as illustrated in FIG. 36C, the fixation of the circuit sheet 20 in the molded article 1 is strengthened with the resin entering the place where the first protruding portion 121, the second protruding portion 122, and the plateau portion 110 were present.

(5-9)

For example, the second portion Pa2 of the first mold 101 described with reference to FIG. 17B has the configuration in which neither the first protruding portion 121 nor the second protruding portion 122 is provided along the plateau portion 110. When the manufacturing is performed using the first mold 101 in which neither the first protruding portion 121 nor the second protruding portion 122 is provided along the plateau portion 110, in the second portion Pa2, the recessed portion caused by the first protruding portion 121 or the second protruding portion 122 is not formed outside the second region AR2 of the circuit sheet 20. Therefore, the strength of the portion where the circuit sheet 20 is sandwiched between the resin supporting portions 10b in contact with the second regions AR2 and the resin 10a in contact with the first main surface 21 opposed to the second region AR2 is higher than that of the portion where the recessed portions are formed. As a result, the circuit sheet 20 is firmly fixed with the resins 10a on the first main surface 21 side and the resin supporting portion 10b on the second main surface 22 side between which the circuit sheet 20 is sandwiched.

Although the embodiments of the present disclosure have been described above, the present disclosure is not limited to the embodiments, and various changes can be made without departing from the gist of the disclosure. In particular, the plurality of embodiments and modification examples described herein can be combined randomly with one another as necessary.

REFERENCE CHARACTER LIST

1 Molded article
10 Molded body
20 Circuit sheet
21 First main surface
22 Second main surface
101 First mold 102 Second mold
110 Plateau portion
121 First protruding portion
122 Second protruding portion
131, 132 Groove portion
140 Accommodating portion
150 Sliding block
AR1 First region
AR2 Second region
Cv Cavity
In1, In2 Gap
MR Molten Resin
Pa1 First portion
Pa2 Second portion

The invention claimed is:

1. A method for manufacturing a molded article, comprising:
   setting a circuit sheet including a first main surface, a second main surface opposed to the first main surface, and a conductive pattern in a first mold such that a first region of the second main surface of the circuit sheet contacts a plateau portion of the first mold and a second region of the second main surface of the circuit sheet does not contact the first mold;
   clamping a second mold to the first mold such that the circuit sheet does not contact the second mold to form a cavity where the first main surface and the second region of the second main surface of the circuit sheet are exposed;
   introducing a molten material into the cavity to bring the molten material into contact with the first main surface and the second region of the second main surface of the circuit sheet;
   cooling and solidifying the molten material to form a molded body made of resin having an outer surface opposed to the first main surface and an inner surface opposed to the second region of the second main surface of the circuit sheet; and
   opening the first mold and the second mold to take out the molded article, wherein
   in the setting step, a first fixed portion of the circuit sheet is arranged in a first portion of the first mold, and a second fixed portion of the circuit sheet including the second region is arranged in a second portion of the first mold,
   the first portion is a portion of the first mold including at least one of a first protruding portion and a second protruding portion that are higher than the plateau portion and are provided beside the plateau portion of the first mold, and
   the second portion is a portion of the first mold in which neither the first protruding portion nor the second protruding portion is provided beside the plateau portion.

2. The method according to claim 1, wherein
the second portion of the first mold is a portion of the first mold where a width of the plateau portion is narrower than a width of the circuit sheet.

3. The method according to claim 1, wherein
the second portion of the first mold is a portion of the first mold where the plateau portion is divided, and
in the setting step, the circuit sheet is laid across two divided portions of the plateau portion in the second portion.

4. The method of claim 1, wherein
in the first portion of the first mold, groove portions are formed between the first protruding portion and the plateau portion and between the second protruding portion and the plateau portion.

5. The method of claim 1, wherein
the first mold is configured such that a gap is formed in at least one of between the first protruding portion and a first end side of the circuit sheet and between the second protruding portion and a second end side of the circuit sheet.

6. The method according to claim 1, wherein
in the setting step, a connecting portion of the circuit sheet is inserted into a slit of the first mold.

7. The method according to claim 1, wherein
the first mold includes a plurality of sets of the first protruding portions and the second protruding portions provided beside the plateau portion in a plurality of first portions of the first mold and not provided beside the plateau portion in a plurality of second portions of the first mold, and
in the setting step, a plurality of second regions of the second main surface of the circuit sheet are arranged between the plurality of sets of the first protruding portions and the second protruding portions.

8. The method according to claim 1, wherein
the first protruding portion, the second protruding portion, and the plateau portion of the first mold are formed on a sliding block, and
in the introducing step, the sliding block is moved to form the cavity in a place where the first protruding portion, the second protruding portion, and the plateau portion were present before the sliding block is moved to introduce the molten material.

* * * * *